(12) United States Patent
Sakamoto et al.

(10) Patent No.: US 11,897,056 B2
(45) Date of Patent: Feb. 13, 2024

(54) LASER PROCESSING DEVICE AND LASER PROCESSING METHOD

(71) Applicant: HAMAMATSU PHOTONICS K.K., Hamamatsu (JP)

(72) Inventors: Takeshi Sakamoto, Hamamatsu (JP); Katsuhiro Korematsu, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 159 days.

(21) Appl. No.: 17/288,841

(22) PCT Filed: Oct. 30, 2019

(86) PCT No.: PCT/JP2019/042589
§ 371 (c)(1),
(2) Date: Apr. 26, 2021

(87) PCT Pub. No.: WO2020/090894
PCT Pub. Date: May 7, 2020

(65) Prior Publication Data
US 2022/0001494 A1 Jan. 6, 2022

(30) Foreign Application Priority Data

Oct. 30, 2018 (JP) ................................ 2018-204114
Dec. 14, 2018 (JP) ................................ 2018-234809

(51) Int. Cl.
*B23K 26/53* (2014.01)
*B23K 26/064* (2014.01)
(Continued)

(52) U.S. Cl.
CPC .......... *B23K 26/53* (2015.10); *B23K 26/0006* (2013.01); *B23K 26/03* (2013.01);
(Continued)

(58) Field of Classification Search
CPC .............. B23K 26/082; B23K 26/0006; B23K 26/064; B23K 26/03; H01L 21/02035; H01L 21/268
See application file for complete search history.

(56) References Cited

U.S. PATENT DOCUMENTS 7,981,770 B2    7/2011 Kaneko
8,604,381 B1 *  12/2013 Shin ................... B23K 26/0093
                                                    219/121.64
(Continued)

FOREIGN PATENT DOCUMENTS

CN      1491144 A    4/2004
CN      1902023 A    1/2007
(Continued)

OTHER PUBLICATIONS

International Preliminary Report on Patentability dated May 14, 2021 for PCT/JP2019/042589.
(Continued)

*Primary Examiner* — Thien S Tran
(74) *Attorney, Agent, or Firm* — Faegre Drinker Biddle & Reath LLP

(57) ABSTRACT

A laser processing apparatus includes an irradiation portion, and a controller. The irradiation portion includes a shaping portion configured to shape the laser light. The controller includes: a determination portion configured to determine a first and a second orientation; a processing controller configured to perform a first process of forming the modified region along a first region and stopping formation of the modified region other than the first region, and a second process of forming the modified region along a second region and stopping formation of the modified region other than the second region; and an adjustment portion configured to adjust the orientation of the longitudinal direction to be the first orientation when the first process is performed, (Continued)

and to adjust the orientation of the longitudinal direction to be the second orientation when the second process is performed.

8 Claims, 72 Drawing Sheets

(51) Int. Cl.
    *B23K 26/082*     (2014.01)
    *B23K 26/00*     (2014.01)
    *B23K 26/03*     (2006.01)
    *B23K 26/06*     (2014.01)
    *B23K 103/00*     (2006.01)
    *G02B 27/14*     (2006.01)
    *H01L 21/268*     (2006.01)

(52) U.S. Cl.
    CPC ........ *B23K 26/064* (2015.10); *B23K 26/0604* (2013.01); *B23K 26/082* (2015.10); *B23K 2103/56* (2018.08); *G02B 27/141* (2013.01); *H01L 21/268* (2013.01)

(56) References Cited

U.S. PATENT DOCUMENTS

| | | |
|---|---|---|
| 8,730,568 B2 | 5/2014 | Tong et al. |
| 9,071,037 B2 | 6/2015 | Gu et al. |
| 9,878,397 B2 | 1/2018 | Hirata et al. |
| 10,388,526 B1 | 4/2019 | Seddon et al. |
| 2011/0139759 A1 | 6/2011 | Millman, Jr. et al. |
| 2012/0091107 A1 | 4/2012 | Sugiura |
| 2012/0100785 A1 | 4/2012 | Ishimasa et al. |
| 2013/0248500 A1 | 9/2013 | Shreter et al. |
| 2017/0120374 A1 | 5/2017 | Hendricks et al. |
| 2018/0076043 A1* | 3/2018 | Ito ................. B23K 26/0823 |
| 2018/0076060 A1 | 3/2018 | Oh et al. |
| 2018/0154572 A1 | 6/2018 | Richter et al. |
| 2018/0254223 A1* | 9/2018 | Hirata ................. B23K 26/53 |
| 2019/0001433 A1* | 1/2019 | Yamamoto ........... B23K 26/032 |
| 2019/0039185 A1* | 2/2019 | Nayuki ............. B23K 26/0821 |

FOREIGN PATENT DOCUMENTS

| | | |
|---|---|---|
| CN | 101024260 A | 8/2007 |
| CN | 101251725 A | 8/2008 |
| CN | 101297050 A | 10/2008 |
| CN | 101878090 A | 11/2010 |
| CN | 101965242 A | 2/2011 |
| CN | 102574245 A | 7/2012 |
| CN | 102665999 A | 9/2012 |
| CN | 102990230 A | 3/2013 |
| CN | 104439696 A | 3/2015 |
| CN | 104641286 A | 5/2015 |
| CN | 104768698 A | 7/2015 |
| CN | 105189025 A | 12/2015 |
| CN | 105324207 A | 2/2016 |
| CN | 105689888 A | 6/2016 |
| CN | 107123588 A | 9/2017 |
| CN | 107452678 A | 12/2017 |
| CN | 107863293 A | 3/2018 |
| CN | 107995996 A | 5/2018 |
| DE | 102013223637 A1 | 5/2015 |
| DE | 102014204347 A1 | 9/2015 |
| JP | H06-007979 A | 1/1994 |
| JP | H10-258376 A | 9/1998 |
| JP | 2002-131559 A | 5/2002 |
| JP | 2004-111606 A | 4/2004 |
| JP | 2004-111946 A | 4/2004 |
| JP | 2005-294656 A | 10/2005 |
| JP | 2006-167804 A | 6/2006 |
| JP | 2006-315033 A | 11/2006 |
| JP | 2007-165848 A | 6/2007 |
| JP | 2007-180565 A | 7/2007 |
| JP | 2007-229773 A | 9/2007 |
| JP | 2008-087026 A | 4/2008 |
| JP | 2009-172668 A | 8/2009 |
| JP | 2010-000542 A | 1/2010 |
| JP | 2010-082644 A | 4/2010 |
| JP | 2010-153590 A | 7/2010 |
| JP | 2010-167433 A | 8/2010 |
| JP | 2011-056576 A | 3/2011 |
| JP | 2011-167718 A | 9/2011 |
| JP | 2011167718 A * | 9/2011 |
| JP | 2012-130952 A | 7/2012 |
| JP | 2012-254478 A | 12/2012 |
| JP | 2013-049161 A | 3/2013 |
| JP | 2013-055084 A | 3/2013 |
| JP | 2013-141701 A | 7/2013 |
| JP | 2014-033163 A | 2/2014 |
| JP | 5456510 B2 | 4/2014 |
| JP | 2014-091642 A | 5/2014 |
| JP | 2015-012015 A | 1/2015 |
| JP | 2015-074003 A | 4/2015 |
| JP | 2015-536896 A | 12/2015 |
| JP | 2016-025188 A | 2/2016 |
| JP | 2016-032828 A | 3/2016 |
| JP | 2016-043558 A | 4/2016 |
| JP | 2016-513016 A | 5/2016 |
| JP | 2016-168606 A | 9/2016 |
| JP | 6064519 B2 | 1/2017 |
| JP | 2017-034200 A | 2/2017 |
| JP | 2017-056469 A | 3/2017 |
| JP | 2017-064746 A | 4/2017 |
| JP | 2017-071074 A | 4/2017 |
| JP | 2017071074 A * | 4/2017 |
| JP | 6127526 B2 | 5/2017 |
| JP | 2017-131942 A | 8/2017 |
| JP | 2017-131944 A | 8/2017 |
| JP | 2017-168772 A | 9/2017 |
| JP | 2017-526161 A | 9/2017 |
| JP | 2017-528322 A | 9/2017 |
| JP | 2017-204574 A | 11/2017 |
| JP | 2017-224678 A | 12/2017 |
| JP | 6241174 B2 | 12/2017 |
| JP | 2018-098464 A | 6/2018 |
| JP | 2018-133484 A | 8/2018 |
| JP | 2018-147928 A | 9/2018 |
| JP | 7133633 B2 | 8/2022 |
| JP | 7157816 A | 10/2022 |
| KR | 20050078187 A | 8/2005 |
| KR | 1020180073306 A | 7/2018 |
| TW | 201214566 A | 4/2012 |
| TW | 201703912 A | 2/2017 |
| TW | 201718155 A | 6/2017 |
| TW | 201735171 A | 10/2017 |
| TW | 201838001 A | 10/2018 |
| WO | WO 2005/102638 A1 | 11/2005 |
| WO | WO-2011/030802 A1 | 3/2011 |
| WO | WO-2014/075995 A2 | 5/2014 |
| WO | WO-2014/121261 A1 | 8/2014 |
| WO | WO-2015/052218 A1 | 4/2015 |
| WO | WO-2015052218 A1 * | 4/2015 ............. B23K 26/40 |
| WO | WO-2016/005455 A1 | 1/2016 |
| WO | WO-2016/083610 A2 | 6/2016 |
| WO | WO-2017/030039 A1 | 2/2017 |
| WO | WO-2018/192689 A1 | 10/2018 |
| WO | WO 2019/176589 A1 | 9/2019 |
| WO | WO 2020/054504 A1 | 3/2020 |
| WO | WO 2020/084909 A1 | 4/2020 |
| WO | WO 2020/129730 A1 | 6/2020 |

OTHER PUBLICATIONS

International Preliminary Report on Patentability dated May 14, 2021 for PCT/JP2019/042602.
International Preliminary Report on Patentability dated May 14, 2021 for PCT/JP2019/042610.
International Preliminary Report on Patentability dated May 14, 2021 for PCT/JP2019/042635.
International Preliminary Report on Patentability dated May 14, 2021 for PCT/JP2019/042584.

(56) References Cited

OTHER PUBLICATIONS

International Preliminary Report on Patentability dated May 14, 2021 for PCT/JP2019/042600.
International Preliminary Report on Patentability dated May 14, 2021 for PCT/JP2019/042627.
International Preliminary Report on Patentability dated May 14, 2021 for PCT/JP2019/042662.
International Preliminary Report on Patentability dated May 14, 2021 for PCT/JP2019/042616.

* cited by examiner

Fig.13
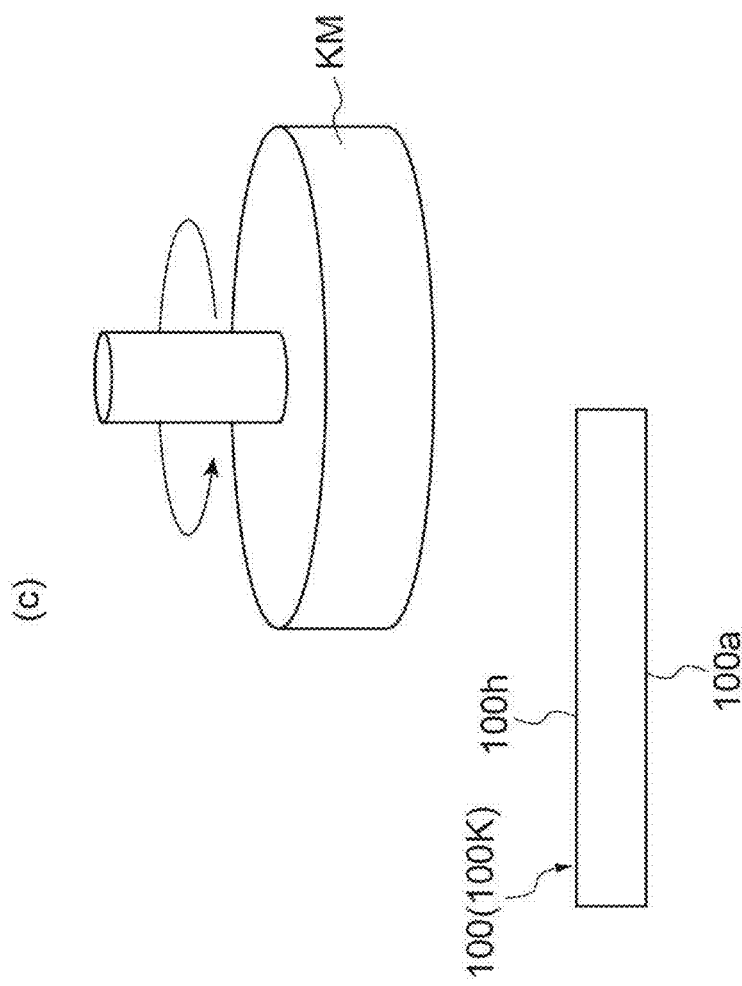
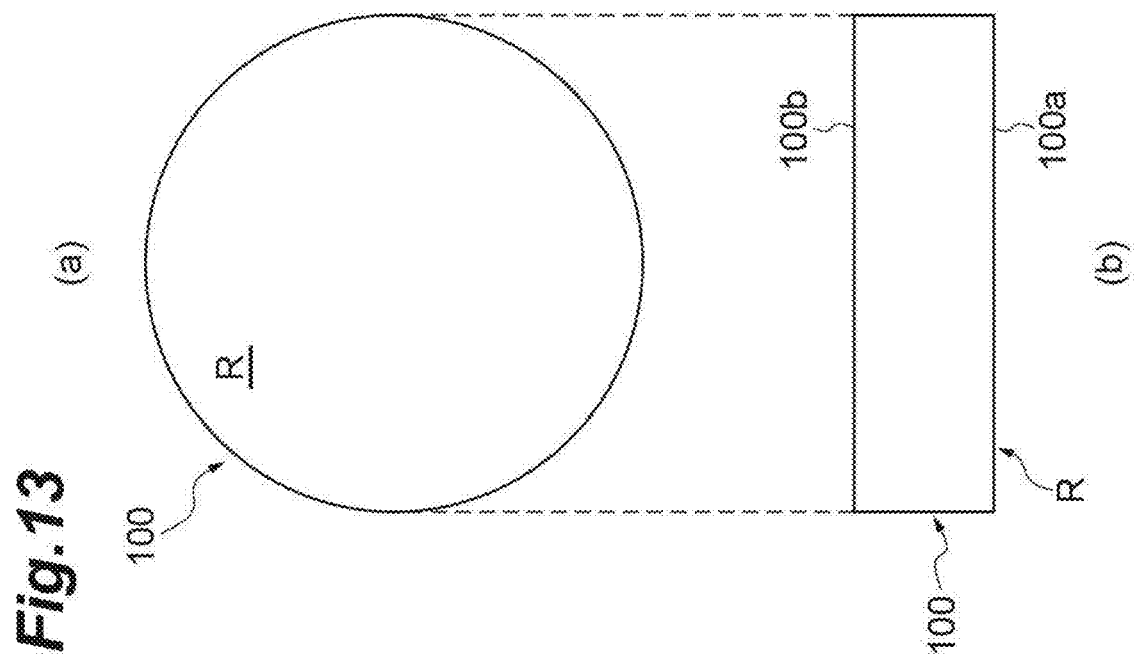

Fig.15
(a)
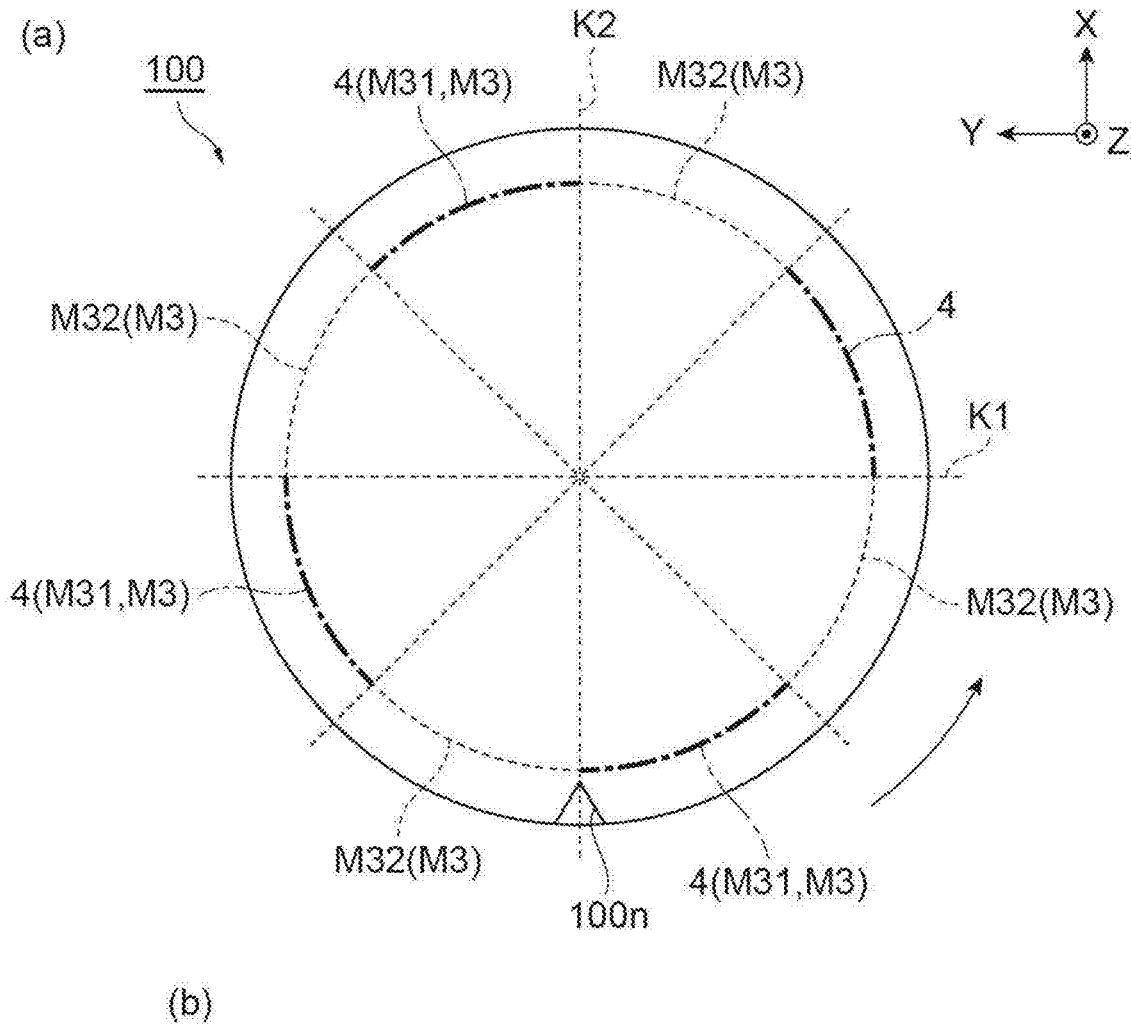
(b)
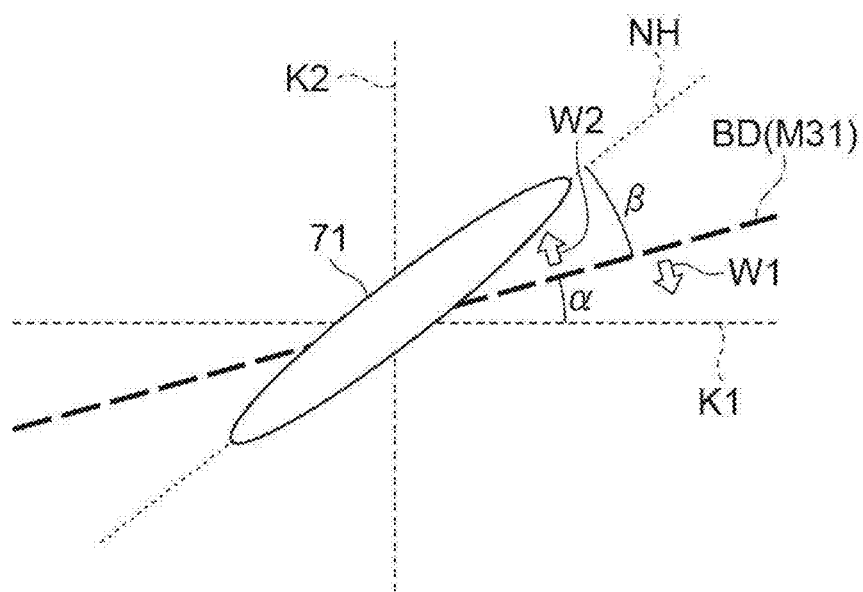

Fig.16
(a)
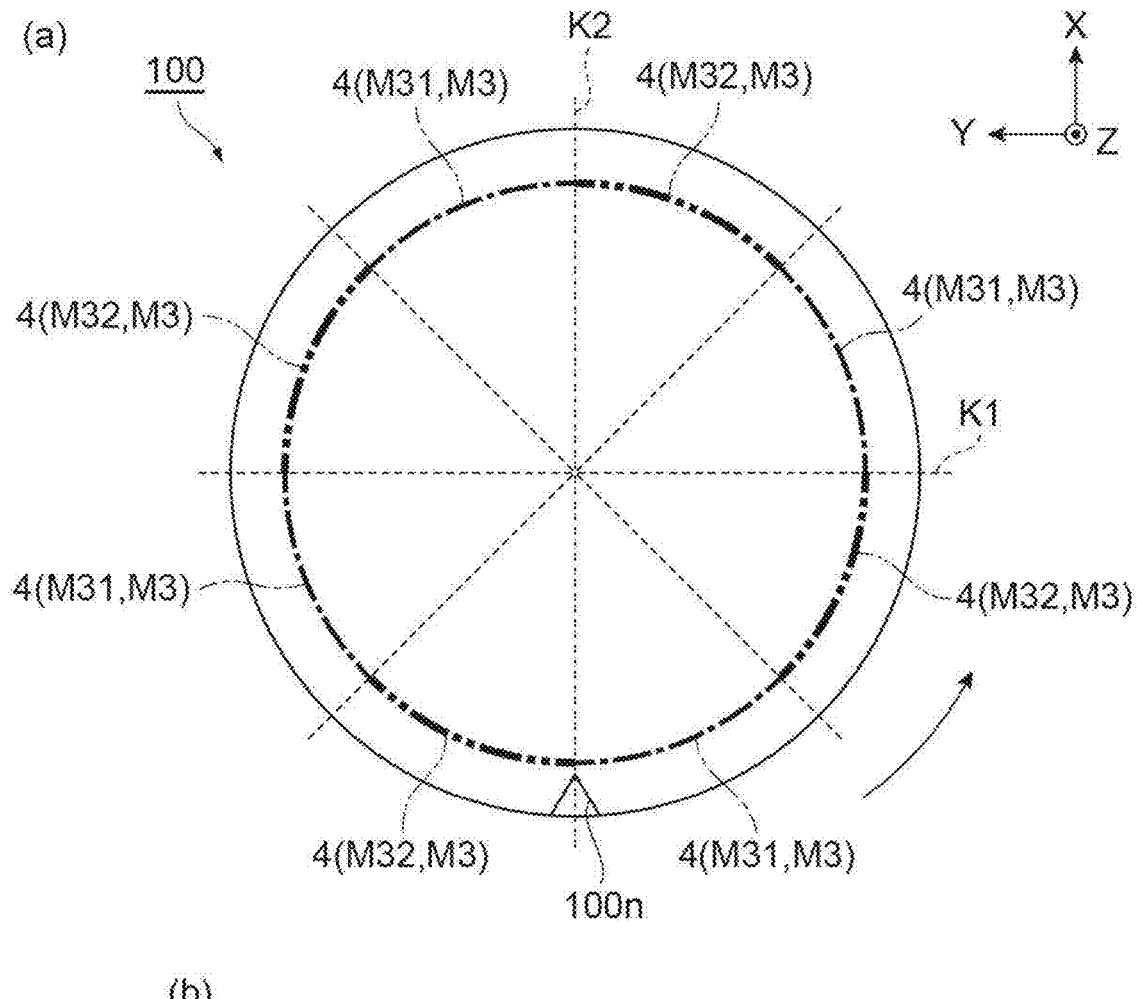
(b)
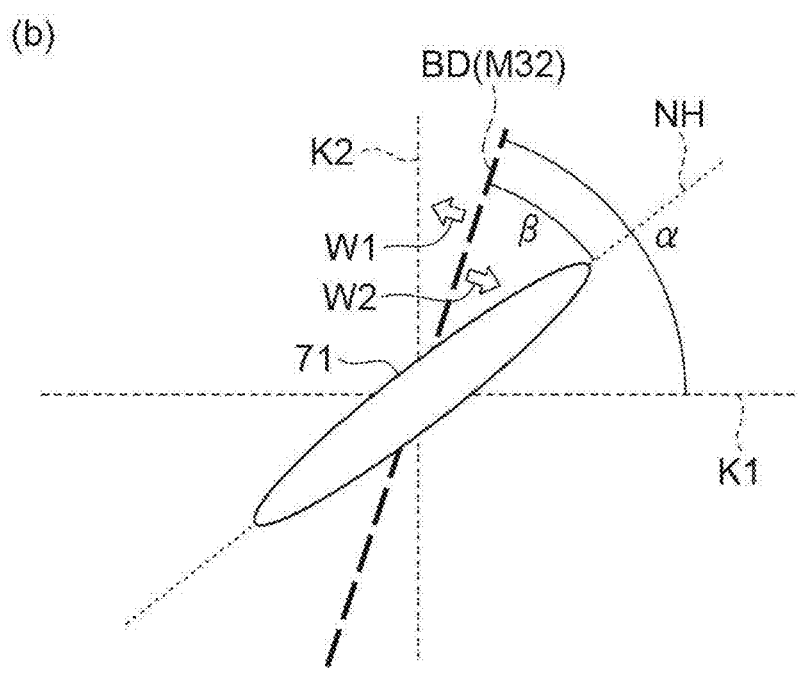

Fig.17

| TIME | PROCESS ITEM | STAGE | PROCESSING POSITION IN Z DIRECTION | FOLLOWING CONTROL | ORIENTATION OF BEAM SHAPE | EMISSION OF LASER LIGHT |
|---|---|---|---|---|---|---|
| ~T1 | TRACE PROCESSING | ACCELERATION (ROTATION DIRECTION: ONE DIRECTION) | LASER INCIDENT SURFACE | STOP | | OFF |
| T2 | | ROTATING AT CONSTANT SPEED (ROTATION DIRECTION: ONE DIRECTION) | LASER INCIDENT SURFACE | RECORDING | SWITCHED TO FIRST ORIENTATION | OFF |
| T3 | | DECELERATION (ROTATION DIRECTION: ONE DIRECTION) | MOVED TO SD1 PROCESSING POSITION | STOP | | OFF |
| T4 | | ACCELERATION (ROTATION DIRECTION: OTHER DIRECTION) | SD1 PROCESSING POSITION | STOP | | OFF |
| T5 | SD1 PROCESSING | ROTATING AT CONSTANT SPEED (ROTATION DIRECTION: OTHER DIRECTION) | SD1 PROCESSING POSITION | REPRO-DUCTION | FIRST ORIENTATION | FIRST REGION:ON SECOND REGION:OFF |
| T6 | | DECELERATION (ROTATION DIRECTION: OTHER DIRECTION) | SD1 PROCESSING POSITION | STOP | SWITCHED TO SECOND ORIENTATION | OFF |
| T7 | | ACCELERATION (ROTATION DIRECTION: ONE DIRECTION) | SD1 PROCESSING POSITION | STOP | SECOND ORIENTATION | OFF |
| T8 | | ROTATING AT CONSTANT SPEED (ROTATION DIRECTION: ONE DIRECTION) | MOVED TO SD2 PROCESSING POSITION | REPRO-DUCTION | SWITCHED TO FIRST ORIENTATION | FIRST REGION:OFF SECOND REGION:ON |
| T9 | | DECELERATION (ROTATION DIRECTION: ONE DIRECTION) | SD2 PROCESSING POSITION | STOP | | OFF |
| T10 | SD2 PROCESSING | ACCELERATION (ROTATION DIRECTION: OTHER DIRECTION) | | STOP | | OFF |
| ... | ... | ... | ... | ... | ... | ... |

Fig.18

| TIME | PROCESS ITEM | STAGE | PROCESSING POSITION IN Z DIRECTION | FOLLOWING CONTROL | ORIENTATION OF BEAM SHAPE | EMISSION OF LASER LIGHT |
|---|---|---|---|---|---|---|
| ~T1 | SD1 PROCESSING | ACCELERATION (ROTATION DIRECTION :ONE DIRECTION) | SD1 PROCESSING POSITION | STOP | SWITCHED TO FIRST ORIENTATION | OFF |
| T2 | SD1 PROCESSING | ROTATING AT CONSTANT SPEED (ROTATION DIRECTION :ONE DIRECTION) | SD1 PROCESSING POSITION | FOLLOWING | FIRST ORIENTATION | FIRST REGION:ON SECOND REGION:OFF |
| T3 | SD1 PROCESSING | DECELERATION (ROTATION DIRECTION :ONE DIRECTION) | SD1 PROCESSING POSITION | STOP | SWITCHED TO SECOND ORIENTATION | OFF |
| T4 | SD1 PROCESSING | ACCELERATION (ROTATION DIRECTION :OTHER DIRECTION) | SD1 PROCESSING POSITION | STOP | SECOND ORIENTATION | OFF |
| T5 | SD1 PROCESSING | ROTATING AT CONSTANT SPEED (ROTATION DIRECTION :OTHER DIRECTION) | SD1 PROCESSING POSITION | FOLLOWING | SECOND ORIENTATION | FIRST REGION:OFF SECOND REGION:ON |
| T6 | SD1 PROCESSING | DECELERATION (ROTATION DIRECTION :OTHER DIRECTION) | MOVED TO SD2 PROCESSING POSITION | STOP | SWITCHED TO FIRST ORIENTATION | OFF |
| T7 | SD2 PROCESSING | ACCELERATION (ROTATION DIRECTION :ONE DIRECTION) | | STOP | | OFF |
| ... | ... | ... | ... | ... | ... | ... |

Fig.19

| TIME | PROCESS ITEM | STAGE | PROCESSING POSITION IN Z DIRECTION | FOLLOWING CONTROL | ORIENTATION OF BEAM SHAPE | EMISSION OF LASER LIGHT |
|---|---|---|---|---|---|---|
| ~T1 | TRACE PROCESSING | ACCELERATION | LASER LIGHT INCIDENT SURFACE | STOP | | OFF |
| T2 | | ROTATING AT CONSTANT SPEED | LASER LIGHT INCIDENT SURFACE | RECORDING | SWITCHED TO FIRST ORIENTATION | OFF |
| T3 | | ROTATION | MOVED TO SD1 PROCESSING POSITION | STOP | FIRST ORIENTATION | OFF |
| T4 | SD1 PROCESSING | ROTATING AT CONSTANT SPEED | SD1 PROCESSING POSITION | REPRODUCTION | FIRST ORIENTATION | FIRST REGION:ON SECOND REGION:OFF |
| T5 | | ROTATION | SD1 PROCESSING POSITION | STOP | SWITCHED TO SECOND ORIENTATION | OFF |
| T6 | | ROTATING AT CONSTANT SPEED | MOVED TO SD2 PROCESSING POSITION | REPRODUCTION | SECOND ORIENTATION | FIRST REGION:OFF SECOND REGION:ON |
| T7 | SD2 PROCESSING | ROTATION | SD2 PROCESSING POSITION | STOP | SWITCHED TO FIRST ORIENTATION | OFF |
| T8 | | ROTATING AT CONSTANT SPEED | SD2 PROCESSING POSITION | REPRODUCTION | FIRST ORIENTATION | FIRST REGION:ON SECOND REGION:OFF |
| ... | ... | ... | ... | ... | ... | ... |

Fig.20

| TIME | PROCESS ITEM | STAGE | PROCESSING POSITION IN Z DIRECTION | FOLLOWING CONTROL | ORIENTATION OF BEAM SHAPE | EMISSION OF LASER LIGHT |
|---|---|---|---|---|---|---|
| ~T1 |  | ACCELERATION | SD1 PROCESSING POSITION | STOP | SWITCHED TO FIRST ORIENTATION | OFF |
| T2 | SD1 PROCESSING | ROTATING AT CONSTANT SPEED | SD1 PROCESSING POSITION | FOLLOWING | FIRST ORIENTATION | FIRST REGION:ON SECOND REGION:OFF |
| T3 |  | ROTATION | SD1 PROCESSING POSITION | STOP | SWITCHED TO SECOND ORIENTATION | OFF |
| T4 |  | ROTATING AT CONSTANT SPEED | SD1 PROCESSING POSITION | FOLLOWING | SECOND ORIENTATION | FIRST REGION:OFF SECOND REGION:ON |
| T5 |  | ROTATION | MOVED TO SD2 PROCESSING POSITION | STOP | SWITCHED TO FIRST ORIENTATION | OFF |
| T6 | SD2 PROCESSING | ROTATING AT CONSTANT SPEED | SD2 PROCESSING POSITION | FOLLOWING | FIRST ORIENTATION | FIRST REGION:ON SECOND REGION:OFF |
| ... | ... | ... | ... | ... | ... | ... |

Fig.21
(a)
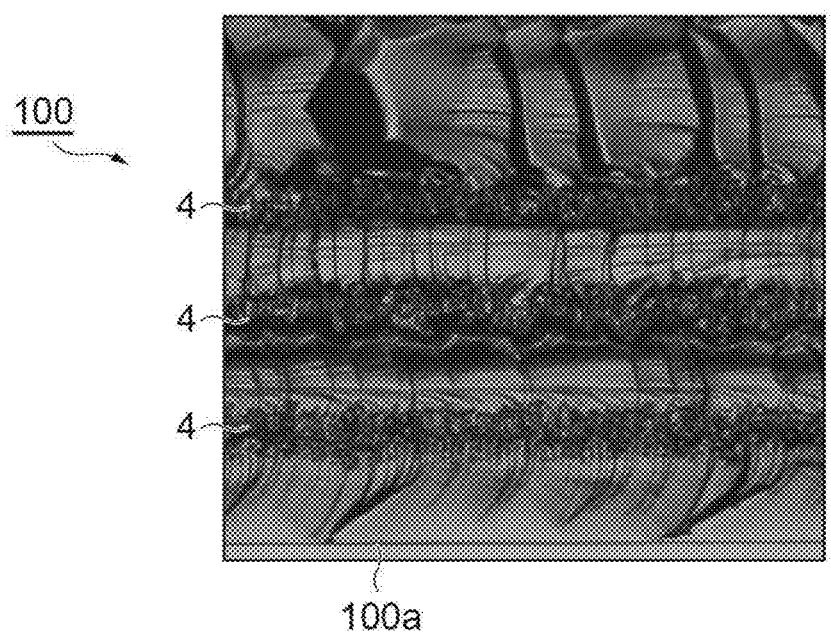
(b)
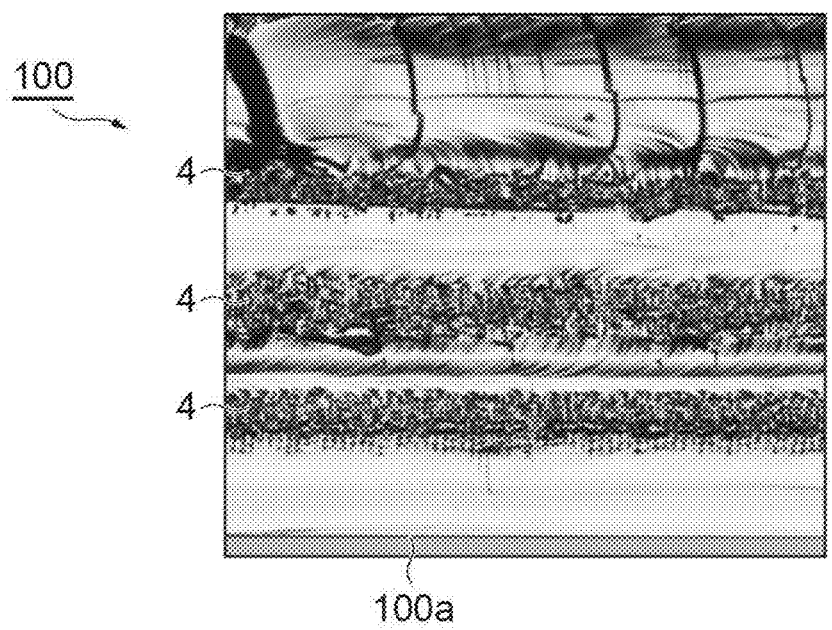

*Fig.22*
(a)
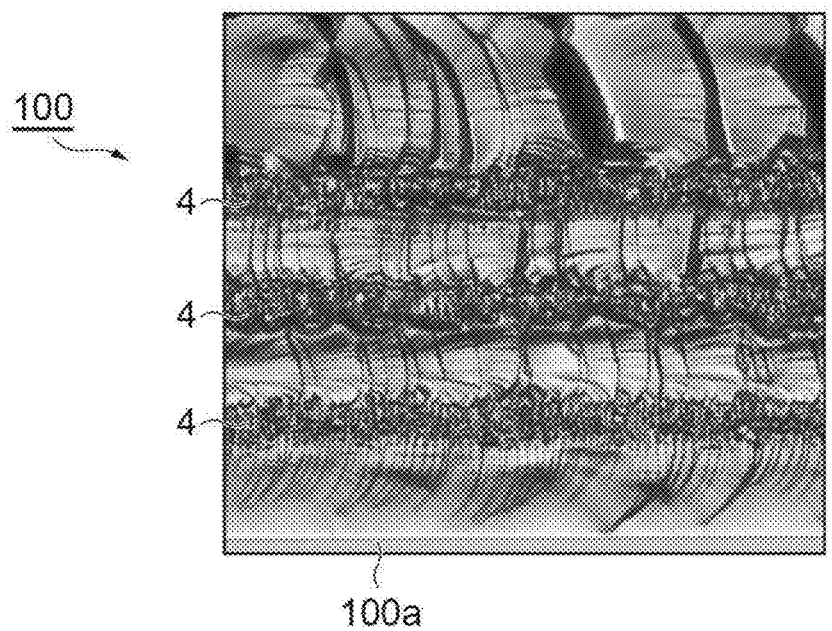
(b)
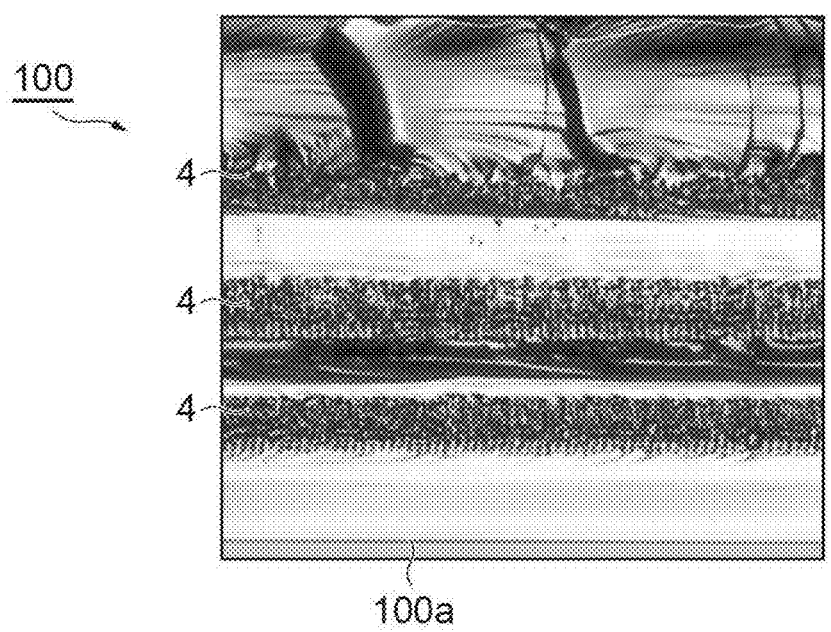

| PROCESSING ANGLE: 5deg | | | |
|---|---|---|---|
| BEAM ANGLE 0deg | BEAM ANGLE 5deg | BEAM ANGLE 10deg | BEAM ANGLE 15deg |
| BEAM ANGLE 20deg | BEAM ANGLE 22deg | BEAM ANGLE 25deg | BEAM ANGLE 30deg |
| BEAM ANGLE 35deg | BEAM ANGLE 40deg | BEAM ANGLE 45deg | |

| PROCESSING ANGLE: 30deg | | | |
|---|---|---|---|
| BEAM ANGLE 0deg | BEAM ANGLE 5deg | BEAM ANGLE 10deg | BEAM ANGLE 15deg |
| BEAM ANGLE 20deg | BEAM ANGLE 22deg | BEAM ANGLE 25deg | BEAM ANGLE 30deg |
| BEAM ANGLE 35deg | BEAM ANGLE 40deg | BEAM ANGLE 45deg | |

Fig. 34

| PROCESSING ANGLE: 40deg | | | |
|---|---|---|---|
| BEAM ANGLE 15deg | BEAM ANGLE 30deg | | |
| BEAM ANGLE 10deg | BEAM ANGLE 25deg | BEAM ANGLE 45deg | |
| BEAM ANGLE 5deg | BEAM ANGLE 22deg | BEAM ANGLE 40deg | |
| BEAM ANGLE 0deg | BEAM ANGLE 20deg | BEAM ANGLE 35deg | |

| PROCESSING ANGLE: 35deg | | |
|---|---|---|
| BEAM ANGLE -5deg | BEAM ANGLE -10deg | BEAM ANGLE -15deg | BEAM ANGLE -20deg |
| BEAM ANGLE -22deg | BEAM ANGLE -25deg | BEAM ANGLE -30deg | BEAM ANGLE -35deg |
| BEAM ANGLE -40deg | BEAM ANGLE -45deg | | |

| PROCESSING ANGLE :50deg | | | |
|---|---|---|---|
| BEAM ANGLE -5deg | BEAM ANGLE -10deg | BEAM ANGLE -15deg | BEAM ANGLE -20deg |
| BEAM ANGLE -22deg | BEAM ANGLE -25deg | BEAM ANGLE -30deg | BEAM ANGLE -35deg |
| BEAM ANGLE -40deg | BEAM ANGLE -45deg | | |

Fig.55
(a)
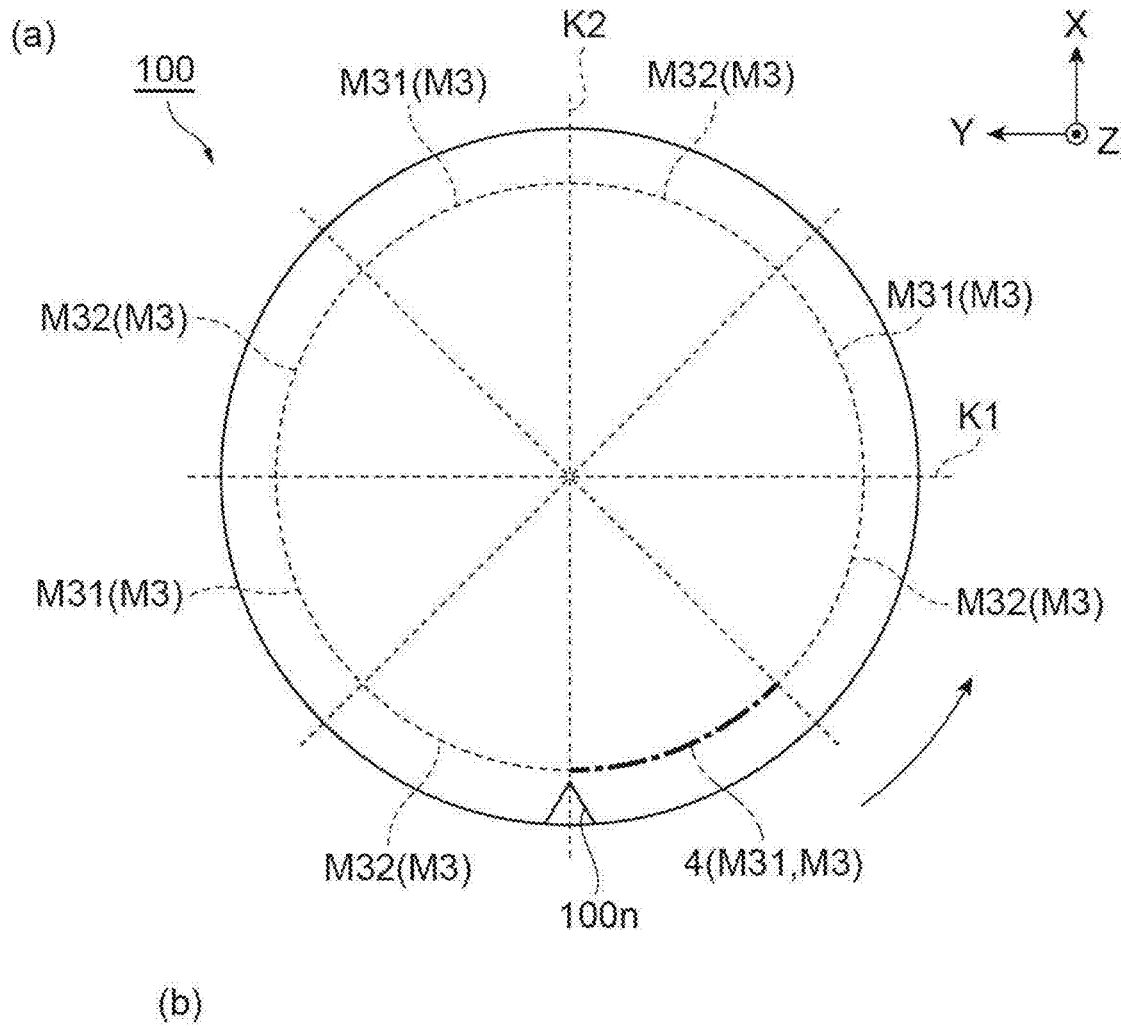
(b)
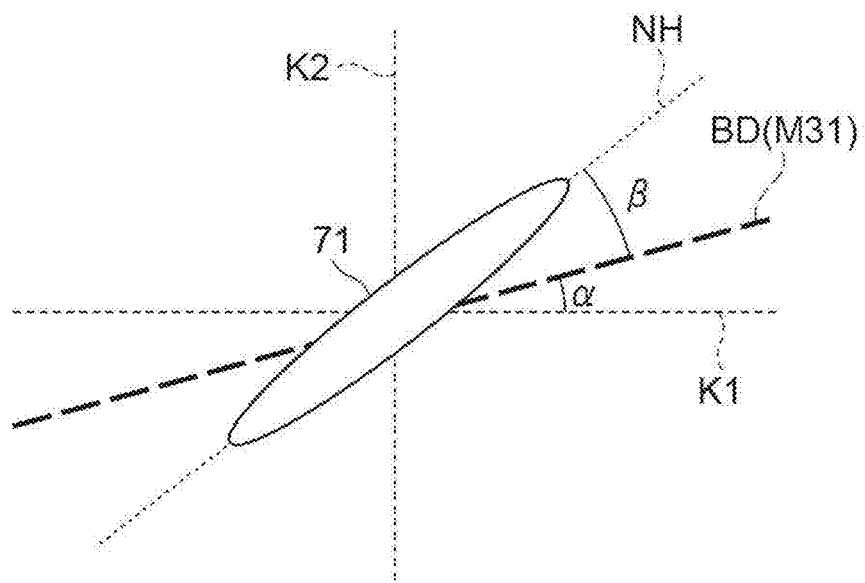

Fig.56
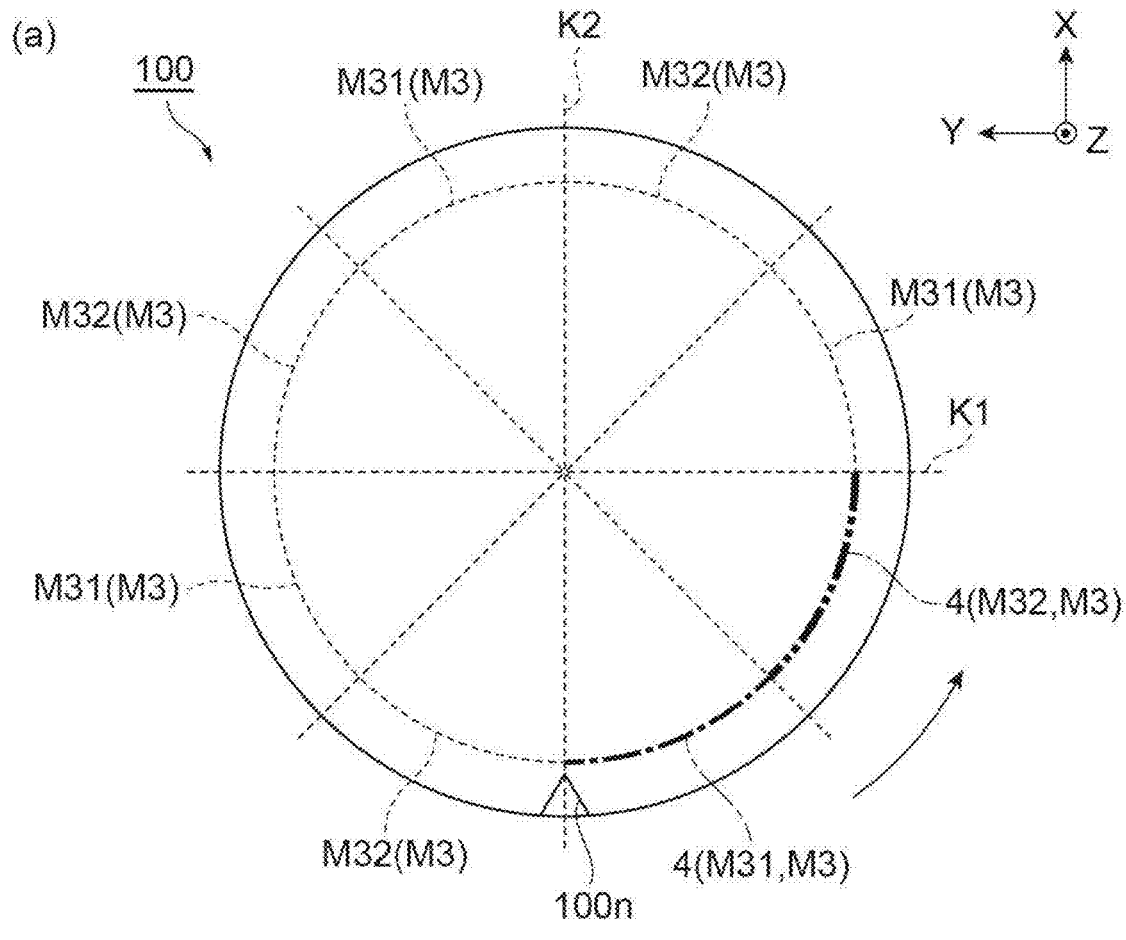
(a)
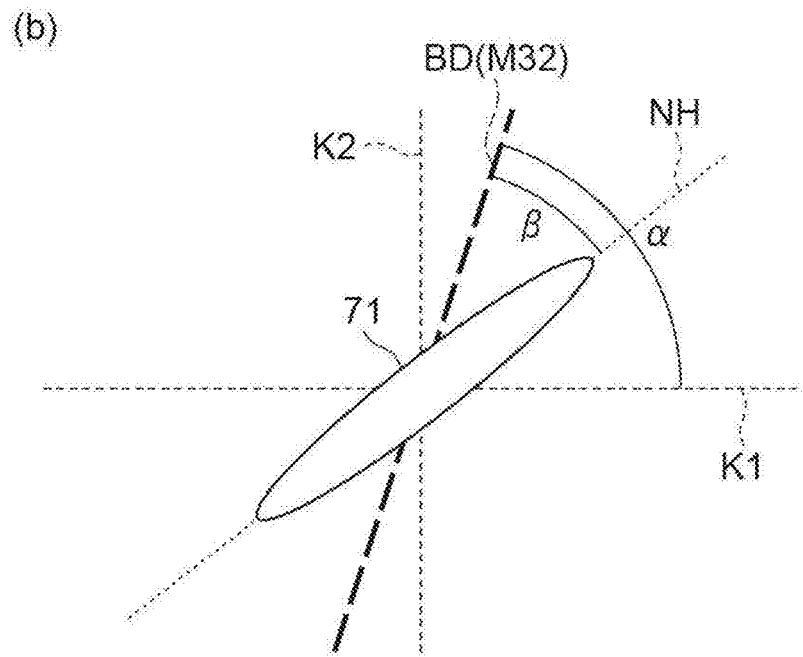
(b)

*Fig.57*
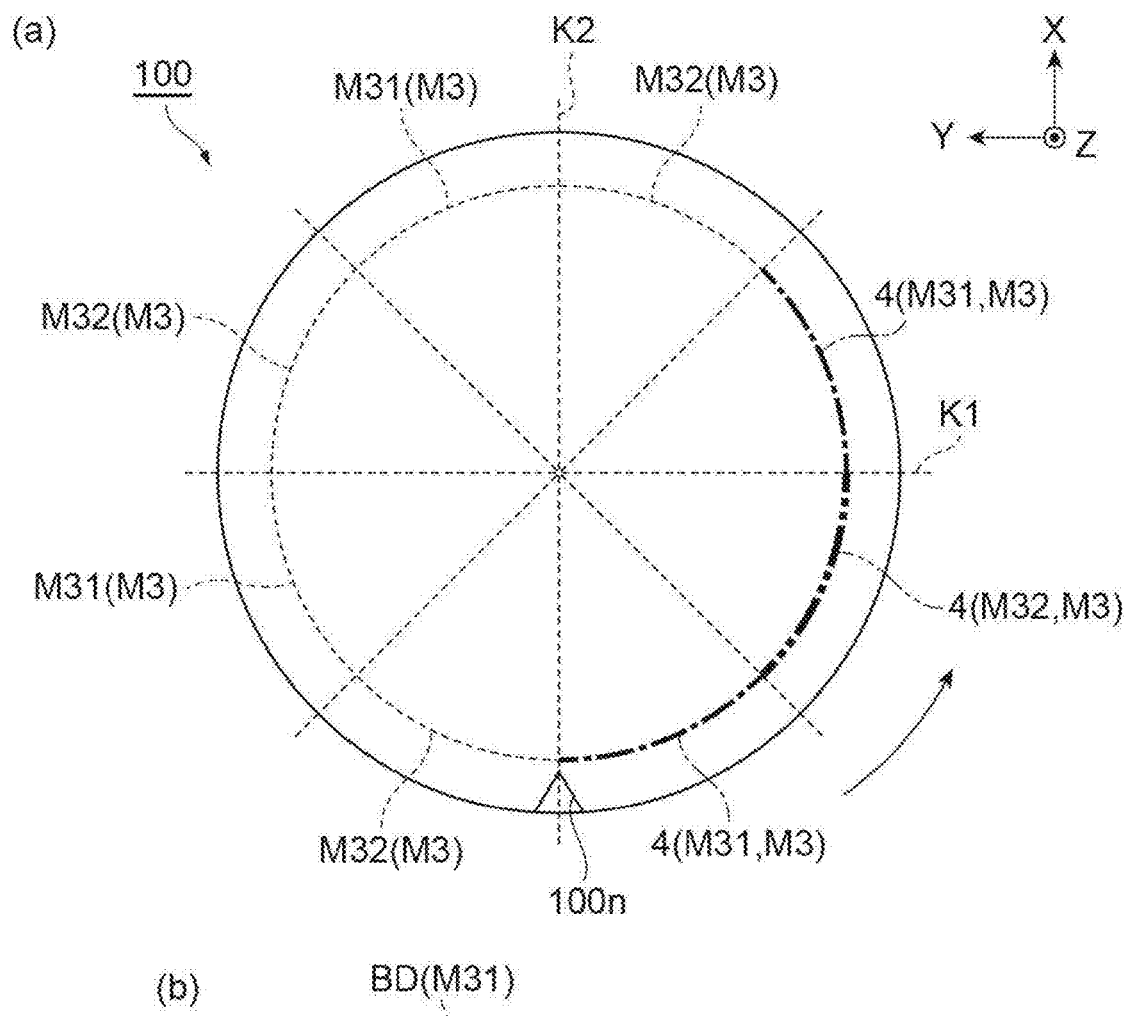
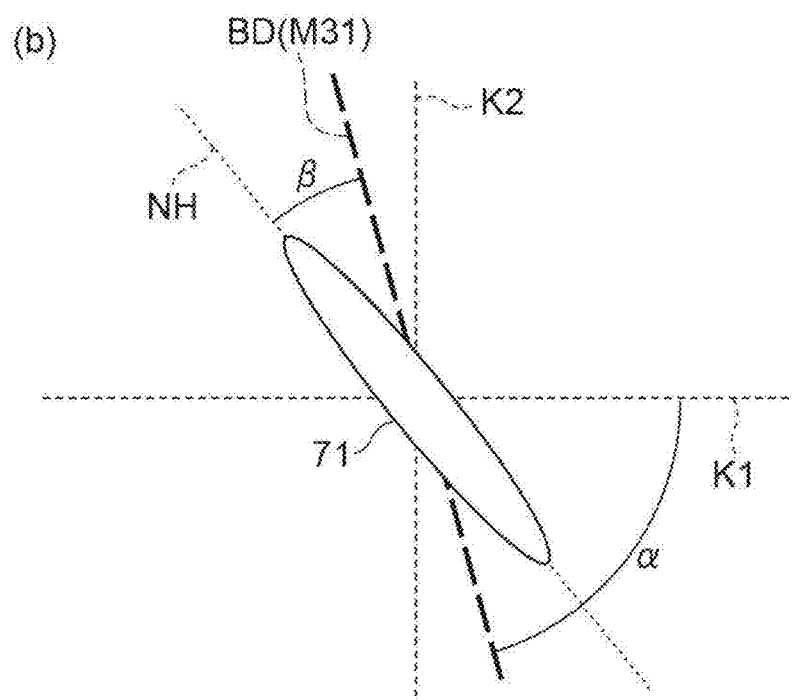

Fig.59
(a)
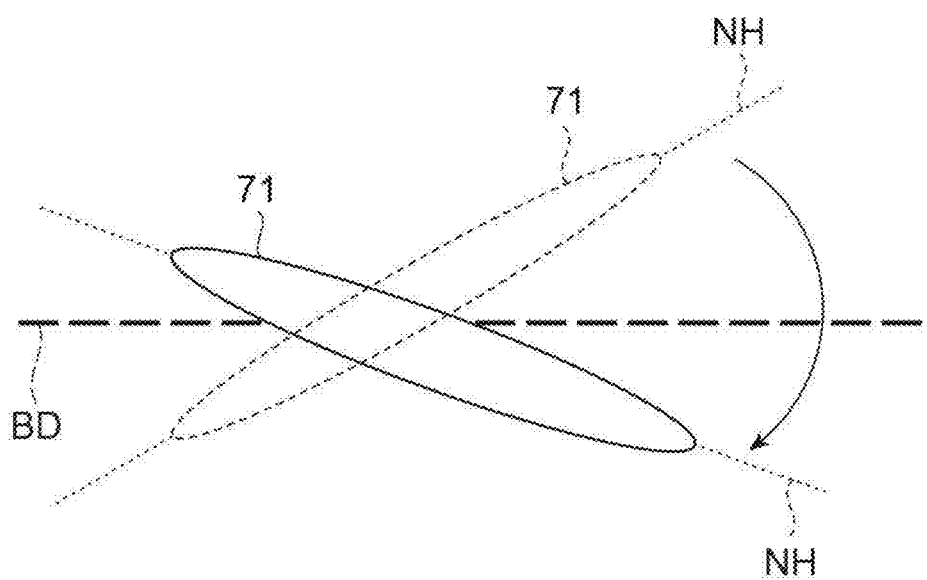
(b)
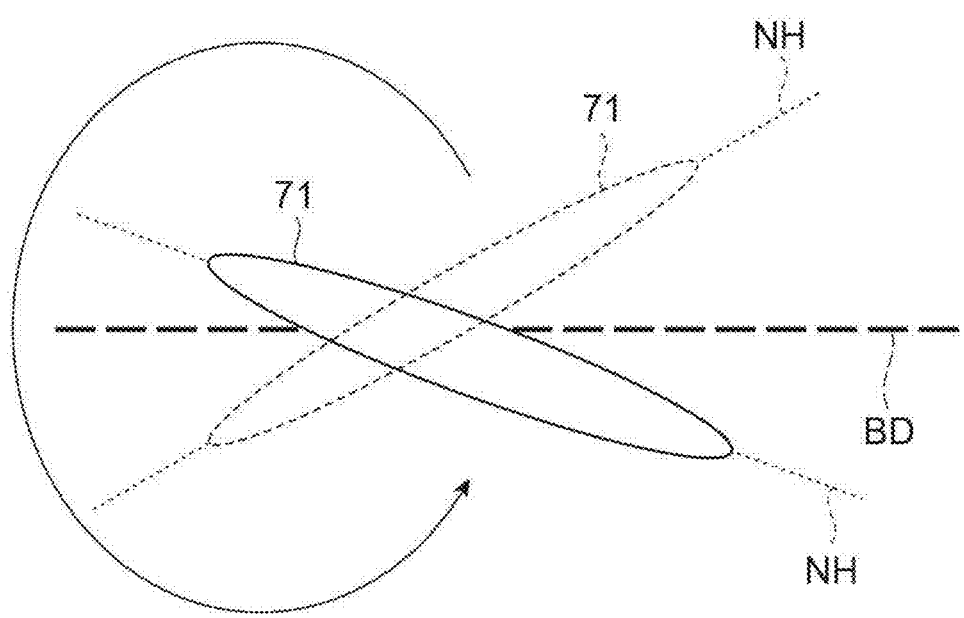

Fig.60
(a)
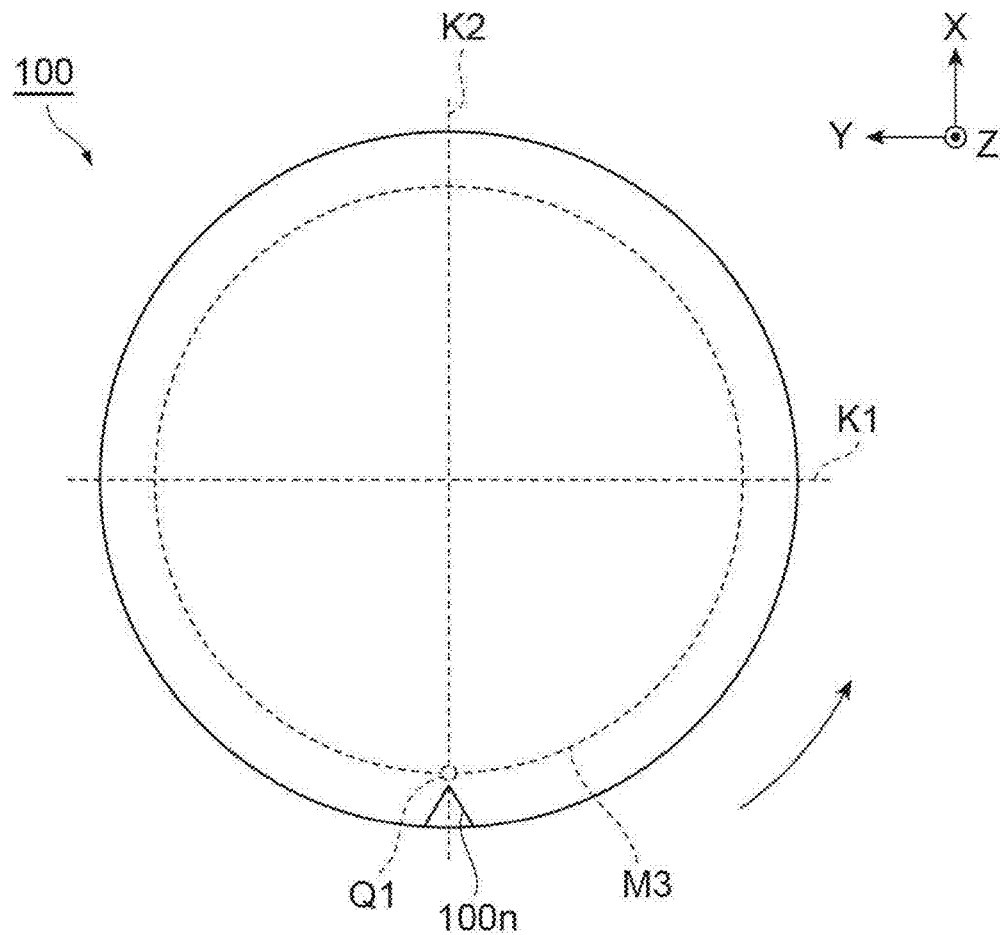
(b)
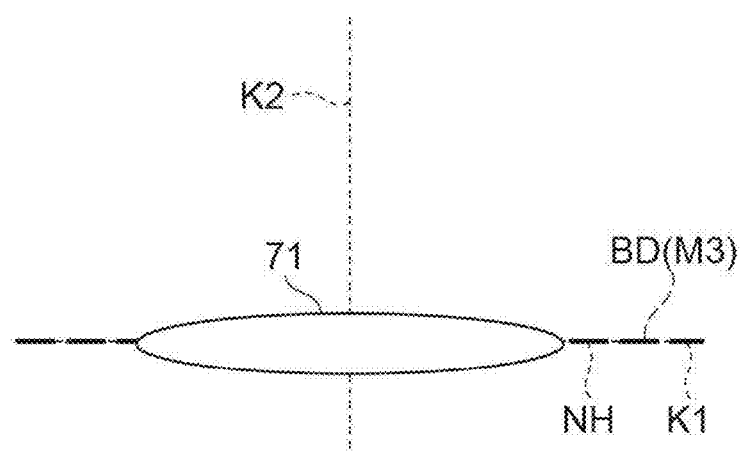

Fig.61
(a)
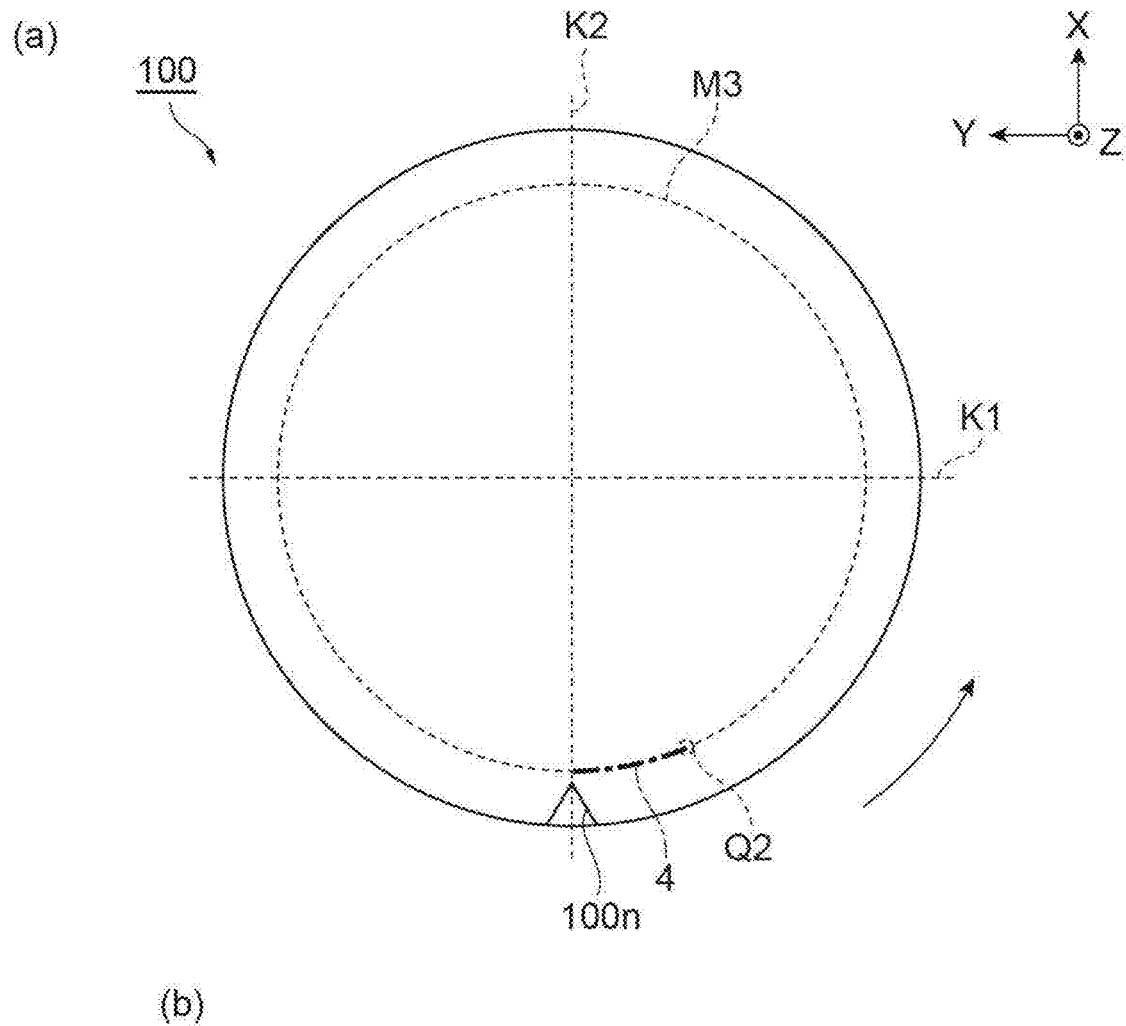
(b)
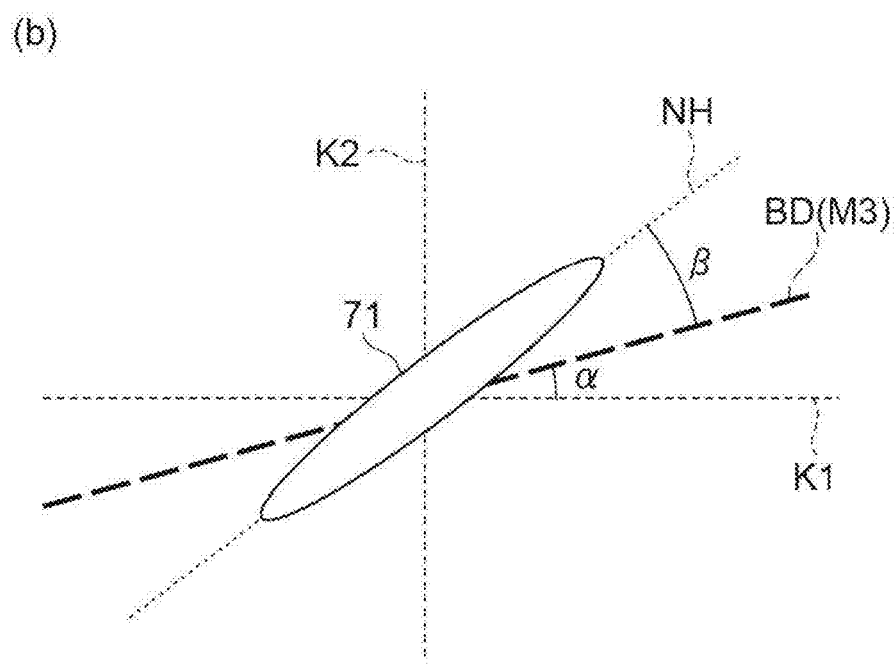

Fig.62
(a)
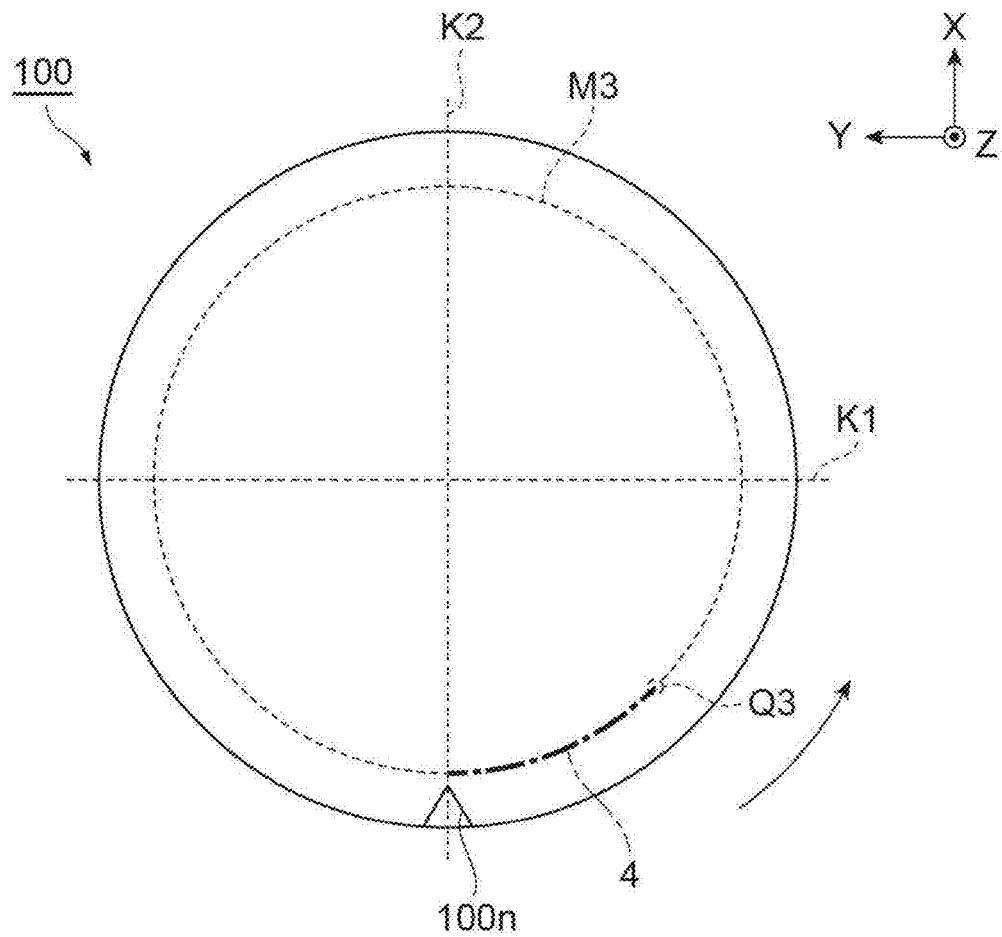
(b)
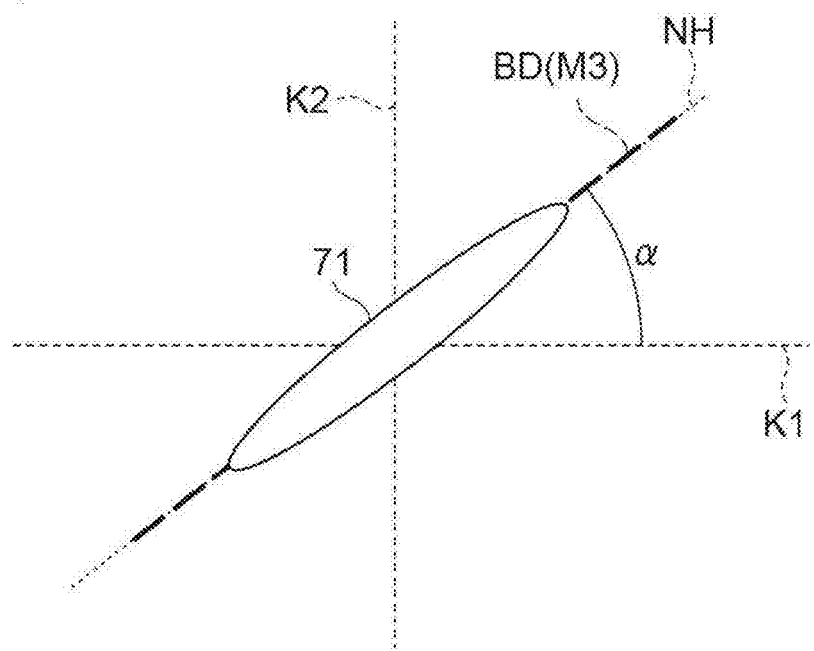

Fig.63
(a)
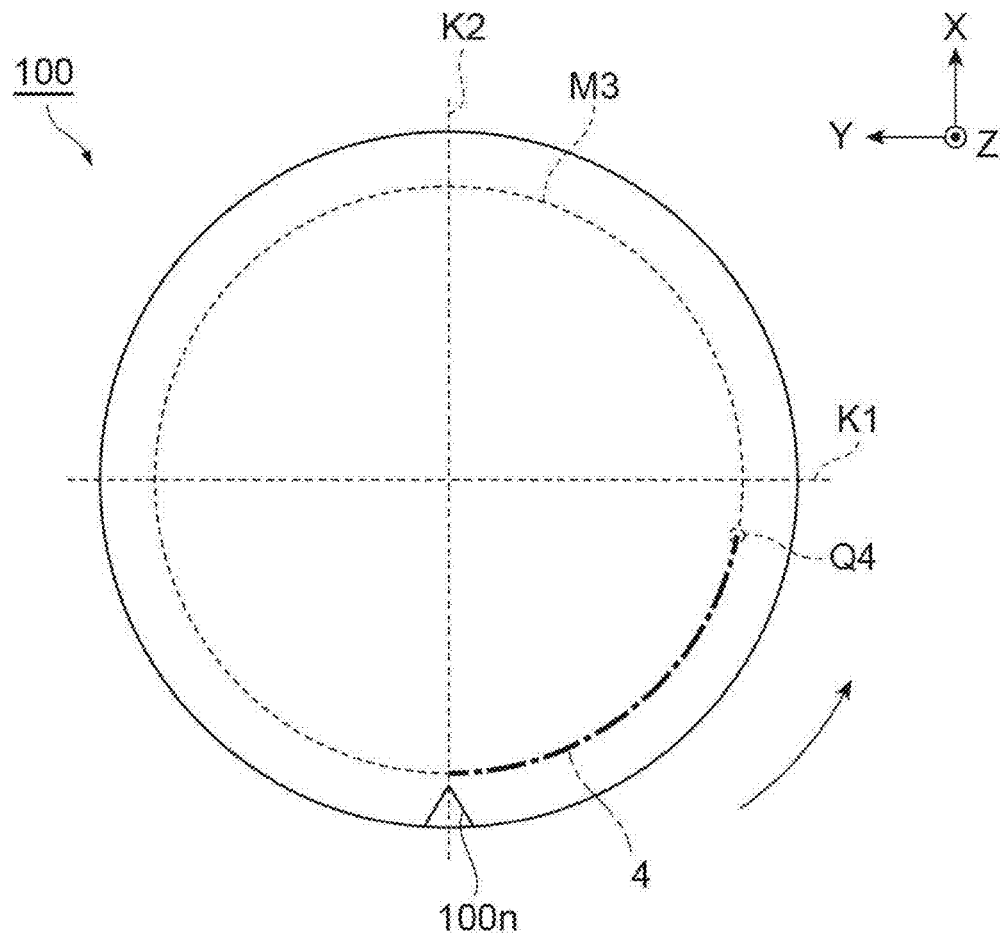
(b)
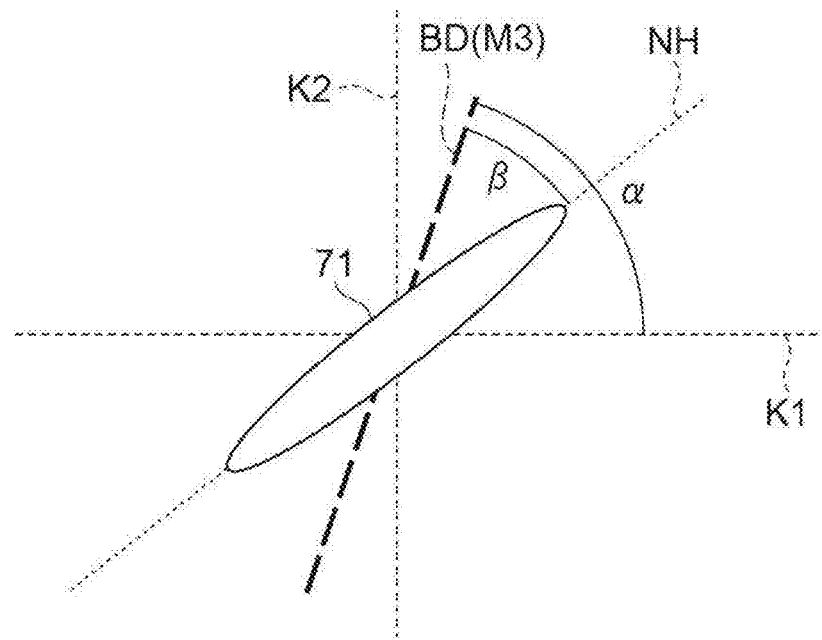

*Fig.66*
(a)
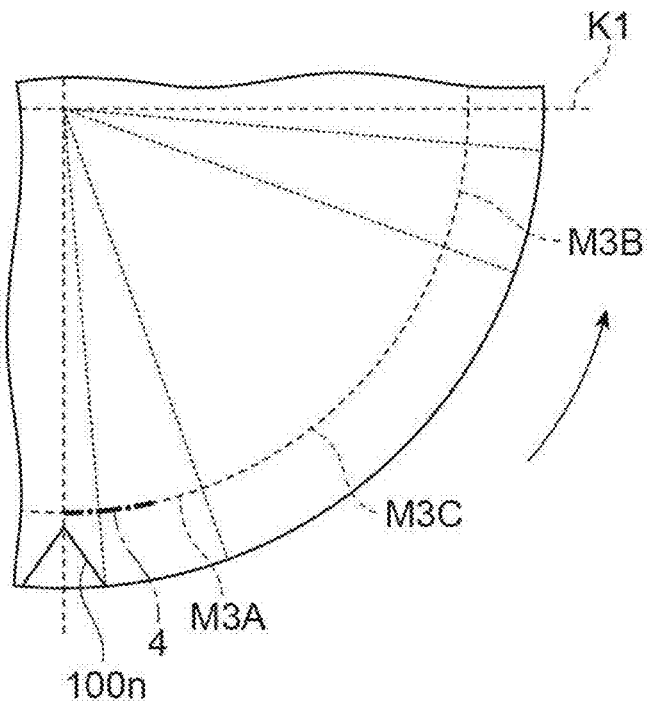
(b)
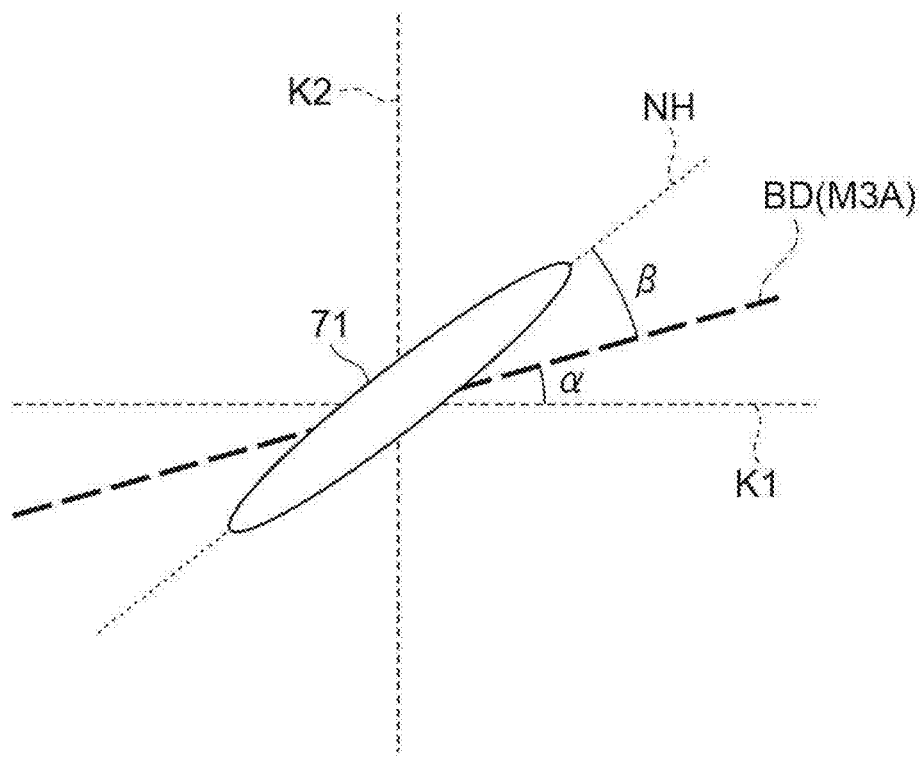

*Fig.67*
(a)
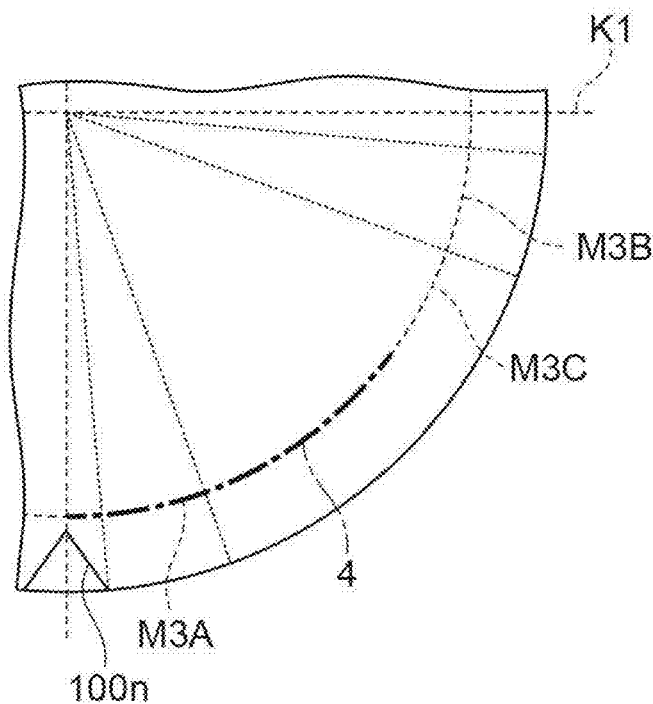
(b)
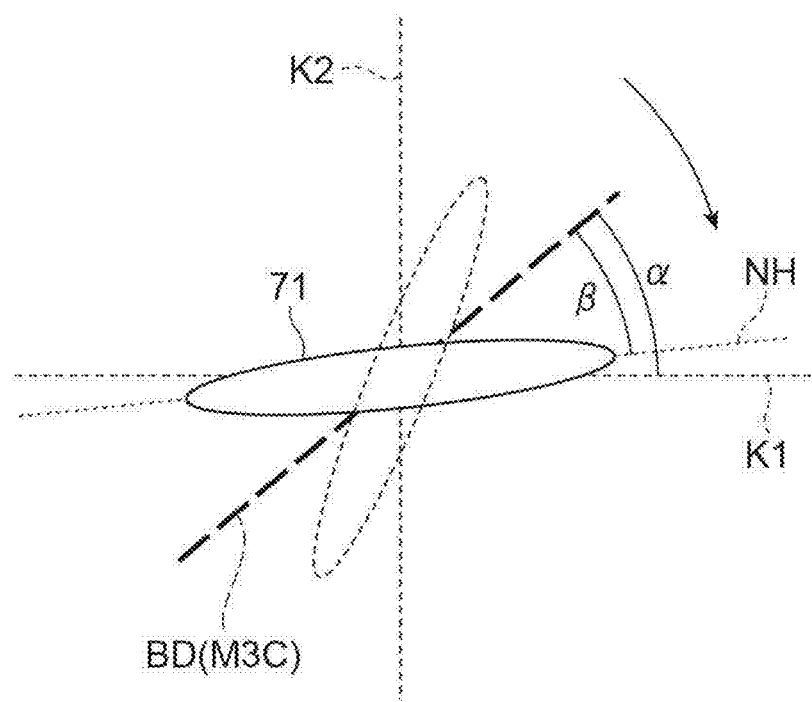

Fig.68
(a)
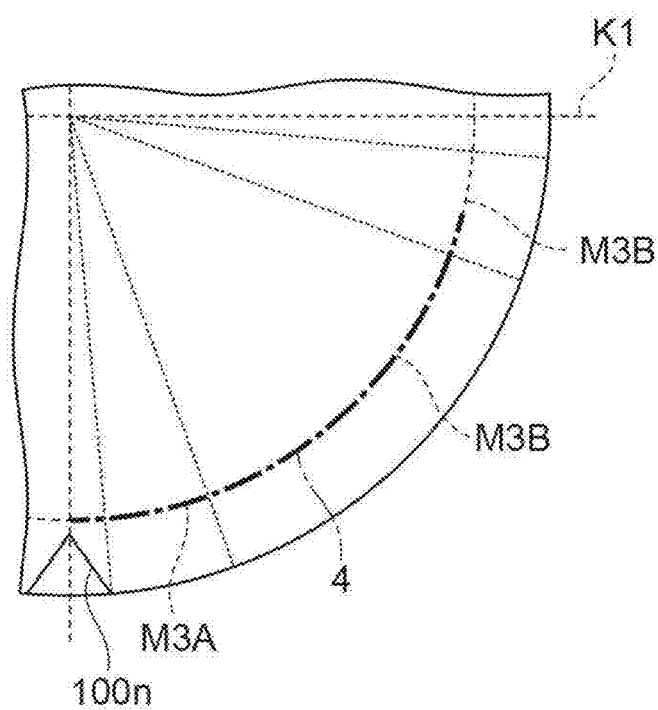
(b)
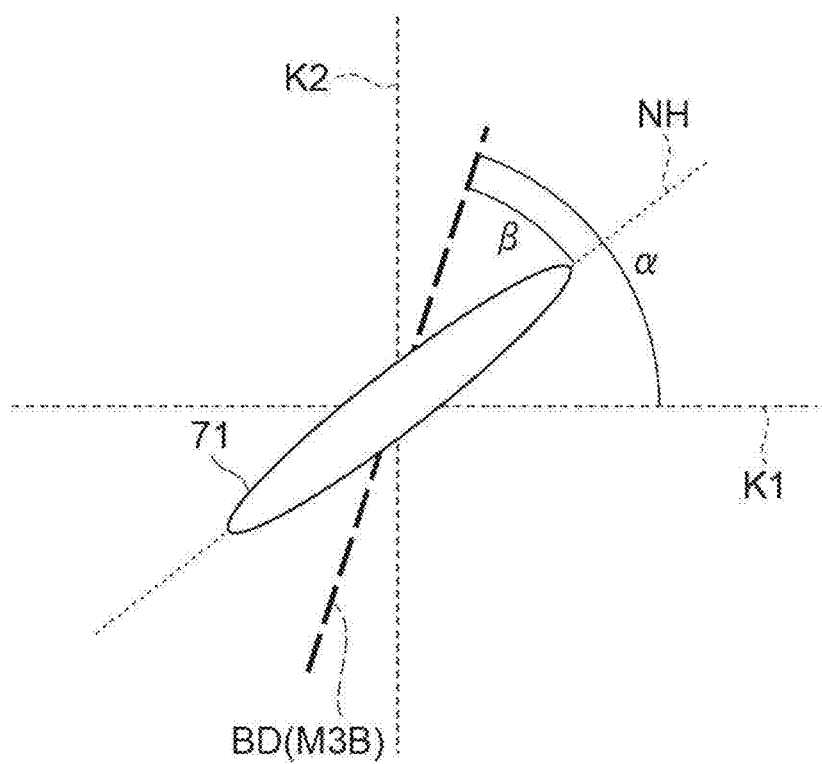

Fig.71 (a)
(b)
(c)
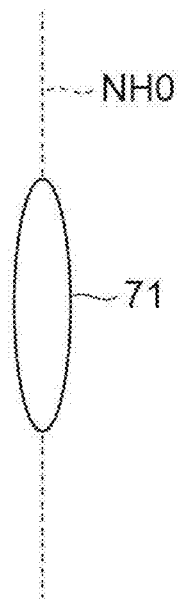

Fig.72
(a)
(b)
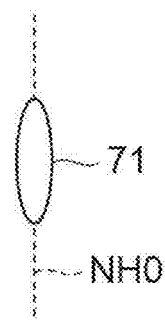
(c)
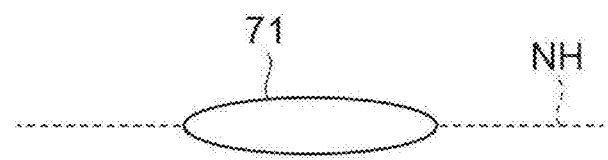

LASER PROCESSING DEVICE AND LASER PROCESSING METHOD

TECHNICAL FIELD

One aspect of the present invention relates to a laser processing apparatus and a laser processing method.

BACKGROUND ART

Patent Literature 1 describes a laser processing apparatus including a holding mechanism for holding a workpiece and a laser irradiation mechanism for irradiating the workpiece held by the holding mechanism with a laser light. In the laser processing apparatus described in Patent Literature 1, the laser irradiation mechanism including a condensing lens is fixed to a base, and the holding mechanism moves the workpiece in a direction orthogonal to the optical axis of the condensing lens.

CITATION LIST

Patent Literature

Patent Literature 1: Japanese Patent No. 5456510

SUMMARY OF INVENTION

Technical Problem

For example, manufacturing steps for a semiconductor device may include trimming processing for removing, from a semiconductor wafer, an outer edge portion thereof as an unnecessary portion. Unfortunately, it has been found that when a modified region is formed along a line annularly extending on the inner side of an outer edge of a target for removing the outer edge portion from the target by relatively moving a focusing point of a laser light along the line, a trimmed surface of the target from which the outer edge portion has been removed might have local deterioration of quality.

Thus, an object of one aspect of the present invention is to provide a laser processing apparatus and a laser processing method with which local deterioration of quality of a trimmed surface of a target from which an outer edge portion has been removed can be suppressed.

Solution to Problem

A laser processing apparatus according to one aspect of the present invention is a laser processing apparatus that emits a laser light with at least a part of a focusing region being on a target to form a modified region in the target, and includes: a support portion configured to support the target; an irradiation portion configured to irradiate the target supported by the support portion with the laser light; and a controller configured to control the support portion and the irradiation portion. The irradiation portion includes a shaping portion configured to shape the laser light, to make a shape of a part of the focusing region within a plane orthogonal to an optical axis of the laser light have a longitudinal direction. The controller includes: a determination portion configured to determine, based on target information on the target and line information on a line extending annularly on an inner side of an outer edge of the target for relatively moving the part of the focusing region along the line, a first orientation that is an orientation of the longitudinal direction for relatively moving the part of the focusing region along a first region of the line, and a second orientation that is an orientation of the longitudinal direction for relatively moving the part of the focusing region along a second region of the line, to make the longitudinal direction intersect with a movement direction of the part of the focusing region; a processing controller configured to perform a first process of forming the modified region of relatively moving the part of the focusing region along the first region and stopping formation of the modified region in a region of the line other than the first region, and a second process of forming the modified region of relatively moving the part of the focusing region along the second region and stopping formation of the modified region in a region of the line other than the second region; and an adjustment portion configured to adjust the orientation of the longitudinal direction to be the first orientation when the processing controller performs the first process, and to adjust the orientation of the longitudinal direction to be the second orientation when the processing controller performs the second process.

The laser processing apparatus performs the first process of relatively moving the part of the focusing region along the first region of the line to form the modified region, and stopping the formation of the modified region in a region other than the first region of the line. In the first process, the orientation of the longitudinal direction of the shape of the part of the focusing region within the plane orthogonal to the optical axis of the laser light (hereinafter, referred to as a "beam shape") is adjusted to the first orientation that is an orientation intersecting with the movement direction of the part of the focusing region (hereinafter, referred to as a "processing proceeding direction") and is determined based on the target information and the line information. Furthermore, the second process of relatively moving the part of the focusing region along the second region of the line to form the modified region, and stopping the formation of the modified region in a region other than the second region of the line is performed. In the second process, the orientation of the longitudinal direction of the beam shape is adjusted to be the second orientation that is an orientation intersecting with the processing proceeding direction and is determined based on the target information and the line information. Thus, when the quality of the trimmed surface of the first region and the second region deteriorates due to the physical property of the target for example as a result of simply relatively moving a part of the focusing region along the line with the longitudinal direction of the beam shape matching the processing proceeding direction, such a deterioration of the quality of the trimmed surface can be suppressed. Thus, local deterioration of the quality of the trimmed surface of the target from which the outer edge portion has been removed can be suppressed.

In the laser processing apparatus according to one aspect of the present invention, the target information may include information on a crystal orientation of the target, and the line information may include information on the movement direction of the part of the focusing region. Thus, even when the target includes the crystal orientation, local deterioration of the quality of the trimmed surface of the target can be suppressed.

In the laser processing apparatus according to one aspect of the present invention, the shaping portion may include a spatial light modulator, and the adjustment portion may control the spatial light modulator to adjust the orientation of the longitudinal direction. Thus, the orientation of the longitudinal direction of the beam shape can be reliably adjusted.

In the laser processing apparatus according to one aspect of the present invention, the target may be a wafer that has a (100) plane as a principal plane, and include a first crystal orientation orthogonal to one (110) plane and a second crystal orientation orthogonal to another (110) plane, the line annularly may extend in a view orthogonal to the principal plane, the first region may include a region in which a processing angle is 0° or greater and less than 45°, the processing angle being an angle of the movement direction of the part of the focusing region with respect to the first crystal orientation, when the part of the focusing region is relatively moved along the line, and the second region may include a region in which the processing angle is 45° or greater and less than 90°, when the part of the focusing region is relatively moved along the line. Thus, even when the target is a wafer having the (100) plane as the principal plane, local deterioration of the quality of the trimmed surface of the target can be suppressed.

In the laser processing apparatus according to one aspect of the present invention, the first orientation and the second orientation may be orientations of a direction inclined with respect to the movement direction toward one of the first crystal orientation and the second crystal orientation forming a larger angle with the movement direction. Thus, even when the target is a wafer having the (100) plane as the principal plane, deterioration of the quality of the trimmed surface of the target can be more reliably suppressed in each of the first region and the second region.

In the laser processing apparatus according to one aspect of the present invention, the first orientation and the second orientation may be orientations of a direction inclined by 10° to 35° from the movement direction toward one of the first crystal orientation and the second crystal orientation forming a larger angle with the movement direction. Thus, even when the target is a wafer having the (100) plane as the principal plane, deterioration of the quality of the trimmed surface of the target can be more reliably suppressed in each of the first region and the second region.

In the laser processing apparatus according to one aspect of the present invention, the irradiation portion may include: a first laser processing head configured to emit a first laser light as the laser light; and a second laser processing head configured to emit a second laser light as the laser light, in the first process, relatively move the part of the focusing region of the first laser light along the first region to form the modified region and stops formation of the modified region in a region of the line other than the first region, and in the second process, relatively move the part of the focusing region of the second laser light along the second region to form the modified region and stops formation of the modified region in a region of the line other than the second region, and the adjustment portion may adjust, when the first process is performed, an orientation of a longitudinal direction of a shape of the part of the focusing region in a plane orthogonal to an optical axis of the first laser light to be the first orientation, and adjust, when the second process is performed, an orientation of a longitudinal direction of a shape of the part of the focusing region in a plane orthogonal to an optical axis of the second laser light to be the second orientation. When the first and the second laser processing heads are provided as the irradiation portion, the first process and the second process may be performed in parallel (simultaneously), and as a result, a better takt time can be achieved.

A laser processing method according to one aspect of the present invention is a laser processing method that emits a laser light with at least a part of a focusing region being on a target to form a modified region in the target, and includes: a determination step of determining, based on target information on the target and line information on a line extending annularly on an inner side of an outer edge of the target for relatively moving the part of the focusing region along the line, a first orientation that is an orientation of a longitudinal direction that a shape of a part of the focusing region within a plane orthogonal to an optical axis of the laser light has, for relatively moving the part of the focusing region along a first region of the line, and a second orientation that is an orientation of the longitudinal direction for relatively moving the part of the focusing region along a second region of the line, to make the longitudinal direction intersect with a movement direction of the part of the focusing region; a first processing step of forming the modified region of relatively moving the part of the focusing region along the first region and stopping formation of the modified region in a region of the line other than the first region; a second processing step of forming the modified region of relatively moving the part of the focusing region along the second region and stopping formation of the modified region in a region of the line other than the second region; a first adjustment step of adjusting the orientation of the longitudinal direction to be the first orientation when the first processing step is performed; and a second adjustment step of adjusting the orientation of the longitudinal direction to be the second orientation when the second processing step is performed.

With the laser processing method, the first processing step of relatively moving the part of the focusing region along the first region of the line to form the modified region, and stopping the formation of the modified region in a region other than the first region of the line is performed. In the first processing step, the orientation of the longitudinal direction of the beam shape is adjusted to be the first orientation that is an orientation intersecting with the processing proceeding direction and is determined based on the target information and the line information. Furthermore, the second processing step of relatively moving the part of the focusing region along the second region of the line to form the modified region, and stopping the formation of the modified region in a region other than the second region of the line is performed. In the second processing step, the orientation of the longitudinal direction of the beam shape is adjusted to be the second orientation that is an orientation intersecting with the processing proceeding direction and is determined based on the target information and the line information. Thus, when the quality of the trimmed surface of the first region and the second region deteriorates due to the physical property of the target for example as a result of simply relatively moving a part of the focusing region along the line with the longitudinal direction of the beam shape matching the processing proceeding direction, such a deterioration of the quality of the trimmed surface can be suppressed. Thus, local deterioration of the quality of the trimmed surface of the target from which the outer edge portion has been removed can be suppressed.

Advantageous Effects of Invention

According to one aspect of the present invention, a laser processing apparatus and a laser processing method with which local deterioration of quality of a trimmed surface of a target from which an outer edge portion has been removed can be suppressed can be provided.

BRIEF DESCRIPTION OF DRAWINGS

FIG. 13(a) is a plan view of the target continuing from FIG. 12(b). FIG. 13(b) is a side view of the target illustrated in FIG. 13(a). FIG. 13(c) is a side view of a target illustrating polishing processing according to the first embodiment.

FIG. 15(a) is a plan view of a target illustrating a main part of trimming processing according to the first embodiment. FIG. 15(b) is a diagram illustrating a beam shape during laser processing in FIG. 15(a).

FIG. 16(a) is a plan view of the target continuing from FIG. 15(a). FIG. 16(b) is a diagram illustrating a beam shape during laser processing in FIG. 16(a).

FIG. 17 is a timetable illustrating a first operation example in a case where the laser processing apparatus in FIG. 9 performs the laser processing.

FIG. 18 is a timetable illustrating a second operation example in a case where the laser processing apparatus in FIG. 9 performs the laser processing.

FIG. 19 is a timetable illustrating a third operation example in a case where the laser processing apparatus in FIG. 9 performs the laser processing.

FIG. 20 is a timetable illustrating a fourth operation example in a case where the laser processing apparatus in FIG. 9 performs the laser processing.

FIG. 21(a) is a photographic view illustrating a part of the target after the trimming processing performed with the longitudinal direction of the beam shape and a processing proceeding direction matched. FIG. 21(b) is a photographic view illustrating a part of the target after the trimming processing by the laser processing apparatus in FIG. 9.

FIG. 22(a) is a photographic view illustrating a part of the target after the trimming processing performed with the longitudinal direction of the beam shape and the processing proceeding direction matched. FIG. 22(b) is a photographic view illustrating a part of the target after the trimming processing by the laser processing apparatus in FIG. 9.

FIG. 23 is a diagram illustrating a part of the target after the trimming processing.

FIG. 26 is a photographic view illustrating trimmed surfaces of targets according to the experimental results in FIG. 24.

FIG. 30 is a photographic view illustrating trimmed surfaces of targets according to the experimental results in FIG. 24.

FIG. 31 is a photographic view illustrating trimmed surfaces of targets according to the experimental results in FIG. 24.

FIG. 32 is a photographic view illustrating trimmed surfaces of targets according to the experimental results in FIG. 24.

FIG. 34 is a photographic view illustrating trimmed surfaces of targets according to the experimental results in FIG. 24.

FIG. 40 is a photographic view illustrating trimmed surfaces of targets according to the experimental results in FIG. 24.

FIG. 45 is a photographic view illustrating trimmed surfaces of targets according to the experimental results in FIG. 24.

FIG. 46 is a photographic view illustrating trimmed surfaces of targets according to the experimental results in FIG. 24.

FIG. 48 is a photographic view illustrating trimmed surfaces of targets according to the experimental results in FIG. 24.

FIG. 50 is a photographic view illustrating trimmed surfaces of targets according to the experimental results in FIG. 24.

FIG. 51 is a photographic view illustrating trimmed surfaces of targets according to the experimental results in FIG. 24.

FIG. 53 is a photographic view illustrating trimmed surfaces of targets according to the experimental results in FIG. 24.

FIG. 54 is a photographic view illustrating trimmed surfaces of targets according to the experimental results in FIG. 24.

FIG. 55(a) is a plan view of a target illustrating a main part of trimming processing according to a second embodiment. FIG. 55(b) is a diagram illustrating a beam shape during laser processing in FIG. 55(a).

FIG. 56(a) is a plan view of the target continuing from FIG. 55(a). FIG. 56(b) is a diagram illustrating a beam shape during laser processing in FIG. 56(a).

FIG. 57(a) is a plan view of the target continuing from FIG. 56(a). FIG. 57(b) is a diagram illustrating a beam shape during laser processing in FIG. 57(a).

FIG. 59(a) is a diagram for explaining switching of an orientation of the beam shape. FIG. 59(b) is another diagram for explaining switching of the orientation of the beam shape.

FIG. 60(a) is a plan view of a target illustrating a main part of trimming processing according to a third embodiment. FIG. 60(b) is a diagram illustrating a beam shape during laser processing in FIG. 60(a).

FIG. 61(a) is a plan view of the target continuing from FIG. 60(a). FIG. 61(b) is a diagram illustrating a beam shape during laser processing in FIG. 61(a).

FIG. 62(a) is a plan view of the target continuing from FIG. 61(a). FIG. 62(b) is a diagram illustrating a beam shape during laser processing in FIG. 62(a).

FIG. 63(a) is a plan view of the target continuing from FIG. 62(a). FIG. 63(b) is a diagram illustrating a beam shape during laser processing in FIG. 63(a).

FIG. 66(a) is a partial plan view of a target illustrating a main part of trimming processing according to a fourth embodiment. FIG. 66(b) is a diagram illustrating a beam shape during laser processing in FIG. 66(a).

FIG. 67(a) is a partial plan view of the target continuing from FIG. 66(a). FIG. 67(b) is a diagram illustrating a beam shape during laser processing in FIG. 67(a).

FIG. 68(a) is a partial plan view of the target continuing from FIG. 67(a). FIG. 68(b) is a diagram illustrating a beam shape during laser processing in FIG. 68(a).

FIG. 71(a) is a diagram illustrating a beam shape on a laser light incident surface side in the vicinity of a focusing point for a first laser light having astigmatism. FIG. 71(b) is a diagram illustrating a beam shape between the laser light incident surface side in the vicinity of the focusing point for the first laser light having astigmatism and an opposite surface side of the incident surface. FIG. 71(c) is a diagram illustrating a beam shape on the opposite surface side of the laser light incident surface in the vicinity of the focusing point for the first laser light having astigmatism.

FIG. 72(a) is a diagram illustrating a beam shape on the laser light incident surface side in the vicinity of the focusing point for the first laser light when a slit or elliptical optical system is used. FIG. 72(b) is a diagram illustrating a beam shape of the focusing point for the first laser light when the slit or elliptical optical system is used. FIG. 72(c) is a diagram illustrating a beam shape on the opposite surface side of the laser light incident surface in the vicinity of the focusing point for the first laser light when the slit or elliptical optical system is used.

DESCRIPTION OF EMBODIMENTS

Hereinafter, embodiments will be described in detail with reference to the drawings. The same elements in the figures will be denoted by the same reference signs, and overlapping descriptions will be omitted.

First of all, the basic configuration, operation, effects, and a modification example of a laser processing apparatus will be described.

[Configuration of Laser Processing Apparatus]

Figure 1:
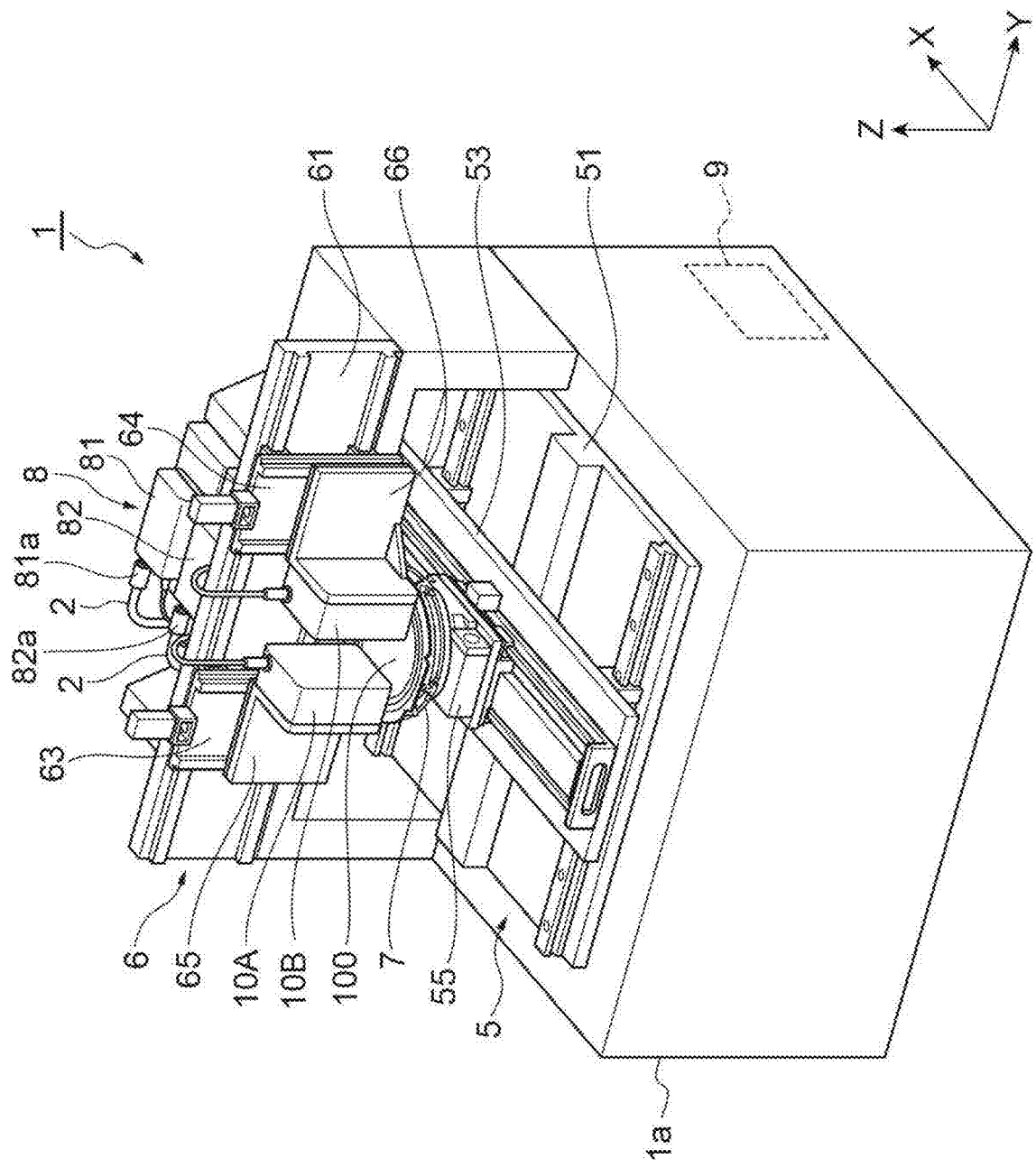
FIG. 1 is a perspective view of a laser processing apparatus of an embodiment.

As illustrated in FIG. 1, a laser processing apparatus 1 includes a plurality of movement mechanisms 5 and 6, a support portion 7, a pair of laser processing heads 10A and 10B (a first laser processing head and a second laser processing head), a light source unit 8, and a controller 9. Hereinafter, a first direction is referred to as an X direction, a second direction orthogonal to the first direction is referred to as a Y direction, and a third direction orthogonal to the first direction and the second direction is referred to as a Z direction. In the present embodiment, the X direction and the Y direction are horizontal directions, and the Z direction is a vertical direction.

The movement mechanism 5 includes a fixed portion 51, a moving portion 53, and an attachment portion 55. The fixed portion 51 is attached to a device frame 1a. The moving portion 53 is attached to a rail provided on the fixed portion 51, and can move along the Y direction. The attachment portion 55 is attached to a rail provided on the moving portion 53, and can move along the X direction.

The movement mechanism 6 includes a fixed portion 61, a pair of moving portions (a first moving portion and a second moving portion) 63 and 64, and a pair of attachment portions (a first attachment portion and a second attachment portion) 65 and 66. The fixed portion 61 is attached to the device frame 1a. The pair of moving portions 63 and 64 are each attached to a rail provided on the fixed portion 61, and can each independently move along the Y direction. The attachment portion 65 is attached to a rail provided on the moving portion 63, and can move along the Z direction. The attachment portion 66 is attached to a rail provided on the moving portion 64, and can move along the Z direction. Thus, the pair of attachment portions 65 and 66 can respectively move along the Y direction and the Z direction relative to the device frame 1a. The moving portions 63 and 64 respectively form first and second horizontal movement mechanisms (horizontal movement mechanism), respectively. The attachment portions 65 and 66 respectively form first and second vertical movement mechanisms (vertical movement mechanism).

The support portion 7 is attached to a rotation shaft provided to the attachment portion 55 of the movement mechanism 5, and can rotate about an axis parallel to the Z direction. Thus, the support portion 7 can move along each of the X direction and the Y direction, and can rotate about the axis parallel to the Z direction. The support portion 7 supports a target 100. The target 100 is, for example, a wafer.

Figure 2:
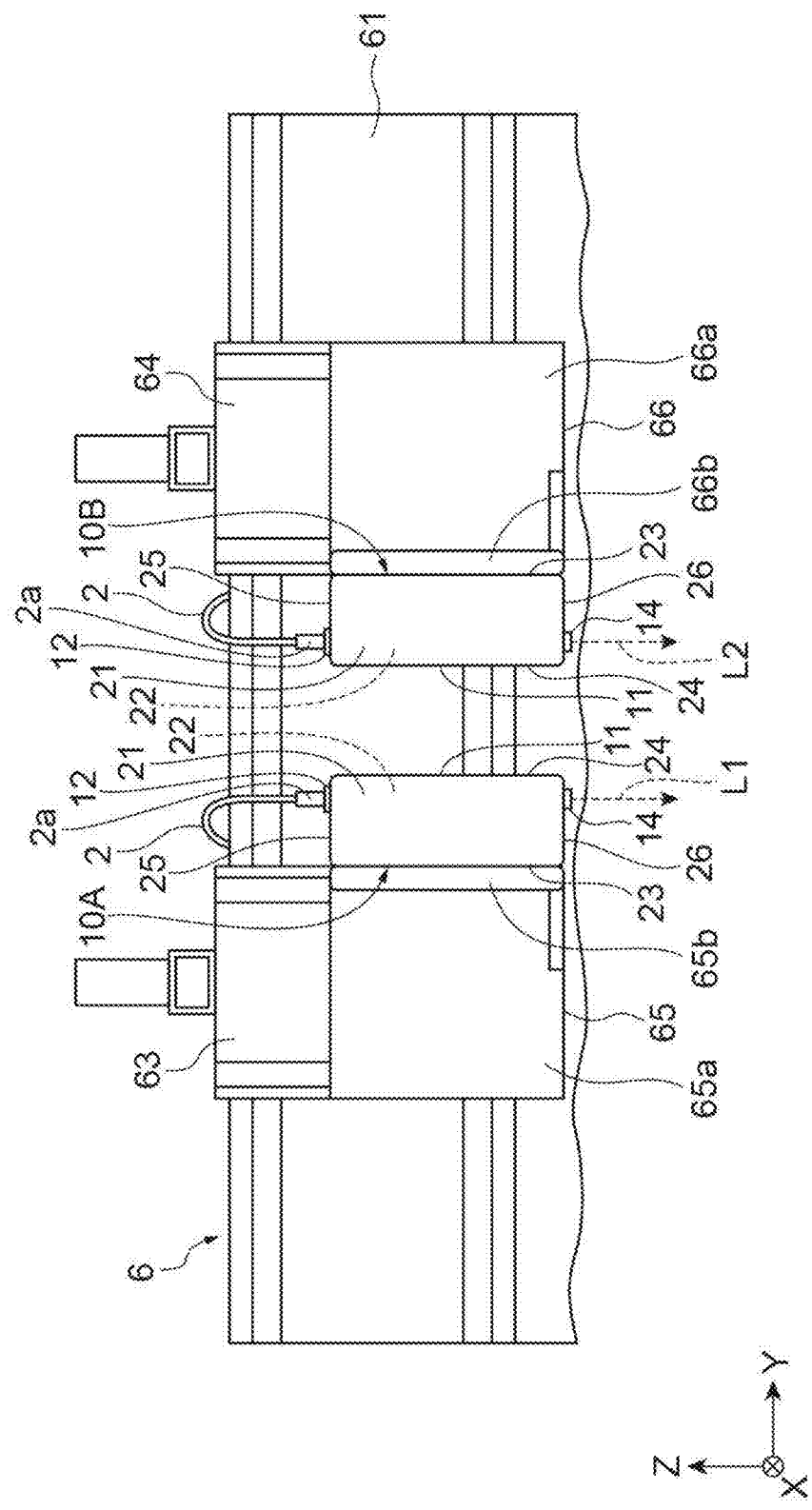
FIG. 2 is a front view of a portion of the laser processing apparatus illustrated in FIG. 1.

As illustrated in FIGS. 1 and 2, the laser processing head 10A is attached to the attachment portion 65 of the movement mechanism 6. The laser processing head 10A irradiates the target 100, supported by the support portion 7, with a laser light L1 (also referred to as "first laser light L1"), while facing the support portion 7 in the Z direction. The laser processing head 10B is attached to the attachment portion 66 of the movement mechanism 6. The laser processing head 10B irradiates the target 100, supported by the support portion 7, with a laser light L2 (also referred to as "second laser light L2"), while facing the support portion 7 in the Z direction. The laser processing heads 10A and 10B serve as an irradiation portion.

The light source unit 8 includes a pair of light sources 81 and 82. The light source 81 outputs the laser light L1. The laser light L1 is emitted from an emission portion 81a of the light source 81, and is guided to the laser processing head 10A by an optical fiber 2. The light source 82 outputs the laser light L2. The laser light L2 is emitted from an emission portion 82a of the light source 82, and is guided to the laser processing head 10B by another optical fiber 2.

The controller 9 controls each part of the laser processing apparatus 1 (such as the support portion 7, the plurality of movement mechanisms 5 and 6, the pair of laser processing heads 10A and 10B, and the light source unit 8). The controller 9 is configured as a computer device including a processor, a memory, a storage, a communication device, and the like. In the controller 9, software (program) loaded onto the memory or the like is performed by the processor, and reading and writing of data from and to the memory and storage, and communication by the communication device are controlled by the processor. Thus, the controller 9 implements various functions.

An example of processing by the laser processing apparatus 1 configured as described above will be described. This example processing is an example in which a modified region is formed inside the target 100 along a plurality of lines set to form a grid pattern for cutting the target 100, which is a wafer, into a plurality of chips.

First of all, the movement mechanism 5 moves the support portion 7, supporting the target 100, along each of the X direction and the Y direction to make the support portion 7 face the pair of laser processing heads 10A and 10B in the Z direction. Then, the movement mechanism 5 rotates the support portion 7 about the axis parallel to the Z direction to align the plurality of lines extending in one direction on the target 100 with the X direction.

Then, the movement mechanism 6 moves the laser processing head 10A along the Y direction to position the focusing point (a part of the focusing region) of the laser light L1 on one of the lines extending in one direction. Furthermore, the movement mechanism 6 moves the laser processing head 10B along the Y direction to position the focusing point of the laser light L2 on another one of the lines extending in one direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one line extending in one direction, and to relatively move the focusing point of the laser light L2 along another line extending in one direction. In this manner, the laser processing apparatus 1 forms the modified region inside the target 100 along each of the plurality of lines extending in one direction on the target 100.

Subsequently, the movement mechanism 5 rotates the support portion 7 about an axis parallel to the Z direction so that a plurality of lines extending in the other direction orthogonal to one direction of the target 100 are aligned with the X direction.

Subsequently, the movement mechanism 6 moves the laser processing head 10A along the Y direction to position the focusing point of the laser light L1 on one line extending in the other direction. On the other hand, the movement mechanism 6 moves the laser processing head 10B along the Y direction to position the focusing point of the laser light L2 on another line extending in the other direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one extending in the other direction, and to relatively move the focusing point of the laser light L2 along another line extending in the other direction. In this manner, the laser processing apparatus 1 forms the modified region inside the target 100 along each of the plurality of lines extending in the other direction on the target 100 orthogonal to the one direction.

In one example processing described above, the light source 81 outputs the laser light L1 that transmits through the target 100 by pulse oscillation, and the light source 82 outputs the laser light L2 that transmits through the target 100 by pulse oscillation. When such laser lights are focused inside the target 100, the laser lights are mainly absorbed at the portion corresponding to the focusing points of the laser lights, whereby the modified region is formed inside the target 100. The modified region is a region in which the density, refractive index, mechanical strength, and other physical characteristics are different from those of the surrounding non-modified regions. Examples of the modified region include a melting treatment region, a crack region, a dielectric breakdown region, a refractive index change region, and the like.

When the target 100 is irradiated with the laser light output using the pulse oscillation and the focusing point of the laser light is relatively moved along the line set on the target 100, a plurality of modified spots are formed in an aligned manner along the line. One modified spot is formed by irradiation with one pulse laser light. A line of modified region is a collection of a plurality of modified spots aligned. Adjacent modified spots may be connected to each other or separated from each other depending on the relative moving speed of the focusing point of the laser light with respect to the target 100 and the repetition frequency of the laser light. The shape set to be formed by the is not limited to a grid shape, and may be an annular shape, a linear shape, a curved shape, or a shape that is a combination of at least some of these.

[Configuration of Laser Processing Head]

Figure 3:
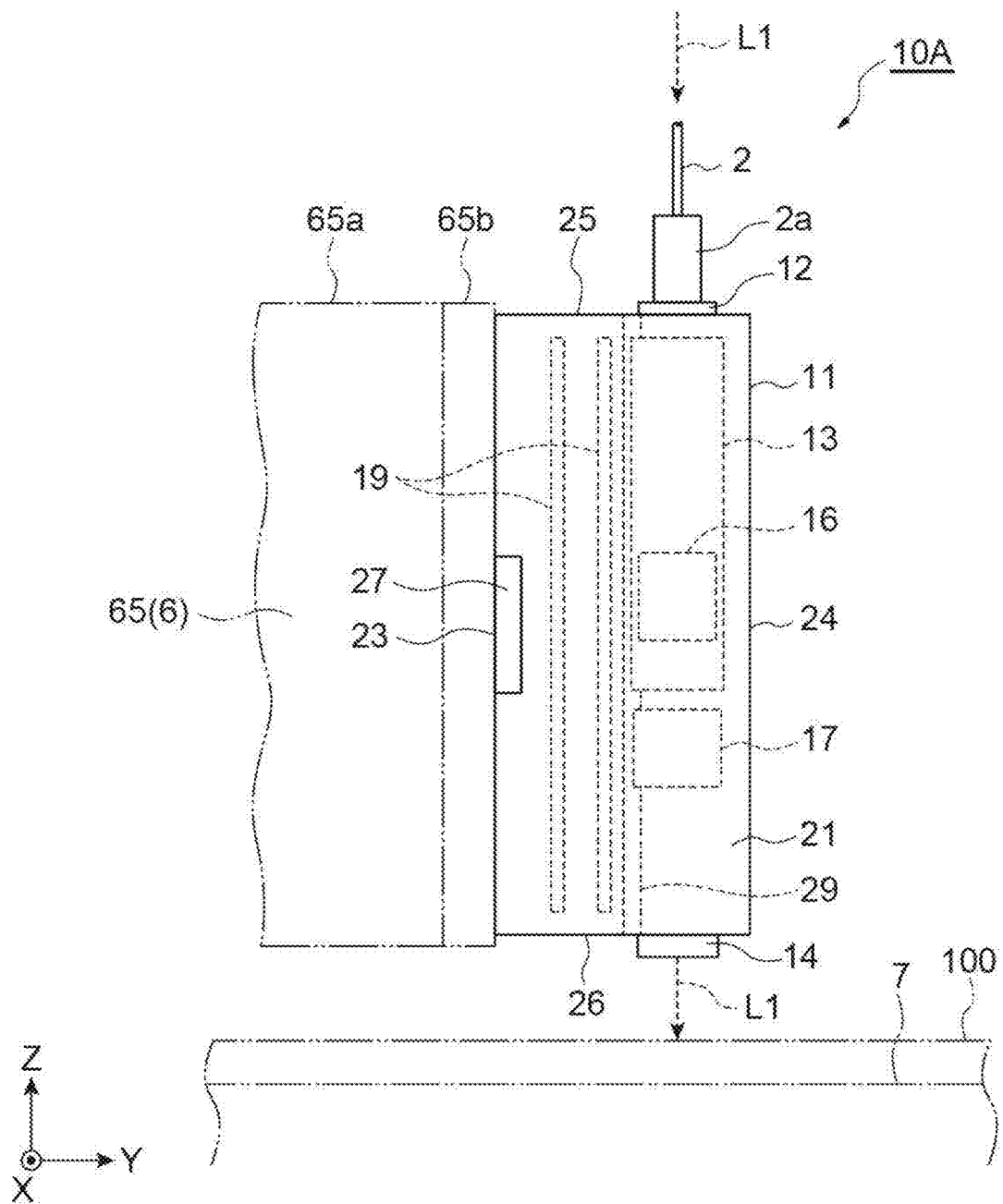
FIG. 3 is a front view of a laser processing head of the laser processing apparatus illustrated in FIG. 1.
Figure 4:
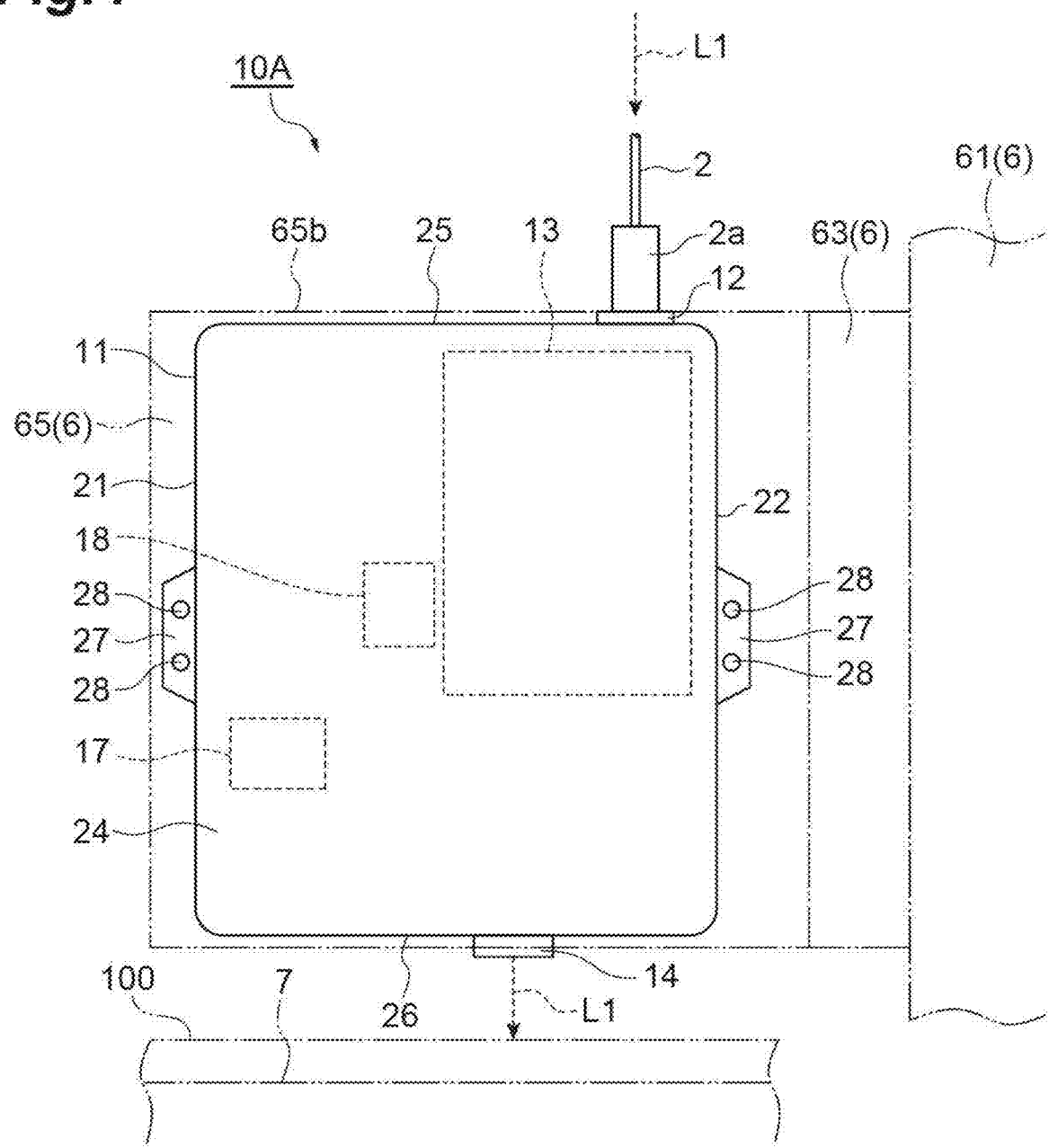
FIG. 4 is a side view of the laser processing head illustrated in FIG. 3.

As illustrated in FIGS. 3 and 4, the laser processing head 10A includes a housing 11, an entrance portion 12, an adjustment portion 13, and a condensing unit 14.

The housing 11 has a first wall portion 21, a second wall portion 22, a third wall portion 23, a fourth wall portion 24, a fifth wall portion 25, and a sixth wall portion 26. The first wall portion 21 and the second wall portion 22 face each other in the X direction. The third wall portion 23 and the fourth wall portion 24 face each other in the Y direction. The fifth wall portion 25 and the sixth wall portion 26 face each other in the Z direction.

The distance between the third wall portion 23 and the fourth wall portion 24 is shorter than the distance between the first wall portion 21 and the second wall portion 22. The distance between the first wall portion 21 and the second wall portion 22 is shorter than the distance between the fifth wall portion 25 and the sixth wall portion 26. The distance between the first wall portion 21 and the second wall portion 22 may the same as the distance between the fifth wall portion 25 and the sixth wall portion 26, or may be longer than the distance between the fifth wall portion 25 and the sixth wall portion 26.

In the laser processing head 10A, the first wall portion 21 is located on the fixed portion 61 side of the movement mechanism 6, and the second wall portion 22 is located on side opposite to the fixed portion 61. The third wall portion 23 is located on the attachment portion 65 side of the movement mechanism 6, and the fourth wall portion 24 is located on the side opposite to the attachment portion 65 which is the laser processing head 10B side (see FIG. 2). The fifth wall portion 25 is located on the side opposite to the support portion 7, and the sixth wall portion 26 is located on the support portion 7 side.

The housing 11 is configured to be attached to the attachment portion 65, with the third wall portion 23 arranged on the attachment portion 65 side of the movement mechanism 6. The specific configuration is as follows. The attachment portion 65 includes a base plate 65a and an attachment plate 65b. The base plate 65a is attached to a rail provided on the moving portion 63 (see FIG. 2). The attachment plate 65b stands at an end portion of the base plate 65a on the laser processing head 10B side (see FIG. 2). The housing 11 is attached to the attachment portion 65 by screwing bolts 28 to the attachment plate 65b via supports 27 in a state where the third wall portion 23 is in contact with the attachment plate 65b. The supports 27 are respectively provided to the first wall portion 21 and the second wall portion 22. The housing 11 is detachably attached to the attachment portion 65.

The entrance portion 12 is attached to the fifth wall portion 25. The laser light L1 enters the housing 11 through the entrance portion 12. The entrance portion 12 is offset toward the second wall portion 22 side (one wall portion side) in the X direction, and is offset toward the fourth wall portion 24 side in the Y direction. Specifically, the distance between the entrance portion 12 and the second wall portion 22 in the X direction is shorter than the distance between the entrance portion 12 and the first wall portion 21 in the X direction, and the distance between the entrance portion 12 and the fourth wall portion 24 in the Y direction is shorter than the distance between the entrance portion 12 and the third wall portion 23 in the X direction.

The entrance portion 12 is configured to be connectable with a connection end portion 2a of the optical fiber 2. The connection end portion 2a of the optical fiber 2 is provided with a collimator lens that collimates the laser light L1 emitted from an emission end of the fiber, but is not provided with an isolator that suppresses the return light. The isolator is provided at an intermediate portion of the fiber more on the light source 81 side than the connection end portion 2a. This leads to downsizing of the connection end portion 2a, and of the entrance portion 12. The isolator may be provided at the connection end portion 2a of the optical fiber 2.

The adjustment portion 13 is arranged in the housing 11. The adjustment portion 13 adjusts the laser light L1 entered through the entrance portion 12. Each configuration of the adjustment portion 13 is attached to an optical base 29 provided in the housing 11. The optical base 29 is attached to the housing 11 so as to partition the area inside the housing 11 into a region on the third wall portion 23 side and a region on the fourth wall portion 24 side. The optical base 29 is integrated with the housing 11. The configurations of the adjustment portion 13 are attached to the optical base 29 on the fourth wall portion 24 side, and will be described in detail later.

The condensing unit 14 is arranged in the sixth wall portion 26. Specifically, the condensing unit 14 is arranged in the sixth wall portion 26 while being inserted into a hole 26a formed in the sixth wall portion 26. The condensing unit 14 condenses the laser light L1 adjusted by the adjustment portion 13 and emits it to the outside of the housing 11. The condensing unit 14 is offset toward the second wall portion 22 (one wall portion side) in the X direction, and is offset toward the fourth wall portion 24 in the Y direction. Specifically, the distance between the condensing unit 14 and the second wall portion 22 in the X direction is shorter than the distance between the condensing unit 14 and the first wall portion 21 in the X direction, and the distance between the condensing unit 14 and the fourth wall portion 24 in the Y direction is shorter than the distance between the condensing unit 14 and the third wall portion 23 in the X direction.

Figure 5:
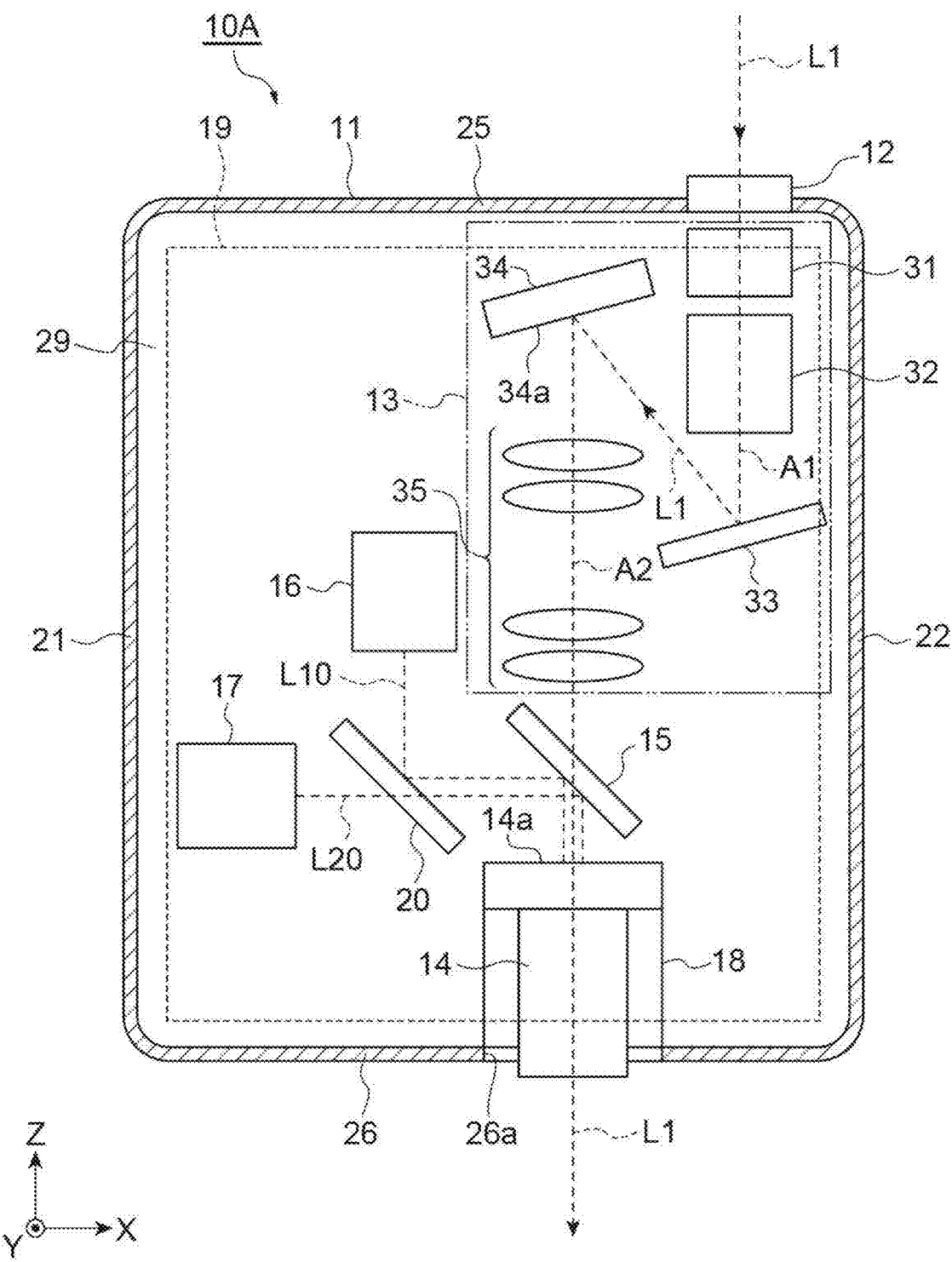
FIG. 5 is a diagram illustrating a configuration of an optical system of the laser processing head illustrated in FIG. 3.

As illustrated in FIG. 5, the adjustment portion 13 includes an attenuator 31, a beam expander 32, and a mirror 33. The entrance portion 12, as well as the attenuator 31, the beam expander 32, and the mirror 33 of the adjustment portion 13 are arranged on a straight line (first straight line) A1 extending along the Z direction. The attenuator 31 and the beam expander 32 are arranged between the entrance portion 12 and the mirror 33 on the straight line A1. The attenuator 31 adjusts the output of the laser light L1 that has entered through the entrance portion 12. The beam expander 32 expands the diameter of the laser light L1 the output of which has been adjusted by the attenuator 31. The mirror 33 reflects the laser light L1 the diameter of which has been expanded by the beam expander 32.

The adjustment portion 13 further includes a reflective spatial light modulator 34 and an imaging optical system 35. The reflective spatial light modulator 34 and the imaging optical system 35 of the adjustment portion 13 as well as the condensing unit 14 are arranged on a straight line (second straight line) A2 extending along the Z direction. The reflective spatial light modulator 34 modulates the laser light L1 reflected by the mirror 33. The reflective spatial light modulator 34 is, for example, a spatial light modulator (SLM) of a reflective liquid crystal (Liquid Crystal on Silicon (LCOS)). The imaging optical system 35 serves as a bilateral telecentric optical system in which a reflecting surface 34a of the reflective spatial light modulator 34 and an entrance pupil surface 14a of the condensing unit 14 are in an imaging relationship. The imaging optical system 35 includes three or more lenses.

The straight line A1 and the straight line A2 are located on a plane orthogonal to the Y direction. The straight line A1 is located on the second wall portion 22 side (one wall portion side) with respect to the straight line A2. In the laser processing head 10A, the laser light L1 enters the housing 11 through the entrance portion 12, travels on the straight line A1, is sequentially reflected by the mirror 33 and the reflective spatial light modulator 34, and then travels on the straight line A2 to be emitted to the outside of the housing 11 through the condensing unit 14. The order of arrangement of the attenuator 31 and the beam expander 32 may be reversed. The attenuator 31 may be arranged between the mirror 33 and the reflective spatial light modulator 34. The adjustment portion 13 may further include other optical components (for example, a steering mirror arranged in front of the beam expander 32 or the like).

The laser processing head 10A further includes a dichroic mirror 15, a measurement unit 16, a monitoring unit 17, a driving unit 18, and a circuit unit 19.

The dichroic mirror 15 is arranged between the imaging optical system 35 and the condensing unit 14 on the straight line A2. That is, the dichroic mirror 15 is arranged between the adjustment portion 13 and the condensing unit 14 in the housing 11. The dichroic mirror 15 is attached to the optical base 29 on the fourth wall portion 24 side. The dichroic mirror 15 transmits the laser light L1. From the sake of suppressing astigmatism, the dichroic mirror 15 may be, for example, a cube type or a two-plate type arranged in a twisted relationship.

The measurement unit 16 is arranged in the housing 11 on the first wall portion 21 side (opposite to one wall portion side) with respect to the adjustment portion 13. The measurement unit 16 is attached to the optical base 29 on the fourth wall portion 24 side. The measurement unit 16 outputs measurement light L10 for measuring the distance between the surface of the target 100 (for example, the surface on the side where the laser light L1 is incident) and the condensing unit 14, and detects the measurement light L10 reflected by the surface of the target 100 via the condensing unit 14. Thus, the surface of the target 100 is irradiated with the measurement light L10 output from the measurement unit 16, via the condensing unit 14, and then, the measurement light L10 reflected by the surface of the target 100 is detected by the measurement unit 16 via the condensing unit 14.

More specifically, the measurement light L10 output from the measurement unit 16 is sequentially reflected by a beam splitter 20 and the dichroic mirror 15 attached to the optical base 29 on the fourth wall portion 24 side, and then is emitted to the outside of the housing 11 from the condensing unit 14. The measurement light L10 reflected on the surface of the target 100 enters the housing 11 from the condensing unit 14 and is sequentially reflected by the dichroic mirror 15 and the beam splitter 20, to be incident on and detected by the measurement unit 16.

The monitoring unit 17 is arranged in the housing 11 on the first wall portion 21 side (opposite to one wall portion side) with respect to the adjustment portion 13. The monitoring unit 17 is attached to the optical base 29 on the fourth wall portion 24 side. The monitoring unit 17 outputs monitoring light L20 for monitoring the surface of the target 100 (for example, the surface on the side where the laser light L1 is incident), and detects the monitoring light L20 reflected by the surface of the target 100, via the condensing unit 14. Thus, the surface of the target 100 is irradiated with the monitoring light L20 output from the monitoring unit 17, via the condensing unit 14, and then, the monitoring light L20 reflected by the surface of the target 100 is detected by the monitoring unit 17 via the condensing unit 14.

More specifically, the monitoring light L20 output from the monitoring unit 17 transmits through the beam splitter 20 and is reflected by the dichroic mirror 15, to be emitted to the outside of the housing 11 from the condensing unit 14. The monitoring light L20 reflected by the surface of the target 100 enters the housing 11 through the condensing unit 14, and is reflected by the dichroic mirror 15 to be transmitted through the beam splitter 20 and to be incident on and detected by the monitoring unit 17. Wavelengths of the laser light L1, the measurement light L10, and the monitoring light L20 are different from each other (at least their center wavelengths are shifted from each other).

The driving unit 18 is attached to the optical base 29 on the fourth wall portion 24 side. It is attached to the sixth wall portion 26 of the housing 11. The driving unit 18 moves the condensing unit 14, arranged on the sixth wall portion 26, along the Z direction using, for example, driving force of a piezoelectric element.

The circuit unit 19 is arranged on the third wall portion 23 side with respect to the optical base 29, in the housing 11. Specifically, in the housing 11, the circuit unit 19 is arranged on the third wall portion 23 side with respect to the adjustment portion 13, the measurement unit 16, and the monitoring unit 17. The circuit unit 19 is, for example, a plurality of circuit boards. The circuit unit 19 processes a signal output from the measurement unit 16 and a signal input to the reflective spatial light modulator 34. The circuit unit 19 controls the driving unit 18 based on the signal output from the measurement unit 16. As an example, the circuit unit 19 controls the driving unit 18 to maintain a constant distance between the surface of the target 100 and the condensing unit 14 (to maintain a constant distance between the surface of the target 100 and the focusing point of the laser light L1) based on the signal output from the measurement unit 16. The housing 11 is provided with a connector (not illustrated) to which wiring for electrically connecting the circuit unit 19 to the controller 9 (see FIG. 1) or the like is connected.

Similar to the laser processing head 10A, the laser processing head 10B includes the housing 11, the entrance portion 12, the adjustment portion 13, the condensing unit 14, the dichroic mirror 15, the measurement unit 16, the monitoring unit 17, the driving unit 18, and the circuit unit 19. Note that, as illustrated in FIG. 2, the configurations of the laser processing head 10B are in a plane-symmetrical relationship with the configurations of the laser processing head 10A, about a virtual plane that passes through the midpoint between the pair of attachment portions 65 and 66 and is orthogonal to the Y direction.

For example, the housing (first housing) 11 of the laser processing head 10A is attached to the attachment portion 65 with the fourth wall portion 24 positioned on the laser processing head 10B side with respect to the third wall portion 23, and with the sixth wall portion 26 positioned on the support portion 7 side with respect to the fifth wall portion 25. On the other hand, the housing (second housing) 11 of the laser processing head 10B is attached to the attachment portion 66 with the fourth wall portion 24 positioned on the laser processing head 10A side with respect to the third wall portion 23, and with the sixth wall portion 26 positioned on the support portion 7 side with respect to the fifth wall portion 25.

The housing 11 of the laser processing head 10B is configured to be attached to the attachment portion 66 with the third wall portion 23 arranged on the attachment portion 66 side. The specific configuration is as follows. The attachment portion 66 includes a base plate 66a and an attachment plate 66b. The base plate 66a is attached to a rail provided on the moving portion 63. The attachment plate 66b stands at an end portion of the base plate 66a on the laser processing head 10A side. The housing 11 of the laser processing head 10B is attached to the attachment portion 66 with the third wall portion 23 being in contact with the attachment plate 66b. The housing 11 of the laser processing head 10B is detachably attached to the attachment portion 66.

[Operation and Effect]

The laser processing head 10A has no light source, for outputting the laser light L1, provided in the housing 11. Thus, the housing 11 can be downsized. In the housing 11, the distance between the third wall portion 23 and the fourth wall portion 24 is shorter than the distance between the first wall portion 21 and the second wall portion 22, and the condensing unit 14 arranged on the sixth wall portion 26 is offset toward the fourth wall portion 24 in the Y direction. With this configuration, when the housing 11 moves along a direction orthogonal to the optical axis of the condensing unit 14, even if another configuration (the laser processing head 10B, for example) exists on the fourth wall portion 24 side, the condensing unit 14 can be brought near the other configuration. Therefore, the laser processing head 10A is suitable for moving the condensing unit 14 along the direction orthogonal to its optical axis.

In the laser processing head 10A, the entrance portion 12 is provided in the fifth wall portion 25 and is offset toward the fourth wall portion 24 in the Y direction. With this configuration, another configuration (the circuit unit 19 for example) can be arranged in a region, of a region in the housing 11, on the third wall portion 23 side with respect to the adjustment portion 13, or such a region can be used for the other like purposes. Thus, the region can be effectively used.

In the laser processing head 10A, the condensing unit 14 is offset toward the second wall portion 22 in the X direction. With this configuration, when the housing 11 moves along a direction orthogonal to the optical axis of the condensing unit 14, for example, even if another configuration exists on the second wall portion 22 side, the condensing unit 14 can be brought near the other configuration.

In the laser processing head 10A, the entrance portion 12 is provided in the fifth wall portion 25 and is offset toward the second wall portion 22 in the X direction. With this configuration, another configuration (the measurement unit 16 and the monitoring unit 17 for example) can be arranged in a region, of a region in the housing 11, on the first wall portion 21 side with respect to the adjustment portion 13, or such a region can be used for the other like purposes. Thus, the region can be effectively used.

In the laser processing head 10A, the measurement unit 16 and the monitoring unit 17 are arranged in the region, of the region in the housing 11, on the first wall portion 21 side with respect to the adjustment portion 13. The circuit unit 19 is arranged in the region in the housing 11, on the third wall portion 23 side with respect to the adjustment portion 13. The dichroic mirror 15 is arranged between the adjustment portion 13 and the condensing unit 14 in the housing 11. With this configuration, the region inside the housing 11 can be effectively used. Furthermore, in the laser processing apparatus 1, processing can be performed based on a result of measuring the distance between the surface of the target 100 and the condensing unit 14. Furthermore, in the laser processing apparatus 1, processing can be performed based on a result of monitoring the surface of the target 100.

In the laser processing head 10A, the circuit unit 19 controls the driving unit 18 based on the signal output from the measurement unit 16. With this configuration, the position of the focusing point of the laser light L1 can be adjusted based on a result of measuring the distance between the surface of the target 100 and the condensing unit 14.

Furthermore, in the laser processing head 10A, the entrance portion 12 as well as the attenuator 31, the beam expander 32, and the mirror 33 of the adjustment portion 13 are arranged on the straight line A1 extending along the Z direction. Furthermore, the reflective spatial light modulator 34, the imaging optical system 35, and the condensing unit 14 of the adjustment portion 13 as well as the condensing unit 14 are arranged on the straight line A2 extending along the Z direction. With this configuration, the adjustment portion 13 including the attenuator 31, the beam expander 32, the reflective spatial light modulator 34, and the imaging optical system 35 can be compactly configured.

In the laser processing head 10A, the straight line A1 is positioned on the second wall portion 22 side with respect to the straight line A2. With this configuration, when other optical systems using the condensing unit 14 (the measurement unit 16 and the monitoring unit 17 for example) are configured in the region, of the region in the housing 11, on the first wall portion 21 side with respect to the adjustment portion 13, the degree of freedom in configuration of the other optical systems can be improved.

The above actions and effects are similarly provided by the laser processing head 10B.

In the laser processing apparatus 1, the condensing unit 14 of the laser processing head 10A is offset toward the laser processing head 10B in the housing 11 of the laser processing head 10A, and the condensing unit 14 of the laser processing head 10B is offset toward the laser processing head 10A in the housing 11 of the laser processing head 10B. With this configuration, when the pair of laser processing heads 10A and 10B move along the Y direction, the condensing unit 14 of the laser processing head 10A and the condensing unit 14 of the laser processing head 10B can be brought close to each other. Therefore, with the laser processing apparatus 1, the target 100 can be efficiently processed.

In the laser processing apparatus 1, the pair of attachment portions 65 and 66 respectively move along the Y direction and the Z direction. With this configuration, the target 100 can be processed more efficiently.

In the laser processing apparatus 1, the support portion 7 moves along each of the X direction and the Y direction, and rotates about the axis parallel to the Z direction. With this configuration, the target 100 can be processed more efficiently.

Modification Examples

Figure 6:
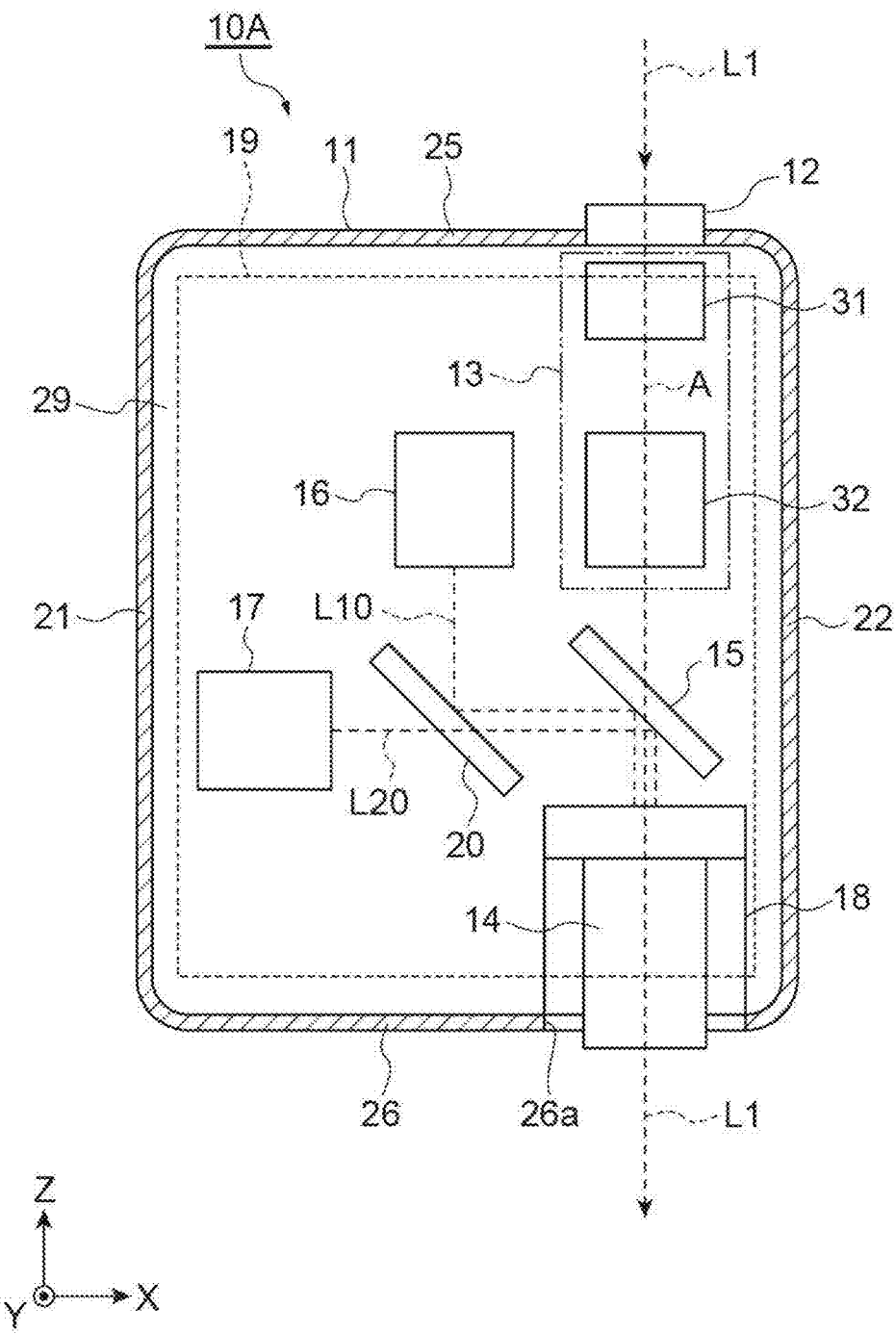
FIG. 6 is a diagram illustrating a configuration of an optical system of a laser processing head of a modification example.

For example, as illustrated in FIG. 6, the entrance portion 12, the adjustment portion 13, and the condensing unit 14 may be arranged on a straight line A extending along the Z direction. With this configuration, the adjustment portion 13 can be configured compactly. In this case, the adjustment portion 13 may not include the reflective spatial light modulator 34 and the imaging optical system 35. Further, the adjustment portion 13 may include the attenuator 31 and the beam expander 32. With this configuration, the adjustment portion 13 including the attenuator 31 and the beam expander 32 can be compactly configured. The order of arrangement of the attenuator 31 and the beam expander 32 may be reversed.

The housing 11 may have any configuration to be attached to the attachment portion 65 (or the attachment portion 66) with at least one of the first wall portion 21, the second wall portion 22, the third wall portion 23, and the fifth wall portion 25 arranged on the attachment portion 65 (or the attachment portion 66) side of the laser processing apparatus 1. The condensing unit 14 may have any configuration as long as it is at least offset toward the fourth wall portion 24 in the Y direction. With such configurations, when the housing 11 moves along the Y direction, for example, even if another configuration exists on the fourth wall portion 24 side, the condensing unit 14 can be brought near the other configuration. When the housing 11 moves along the Z direction, the condensing unit 14 can be brought close to the target 100, for example.

The condensing unit 14 may be offset toward the first wall portion 21 in the X direction. With this configuration, when the housing 11 moves along a direction orthogonal to the optical axis of the condensing unit 14, even if another configuration exists on the first wall portion 21 side, for example, the condensing unit 14 can be brought near the other configuration. In this case, the entrance portion 12 may be offset toward the first wall portion 21 in the X direction. With this configuration, another configuration (the measurement unit 16 and the monitoring unit 17 for example) can be arranged in a region, of a region in the housing 11, on the second wall portion 22 side with respect to the adjustment portion 13, or such a region can be used for the other like purposes. Thus, the region can be effectively used.

Figure 7:
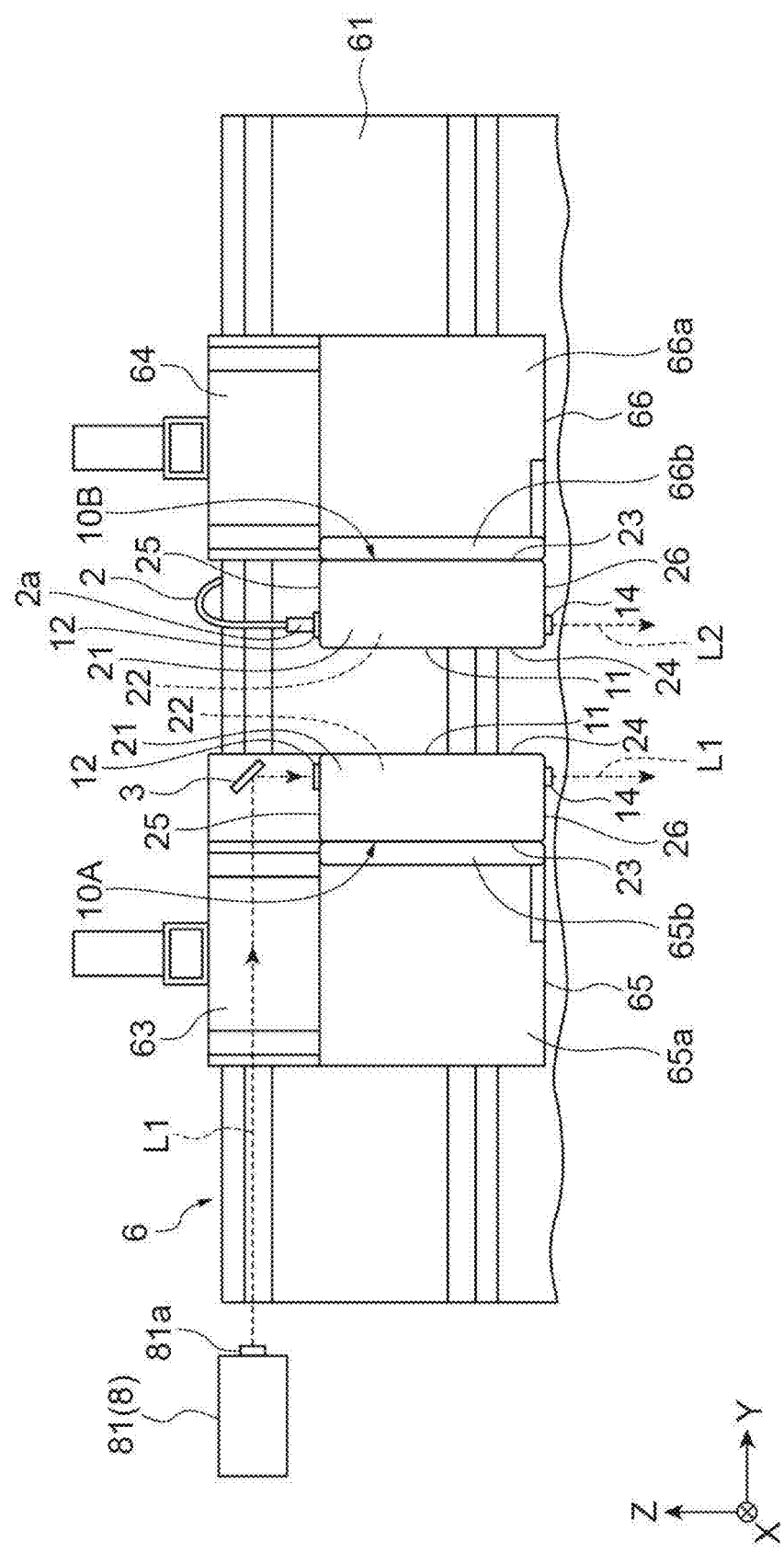
FIG. 7 is a front view of a portion of the laser processing apparatus of the modification example.

Further, at least one of the guiding of the laser light L1 from the emission portion 81a of the light source unit 8 to the entrance portion 12 of the laser processing head 10A and guiding of the laser light L2 from the emission portion 82a of the light source unit 8 to the entrance portion 12 of the laser processing head 10B may be implemented by a mirror. FIG. 7 is a front view of a portion of the laser processing apparatus 1 in which the laser light L1 is guided by a mirror. In the configuration illustrated in FIG. 7, a mirror 3 that reflects the laser light L1 is attached to the moving portion 63 of the movement mechanism 6, to face the emission portion 81a of the light source unit 8 in the Y direction and face the entrance portion 12 of the laser processing head 10A in the Z direction.

With the configuration illustrated in FIG. 7, the state where the mirror 3 faces the emission portion 81a of the light source unit 8 in the Y direction is maintained, even when the moving portion 63 of the movement mechanism 6 moves along the Y direction. Furthermore, the state where the mirror 3 faces the entrance portion 12 of the laser processing head 10A in the Z direction is maintained, even when the attachment portion 65 of the movement mechanism 6 moves along the Z direction. Thus, the laser light L1 emitted from the emission portion 81a of the light source unit 8 can reliably enter the entrance portion 12 of the laser processing head 10A, regardless of the position of the laser processing head 10A. Furthermore, a light source such as a high output ultrashort pulse laser, guiding for which using the optical fiber 2 is otherwise difficult, can be used.

Furthermore, with the configuration illustrated in FIG. 7, the mirror 3 may be attached to the moving portion 63 of the movement mechanism 6 to have at least one of angle and position adjustable. With this configuration, the laser light L1 emitted from the emission portion 81a of the light source unit 8 can reliably enter the entrance portion 12 of the laser processing head 10A.

Furthermore, the light source unit 8 may include a single light source. In this case, the light source unit 8 may be configured to emit a part of a laser light, output from one light source, from the emission portion 81a and emit the remaining part of the laser light from an emission portion 82b.

Furthermore, the laser processing apparatus 1 may include one laser processing head 10A. Also in the laser processing apparatus 1 including one laser processing head 10A, when the housing 11 moves along the Y direction orthogonal to the optical axis of the condensing unit 14, even if another configuration exists on the fourth wall portion 24 side, for example, the condensing unit 14 can be brought near the other configuration. Thus, also with the laser processing apparatus 1 including one laser processing head 10A, the target 100 can be efficiently processed. Furthermore, in the laser processing apparatus 1 including one laser processing head 10A, when the attachment portion 65 moves along the Z direction, the target 100 can be processed more efficiently. Furthermore, in the laser processing apparatus 1 provided with one laser processing head 10A, when the support portion 7 moves along the X direction and rotates about the axis parallel to the Z direction, the target 100 can be processed more efficiently.

Figure 8:
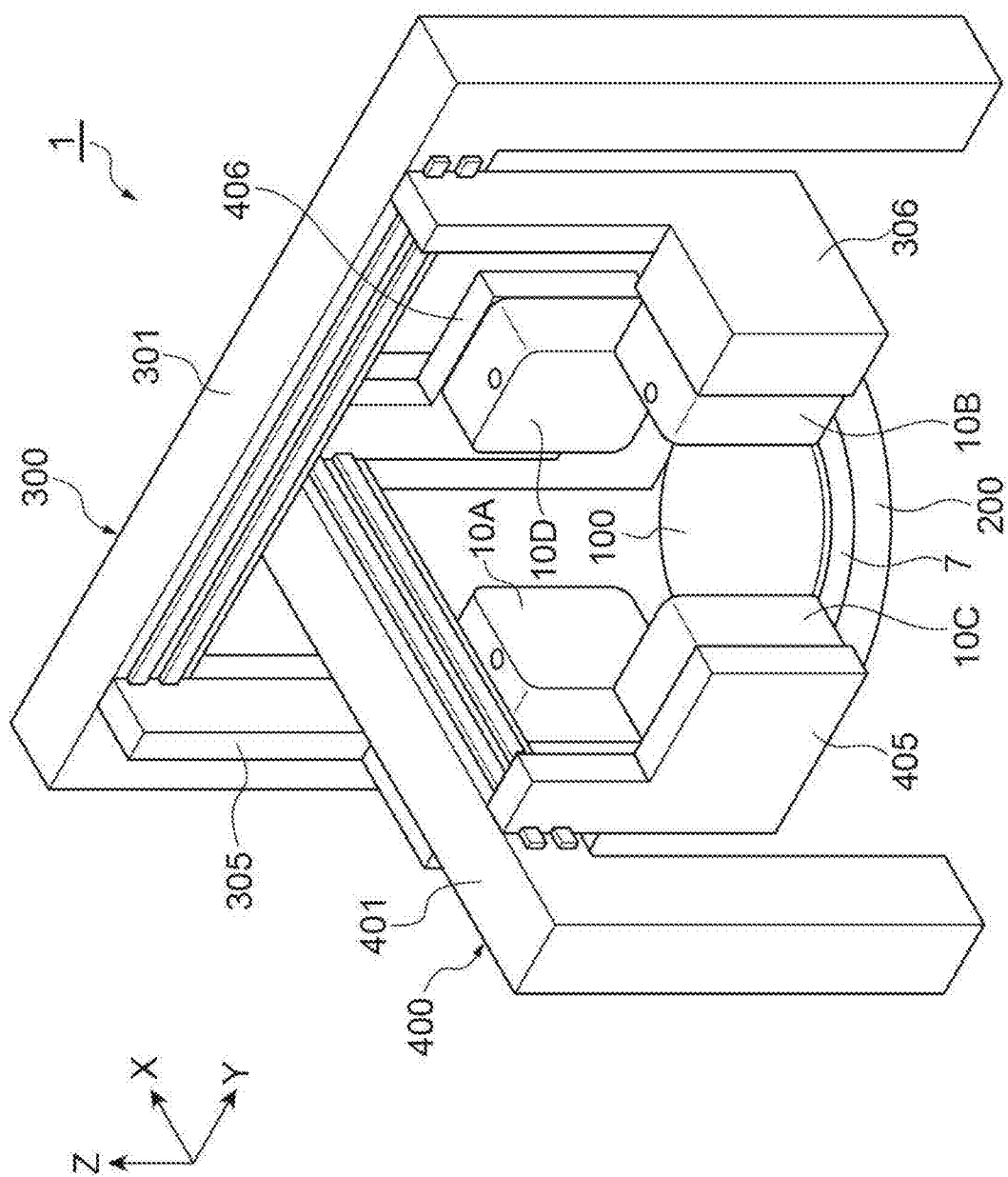
FIG. 8 is a perspective view of the laser processing apparatus of the modification example.

The laser processing apparatus 1 may include three or more laser processing heads. FIG. 8 is a perspective view of a laser processing apparatus 1 including two pairs of laser processing heads. The laser processing apparatus 1 illustrated in FIG. 8 includes a plurality of movement mechanisms 200, 300, and 400, the support portion 7, the pair of laser processing heads 10A and 10B, a pair of laser processing heads 10C and 10D, and a light source unit (not illustrated).

The movement mechanism 200 moves the support portion 7 along the each of the X direction, the Y direction, and the Z direction, and rotates the support portion 7 about an axis parallel to the Z direction.

The movement mechanism 300 includes a fixed portion 301 and a pair of attachment portions (a first attachment portion and a second attachment portion) 305 and 306. The fixed portion 301 is attached to a device frame (not illustrated). The pair of attachment portions 305 and 306 are each attached to a rail provided on the fixed portion 301, and can move in the Y direction independently from each other.

The movement mechanism 400 includes a fixed portion 401 and a pair of attachment portions (a first attachment portion and a second attachment portion) 405 and 406. The fixed portion 401 is attached to a device frame (not illustrated). The pair of attachment portions 405 and 406 are each attached to a rail provided on the fixed portion 401, and can move in the X direction independently from each other. The rail of the fixed portion 401 is arranged to three-dimensionally intersect with the rail of the fixed portion 301.

The laser processing head 10A is attached to the attachment portion 305 of the movement mechanism 300. The laser processing head 10A irradiates the target 100, supported by the support portion 7, with a laser light, while facing the support portion 7 in the Z direction. The laser light emitted from the laser processing head 10A is guided by the optical fiber 2 from the light source unit (not illustrated). The laser processing head 10B is attached to the attachment portion 306 of the movement mechanism 300. The laser processing head 10B irradiates the target 100, supported by the support portion 7, with a laser light, while facing the support portion 7 in the Z direction. The laser light emitted from the laser processing head 10B is guided by the optical fiber 2 from the light source unit (not illustrated).

The laser processing head 10C is attached to the attachment portion 405 of the movement mechanism 400. The laser processing head 10C irradiates the target 100, supported by the support portion 7, with a laser light, while facing the support portion 7 in the Z direction. The laser light emitted from the laser processing head 10C is guided by the optical fiber 2 from the light source unit (not illustrated). The laser processing head 10D is attached to the attachment portion 406 of the movement mechanism 400. The laser processing head 10D irradiates the target 100, supported by the support portion 7, with a laser light, while facing the support portion 7 in the Z direction. The laser light emitted from the laser processing head 10D is guided by the optical fiber 2 from the light source unit (not illustrated).

The configuration of the pair of laser processing heads 10A and 10B in the laser processing apparatus 1 illustrated in FIG. 8 is the same as the configuration of the pair of laser processing heads 10A and 10B in the laser processing apparatus 1 illustrated in FIG. 1. The configuration of the pair of laser processing heads 10C and 10D in the laser processing apparatus 1 illustrated in FIG. 8 is the same as the configuration of the pair of laser processing heads 10A and 10B, in the laser processing apparatus 1 illustrated in FIG. 1, rotated by 90° about an axis parallel to the Z direction.

For example, the housing (first housing) 11 of the laser processing head 10C is attached to the attachment portion 65 with the fourth wall portion 24 positioned on the laser processing head 10D side with respect to the third wall portion 23, and with the sixth wall portion 26 positioned on the support portion 7 side with respect to the fifth wall portion 25. The condensing unit 14 of the laser processing head 10C is offset toward the fourth wall portion 24 (that is, toward the laser processing head 10D) in the Y direction.

The housing (second housing) 11 of the laser processing head 10D is attached to the attachment portion 66 with the fourth wall portion 24 positioned on the laser processing head 10C side with respect to the third wall portion 23, and with the sixth wall portion 26 positioned on the support portion 7 side with respect to the fifth wall portion 25. The condensing unit 14 of the laser processing head 10D is offset toward the fourth wall portion 24 (that is, toward the laser processing head 10C) in the Y direction.

With the above configuration, in the laser processing apparatus 1 illustrated in FIG. 8, when the pair of laser processing heads 10A and 10B each move along the Y direction, the condensing unit 14 of the laser processing head 10A and the condensing unit 14 of the laser processing head 10B can be brought close to each other. Furthermore, when the pair of laser processing heads 10C and 10D each move along the X direction, the condensing unit 14 of the laser processing head 10C and the condensing unit 14 of the laser processing head 10D can be brought close to each other.

The laser processing head and the laser processing apparatus are not limited to those for forming the modified region in the target 100, and thus may be those for implementing other types of laser processing.

Next, each embodiment will be described. Hereinafter, the description already given for the above-described embodiment will not be redundantly given.

First Embodiment

Figure 9:
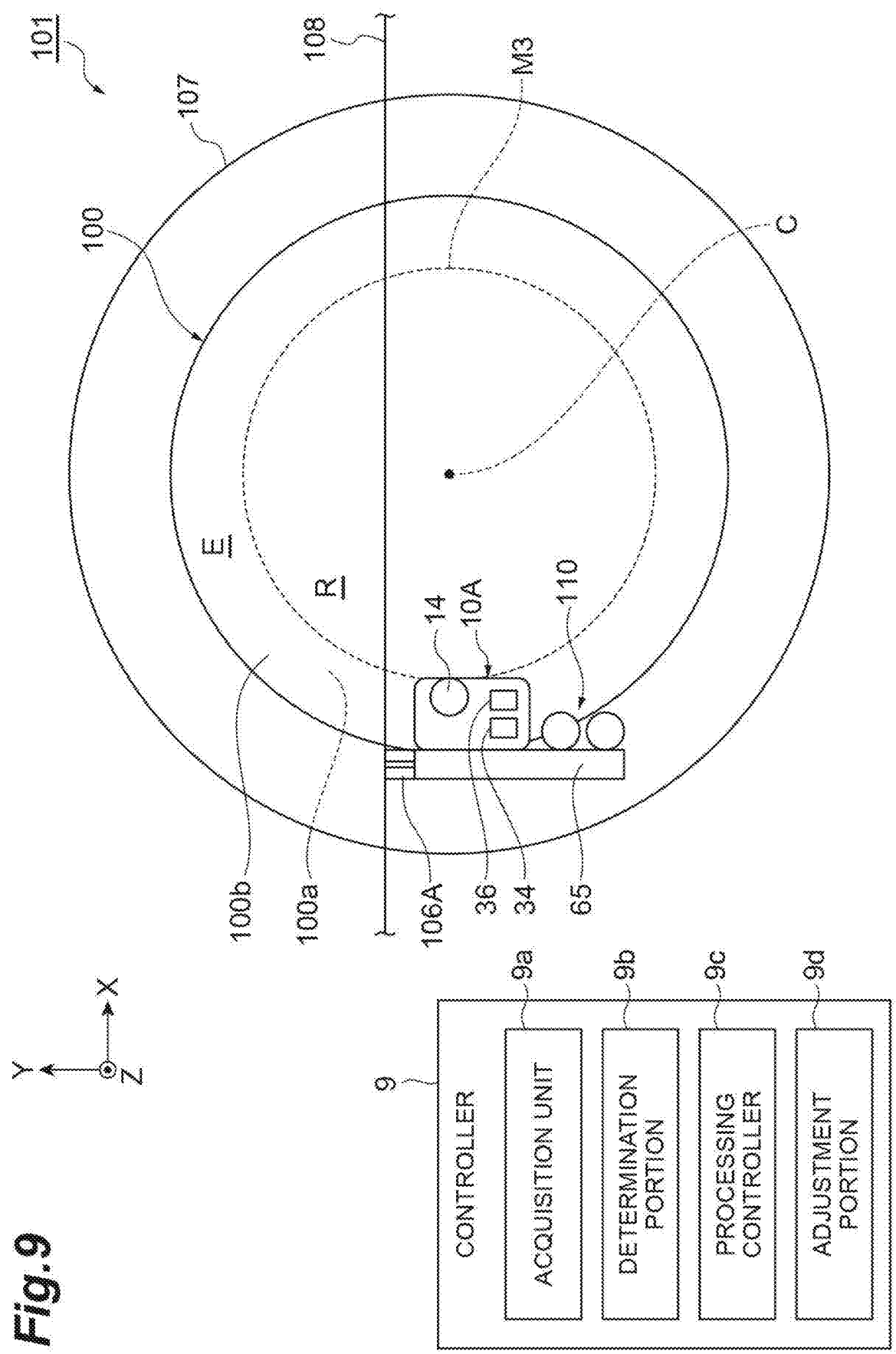
FIG. 9 is a plan view of a schematic configuration of a laser processing apparatus according to a first embodiment.

A laser processing apparatus 101, a laser processing apparatus 1 according to a first embodiment illustrated in FIG. 9 forms a modified region in the target 100 by irradiating the target 100 with a first laser light L1, with a focusing point (at least a part of the focusing region) set in the target 100. The laser processing apparatus 101 performs trimming processing on the target 100 to obtain (manufacture) a semiconductor device. The laser processing apparatus 101 forms a modified region along a line M3 extending annularly on the inner side of the outer edge of the target 100. The laser processing apparatus 101 includes a stage 107, first laser processing head 10A, first Z-axis rails 106A, an X-axis rail 108, an alignment camera 110, and a controller 9.

The trimming processing is processing for removing an unnecessary portion of the target 100. The trimming processing includes a laser processing method in which a modified region 4 is formed in the target 100, by emitting the first laser light L1 with the focusing point (at least a part of the focusing region) set in the target 100. The target 100 includes, for example, a semiconductor wafer formed in a disk-shape. The target is not particularly limited, and may be formed of various materials and may have various shapes. A functional element (not illustrated) is formed on a front surface 100a of the target 100. Examples of the functional element include, a light receiving element such as a photodiode, a light emitting element such as a laser diode, a circuit element such as a memory, and the like. In the following description, the X direction corresponds to the Y direction of the above laser processing apparatus 1 (see FIG. 1) and the Y direction corresponds to the X direction of the above laser processing apparatus 1 (see FIG. 1).

Figure 10:
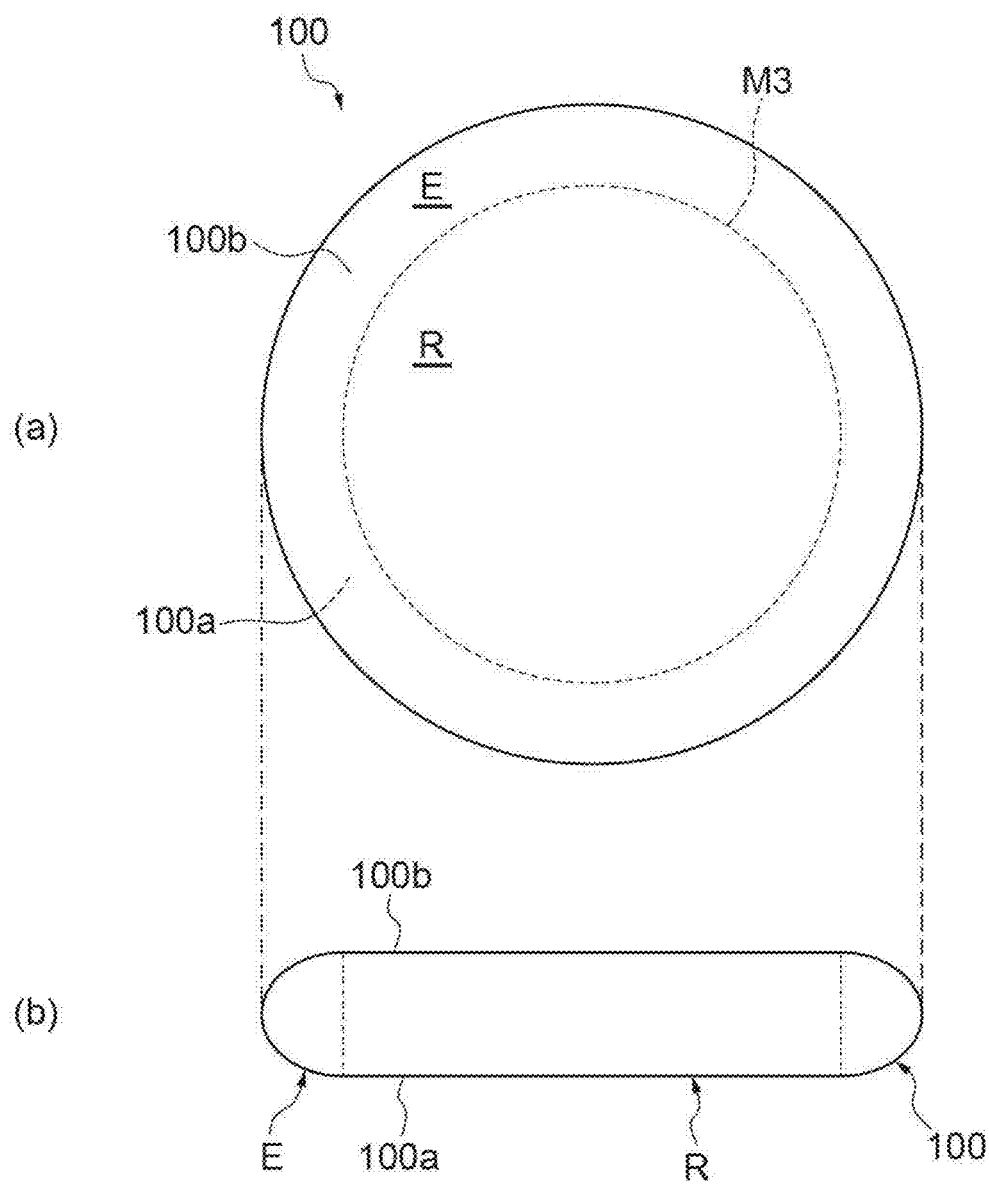
FIG. 10(a) is a plan view of an example of a target.
FIG. 10(b) is a side view of the target illustrated in FIG. 10(a).

As illustrated in FIGS. 10(a) and 10(b), an effective region R and a removal region E are set in the target 100. The effective region R is the part corresponding to the semiconductor device to be obtained. This effective region R is a disk-shaped portion including a center portion in the target 100 as viewed in a thickness direction. The removal region E is a region outside the effective region R in the target 100. The removal region E is an outer edge portion in the target 100 other than the effective region R. This removal region E is an annular portion surrounding the effective region R. The removal region E includes a circumferential edge portion (bevel portion of the outer edge) in the target 100 as viewed in the thickness direction. The effective region R and the removal region E can be set by the controller 9. The effective region R and the removal region E may be designated by coordinates.

The stage 107 is a support portion on which the target 100 is placed. The stage 107 has the same configuration as the above support portion 7 (see FIG. 1). The target 100 is placed on the stage 107 of the present embodiment, with the back surface 100b of the target 100 facing upward, that is, the laser light incident surface side (with the front surface 100a facing down toward the stage 107). The stage 107 has a rotation axis C provided at the center thereof. The rotation axis C is an axis extending along the Z direction. The stage 107 can rotate about the rotation axis C. The stage 107 is drivingly rotated by driving force of a known driving device such as a motor.

The first laser processing head 10A irradiates the target 100 placed on the stage 107 with the first laser light L1 along the Z direction to form a modified region in the target 100. The first laser processing head 10A is attached to the first Z-axis rail 106A and the X-axis rail 108. The first laser processing head 10A can be moved linearly in the Z direction along the first Z-axis rail 106A, by driving force of a known driving device such as a motor. The first laser processing head 10A can be moved linearly in the X direction along the X-axis rail 108, by driving force of a known driving device such as a motor. The first laser processing head 10A serves as an irradiation portion.

The first laser processing head 10A includes the reflective spatial light modulator 34 as described above. The reflective spatial light modulator 34 serves as a shaping portion that performs shaping for a shape (hereinafter, referred to as a "beam shape") of a focusing point on a plane orthogonal to the optical axis of the first laser light L1. The reflective spatial light modulator 34 shapes the first laser light L1, to obtain a beam shape having a longitudinal direction. For example, the reflective spatial light modulator 34 performs shaping to obtain an elliptical beam shape, with a modulation pattern for forming the elliptical beam shape displayed on a liquid crystal layer.

The beam shape is not limited to the elliptical shape, and may be any elongated shape. The beam shape may be a flat circular shape, an oval shape, or a track shape. The beam shape may be an elongated triangular, rectangular, or polygonal shape. The modulation pattern of the reflective spatial light modulator 34 for obtaining such a beam shape may include at least one of a slit pattern and a non-point pattern. When there are a plurality of focusing points of the first laser light L1 due to astigmatism or the like, the beam shape of the present embodiment is the shape of one of the plurality of focusing points on the most upstream side in the optical path of the first laser light L1. The longitudinal direction herein is a direction of the major axis of the elliptical shape of the beam shape and is also referred to as an ellipse major axis direction.

The beam shape is not limited to the shape of the focusing point, and may be a shape in the vicinity of the focusing point, and thus may be a shape of any one part of the focusing region (region of focus). For example, a beam shape 71 of the first laser light L1 having astigmatism has a longitudinal direction NH in a region on the laser light incident surface side and in the vicinity of the focusing point, as illustrated in FIG. 71(a). In a beam intensity distribution within a plane of the beam shape 71 in FIG. 71(a) (within a plane that is at a Z direction position on the laser light incident surface side and is in the vicinity of the focusing point), the intensity is high in the longitudinal direction NH, meaning that a direction with a high beam intensity matches the longitudinal direction NH.

For example, the beam shape 71 of the first laser light L1 having astigmatism has a longitudinal direction NH0 orthogonal to the longitudinal direction NH (see FIG. 71(a)) on the laser light incident surface side, in a region on the opposite surface side of the laser light incident surface, in the vicinity of the focusing point as illustrated in FIG. 71(c). In a beam intensity distribution within a plane of the beam shape 71 in FIG. 71(c) (within a plane that is at a Z direction position on the opposite surface side of the laser light incident surface and is in the vicinity of the focusing point), the intensity is high in the longitudinal direction NH0, meaning that a direction with a high beam intensity matches the longitudinal direction NH0. The beam shape 71 of the first laser light L1 having astigmatism has no longitudinal direction and has a circular shape in a region that is between the laser light incident surface side and the opposite surface side thereof and is in the vicinity of the focusing point, as illustrated in FIG. 71(b).

In a case of such a first laser light L1 having astigmatism, a part of the focusing region which is the subject of the present embodiment incudes a region that is on the laser light incident surface side and is in the vicinity of the focusing point, and the beam shape that is the subject of the present embodiment is the beam shape 71 illustrated in FIG. 71(a).

By adjusting the modulation pattern of the reflective spatial light modulator 34, the position of the beam shape 71 illustrated in FIG. 71(a) in the focusing region can be controlled as desired. For example, control can be performed in such a manner that the beam shape 71 illustrated in FIG. 71(a) is provided in a region that is on the opposite surface side of the laser light incident surface and in the vicinity of the focusing point. Further, for example, control can be performed in such a manner that the beam shape 71 illustrated in FIG. 71(a) is provided in a region that is between the laser light incident surface side and the opposite surface side thereof and in the vicinity of the focusing point. The position of the part of the focusing region is not particularly limited, and may be any position between the laser light incident surface of the target 100 and the opposite surface side thereof.

Furthermore, for example, when a slit or elliptical optical system obtained by control on the modulation pattern and/or a mechanical mechanism is used, as illustrated FIG. 72(a), in the region that is on the laser light incident surface side and in the vicinity of the focusing point, the beam shape 71 includes the longitudinal direction NH. In a beam intensity distribution within a plane (plane at a Z direction position that is on the laser light incident surface side and in the vicinity of the focusing point) of the beam shape 71 in FIG. 72(a), the intensity is high in the longitudinal direction NH, meaning that the direction in which the beam intensity is high matches the longitudinal direction NH.

When the slit or elliptical optical system is used, as illustrated FIG. 72(c), in the region that is on the opposite surface side of the laser light incident surface and in the vicinity of the focusing point, the beam shape 71 includes the longitudinal direction NH that is the same as the longitudinal direction NH (FIG. 71(a)) of the region on the laser light incident surface side. In the beam intensity distribution in the plane of the beam shape 71 in FIG. 72(c) (in the plane at the Z direction position that is on the opposite surface side of the laser light incident surface and in the vicinity of the focusing point), the intensity is high in the longitudinal direction NH, meaning that the direction in which the beam intensity is high matches the longitudinal direction NH. When the slit or elliptical optical system is used, as illustrated FIG. 72(b), at the focusing point, the beam shape 71 includes the longitudinal direction NH0 that is orthogonal to the longitudinal direction NH (FIG. 72(a)) of the region on the laser light incident surface side. In a beam intensity distribution within a plane (plane at a Z direction position of the focusing point) of the beam shape 71 in FIG. 72(b), the intensity is high in the longitudinal direction NH0, meaning that the direction in which the beam intensity is high matches the longitudinal direction NH0.

When such a slit or elliptical optical system is used, the beam shape 71 excluding the focusing point has a shape with a longitudinal direction. The beam shape 71 excluding the focusing point is the beam shape that is the subject of the present embodiment. Specifically, a part of the focusing region which is the subject of the present embodiment incudes a region that is on the laser light incident surface side and is in the vicinity of the focusing point. The beam shape that is the subject of the present embodiment is the beam shape 71 as illustrated in FIG. 72(a).

The first laser processing head 10A includes a ranging sensor 36. The ranging sensor 36 emits a distance measurement laser light to the laser light incident surface of the target 100, and detects the distance measurement light reflected by the laser light incident surface to detect displacement data on the laser light incident surface of the target 100. When the ranging sensor 36 is a sensor having an axis different from that of the first laser light L1, a sensor employing as a triangular distance measuring method, a laser confocal method, a white confocal method, a spectral interference method, an astigmatism method or the like may be used. When the ranging sensor 36 is a sensor coaxial with the first laser light L1, a sensor employing an astigmatism method or the like can be used. The circuit unit 19 (see FIG. 3) of the first laser processing head 10A is driven by the driving unit 18 (see FIG. 5) to make the condensing unit 14 follow the laser light incident surface, based on the displacement data acquired by the ranging sensor 36.

With this configuration, the condensing unit 14 moves along the Z direction based on the displacement data so that a constant distance between the laser light incident surface of the target 100 and a first focusing point, which is the focusing point of the first laser light L1, is maintained. Such a ranging sensor 36 and the control therefor similarly applies to other laser processing heads (hereinafter, also referred to as "following control").

The first Z-axis rail 106A is a rail extending along the Z direction. The first Z-axis rail 106A is attached to the first laser processing head 10A via the attachment portion 65. The first laser processing head 10A moves on the first Z-axis rail 106A along the Z direction so that the first focusing point of the first laser light L1 moves along the Z direction. The first Z-axis rail 106A corresponds to the rail of the above movement mechanism 6 (see FIG. 1) or the above movement mechanism 300 (see FIG. 8). The first Z-axis rail 106A serves as a vertical movement mechanism.

The X-axis rail 108 is a rail extending along the X direction. The X-axis rail 108 is attached to each of the first and the second Z-axis rails 106A and 106B. The first laser processing head 10A moves on the X-axis rail 108 along the X direction so that the first focusing point of the first laser light L1 moves along the X direction. The first laser processing head 10A moves on the X-axis rail 108 to make the first focusing point pass through or near the rotation axis C. The X-axis rail 108 corresponds to the rail of the above movement mechanism 6 (see FIG. 1) or the above movement mechanism 300 (see FIG. 8). The X-axis rail 108 serves as a horizontal movement mechanism.

The alignment camera 110 is a camera that captures images used for various adjustments. The alignment camera 110 captures an image of the target 100. The alignment camera 110 is attached to the attachment portion 65 to which the first laser processing head 10A is attached, and operates in synchronization with the first laser processing head 10A.

The controller 9 is configured as a computer device including a processor, a memory, a storage, a communication device, and the like. In the controller 9, software (program) loaded onto the memory or the like is performed by the processor, and reading and writing of data from and to the memory and storage, and communication by the communication device are controlled by the processor. Thus, the controller 9 implements various functions.

The controller 9 controls the stage 107 and the first laser processing head 10A. The controller 9 controls the rotation of the stage 107, the emission of the first laser light L1 from the first laser processing head 10A, the beam shape, and the movement of the first focusing point. The controller 9 can perform various controls based on rotation information (hereinafter, also referred to as "θ information") on the rotation amount of the stage 107. The θ information may be acquired from a driving amount of the driving device for rotating the stage 107, or may be acquired by a separate sensor or the like. The θ information can be obtained by various known methods. The θ information here includes the rotation angle based on a state where the target 100 is positioned at a 0° direction position.

The controller 9 controls starting and stopping of the emission of the first laser light L1 from the first laser processing head 10A based on the θ information in a state where the first focusing point is positioned at a position along the line M3 (a circumferential edge of the effective region R) in the target 100, while rotating the stage 107, to perform a circumferential edge process for forming the modified region along the circumferential edge of the effective region R.

The controller 9 performs a removal process of forming the modified region in the removal region E, by irradiating the removal region E with the first laser light L1 without rotating the stage 107, while moving the first focusing point of the first laser light L1.

The controller 9 controls at least one of the rotation of the stage 107, the emission of the first laser light L1 from the first laser processing head 10A, and movement of the first focusing point, to achieve a constant pitch between a plurality of modified spots included in the modified regions (interval of the modified spots adjacent to each other in the processing proceeding direction).

The controller 9 acquires a reference position (0° direction position) of the target 100 in the rotation direction and the diameter of the target 100 from the image captured by the alignment camera 110. The controller 9 controls the first laser processing head 10A, so that the first laser processing head 10A can move along the X-axis rail 108 to a position on the rotation axis C of the stage 107.

Next, an example of a method of obtaining (manufacturing) a semiconductor device by performing the trimming processing on the target 100 using the laser processing apparatus 101 will be described below.

First of all, the target 100 is placed on the stage 107 with the back surface 100b facing the laser light incident surface side. The front surface 100a side of the target 100 on which the functional element is mounted is protected with a support substrate or a tape material adhered thereon.

Figure 11:
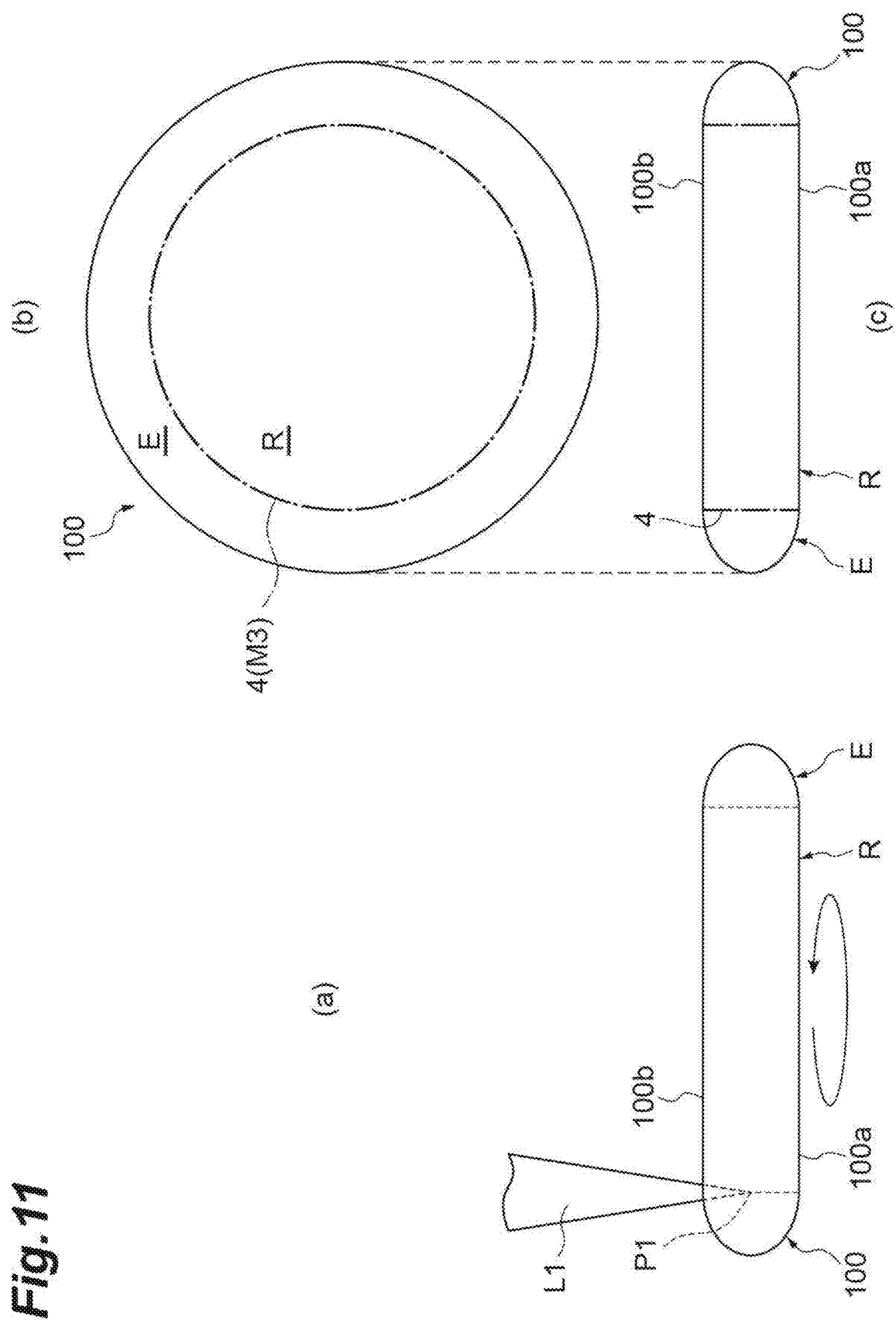
FIG. 11(a) is a side view of a target illustrating trimming processing according to a first embodiment.
FIG. 11(b) is a plan view of the target continuing from FIG. 11(a).
FIG. 11(c) is a side view of the target illustrated in FIG. 11(b).

Then, the trimming processing is implemented. In the trimming processing, the controller 9 performs the circumferential edge process. Specifically, as illustrated in FIG. 11(a), starting and stopping of the emission of the first laser light L1 in the first laser processing head 10A is controlled based on the θ information in a state where the first focusing point P1 is positioned at a position along the circumferential edge of the effective region R) in the target 100, while rotating the stage 107 at a constant rotation speed. As a result, the modified region 4 is formed along the line M3 (the circumferential edge of the effective region R), as illustrated in FIGS. 11(b) and 11(c). The modified region 4 formed includes the modified spots and cracks extending from the modified spots.

Figure 12:
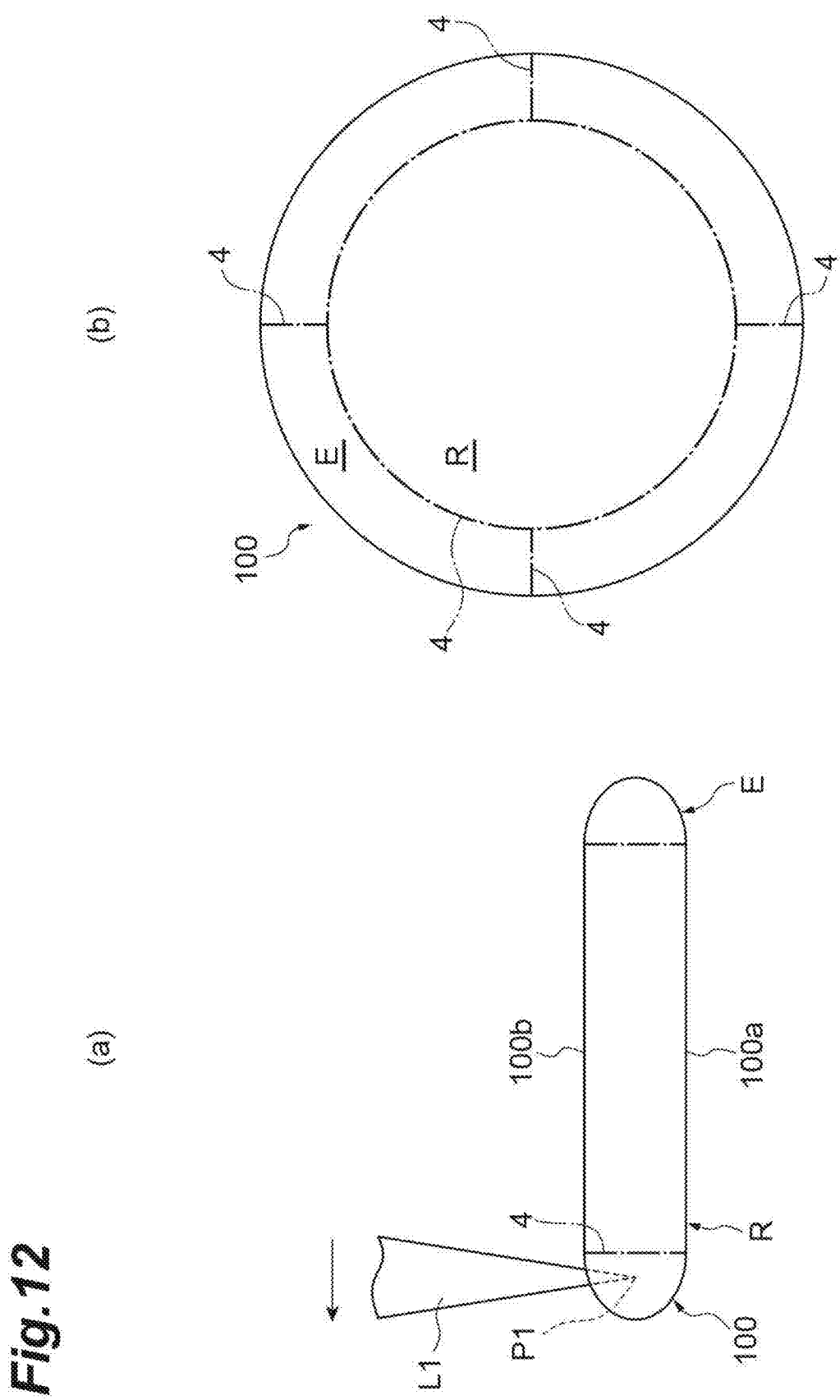
FIG. 12(a) is a side view of the target continuing from FIG. 11(b).
FIG. 12(b) is a plan view of the target continuing from FIG. 12(a).

In the trimming processing, the controller 9 performs the removal process. Specifically, as illustrated in FIG. 12(a), the removal region E is irradiated with the first laser light L1 without rotating the stage 107. In this process, the first laser processing head 10A move in directions away from each other along the X-axis rail 108, and the first focusing point P1 of the first laser light L1 move in a direction away from the center of the target 100. The removal region E is irradiated with the first laser light L1 after rotating the stage 107 by 90°. In this process, the first laser processing head 10A move in directions away from each other along the X-axis rail 108, and the first focusing point P1 of the first laser light L1 move in a direction away from the center of the target 100.

As a result, as illustrated in FIG. 12(b), the modified region 4 is formed along the lines extending to divide the removal region E into four equal parts as viewed in the Z direction. The modified region 4 formed includes the modified spots and cracks extending from the modified spots. The crack may or may not reach at least one of the front surface 100a and the back surface 100b. Then, as illustrated in FIGS. 13(a) and 13(b), the removal region E is removed with the modified region 4 serving as a boundary, for example, using a jig or air.

Next, as illustrated in FIG. 13(c), a peeled surface 100h of the target 100 is finished by grinding or polishing with an abrasive KM such as a grindstone. When the target 100 is peeled by etching, the polishing can be simplified. As a result of the above, a semiconductor device 100K is obtained.

Next, the trimming processing of the present embodiment will be described more in detail.

Figure 14:
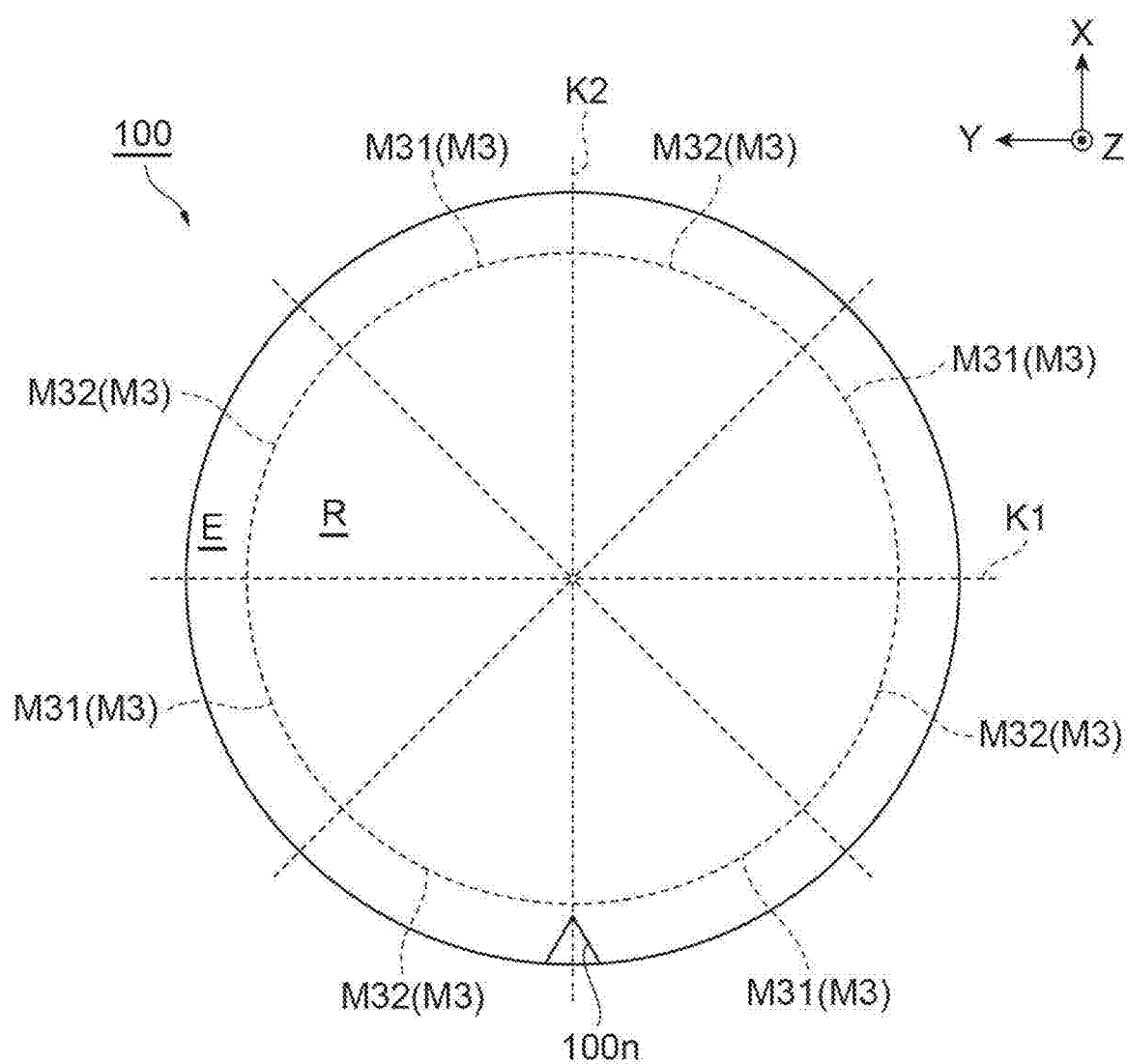
FIG. 14 is a plan view of a target which is a subject of trimming processing according to the first embodiment.

As illustrated in FIG. 14, the target 100 has a plate shape and includes a front surface 100a and a back surface 100b (see FIG. 10) as principal planes. The target 100 is a wafer with a (100) plane serving as the principal plane. The target 100 is a silicon wafer formed of silicon. The target 100 has a first crystal orientation K1 orthogonal to one (110) plane and a second crystal orientation K2 orthogonal to another (110) plane. The (110) plane is a cleavage plane. The first crystal orientation K1 and the second crystal orientation K2 are in a cleavage direction, that is, a direction in which cracks are most likely to extend in the target 100. The first crystal orientation K1 and the second crystal orientation K2 are orthogonal to each other.

The target 100 is provided with an alignment target 100n. For example, the alignment target 100n has a certain relationship in a θ direction (rotation direction of the stage 107 about the rotation axis C) with respect to the 0° direction position of the target 100. The 0° direction position is the reference position of the target 100 in the θ direction. For example, the alignment target 100n is a notch formed in the outer edge portion. The alignment target 100n is not particularly limited, and may be an orientation flat of the target 100 or a pattern of the functional element. In the illustrated example, the alignment target 100n is provided at a 0° position of the target 100. In other words, the alignment target 100n is provided at a position of the target 100 on the diameter extending in the direction of the second crystal orientation K2.

A line M3 is set in the target 100 as a scheduled trimming line. The line M3 is a line along which the modified region 4 is scheduled to be formed. The line M3 extends annularly on the inner side of the outer edge of target 100. The line M3 herein extends in an annular shape. The line M3 is set on the boundary between the effective region R and the removal region E of the target 100. The line M3 can be set by the controller 9. The line M3 is a virtual line, but it may be a line actually drawn. The line M3 may be designated by coordinates.

As illustrated in FIG. 9, the controller 9 of the laser processing apparatus 101 includes an acquisition unit 9a, a determination portion 9b, a processing controller 9c, and an adjustment portion 9d. The acquisition unit 9a acquires target information on the target 100. For example, the target information includes a crystal orientation on the target 100 (the first crystal orientation K1 and the second crystal orientation K2) and alignment information on the 0° direction position of the target 100 and the diameter of the target 100. The acquisition unit 9a can acquire the target information based on the image captured by the alignment camera 110 and an input through a user operation, communications from the outside, or the like.

The acquisition unit 9a acquires line information on the line M3. The line information includes information on the line M3 and information on the movement direction (also referred to as "processing proceeding direction") of the movement when the first focusing point P1 is relatively moved along the line M3. For example, the processing proceeding direction is a tangential direction of the line M3, passing through the first focusing point P1 positioned on the line M3. The acquisition unit 9a can acquire line information based on input such as a user operation, communications from the outside, or the like.

Based on the target information and the line information acquired by the acquisition unit 9a, the determination portion 9b determines the orientation of the longitudinal direction when relatively moving the first focusing point P1 along the line M3, with the longitudinal direction of the beam shape intersecting with the processing proceeding direction. Specifically, the determination portion 9b determines the orientation of the longitudinal direction NH to be a first orientation and a second orientation based on the target information and the line information. The first orientation is the orientation of the longitudinal direction of the beam shape when relatively moving the first focusing point P1 along a first region M31 of the line M3. The second orientation is the orientation of the longitudinal direction of the beam shape when relatively moving the first focusing point P1 along a second region M32 of the line M3.

Hereinafter, the "orientation of the longitudinal direction of the beam shape" is also simply referred to as an "orientation of the beam shape"

The first region M31 includes a part between the 0° point and before the 45° point, a part between the 90° point and before the 135° point, a part between the 180° point and before the 225° point, and a part between the 270° point and before the 315° point, where the 0° point is one point where the line M3 orthogonally intersects with the second crystal orientation K2 of the target 100. The second region M32 includes a part between the 45° point and before the 90° point, a part between the 135° point and before the 180° point, a part between the 225° point and before the 270° point, and a part between the 315° point and before the 360° point, where the 0° point is one point where the line M3 orthogonally intersects with the second crystal orientation K2 of the target 100. Such a definition of the angles at the points on the line M3 similarly applies to the following description.

The first region M31 includes a region where the processing angle described later is 0° or more and less than 45° or −90° or more and less than −45° when the first focusing point P1 is relatively moved along the line M3. The second region M32 includes a region where the processing angle described later is 45° or more and less than 90° or −45° or more and less than −0° when the first focusing point P1 is relatively moved along the line M3. The first region M31 and the second region M32 of the line M3 each correspond to a first portion in a fourth embodiment described later.

As illustrated in FIG. 15(b), a processing angle α is the angle of a processing proceeding direction BD with respect to the first crystal orientation K1. The processing angle α includes a positive (+) angle in a counterclockwise direction, and a negative (−) angle in a clockwise direction as viewed from the back surface 100b, which is the laser light incident surface. The processing angle α can be acquired based on the θ information on the stage 107, the target information, and the line information. A case where the first focusing point P1 relatively moves along the first region M31 can be regarded as a case where the processing angle α is 0° or more and less than 45° or −90° or more and less than −45°. A case where the first focusing point P1 relatively moves along the second region M32 can be regarded as a case where the processing angle α is 45° or more and less than 90° or −45° or more and less than 0°.

The first orientation and the second orientation are directions inclined with respect to the processing proceeding direction BD, toward one of the first crystal orientation K1 and the second crystal orientation K2 forming a larger angle with the processing proceeding direction BD (farther one).

When the processing angle α is 0° or more and less than 90°, the first orientation and the second orientation are as follows. The first orientation is an orientation of a direction with which the longitudinal direction NH is inclined with respect to the processing proceeding direction BD toward the second crystal orientation K2. The second orientation is an orientation of a direction with which the longitudinal direction NH is inclined with respect to the processing proceeding direction BD toward the first crystal orientation K1. The first orientation is an orientation of a direction inclined by 10° to 35° toward the second crystal orientation K2 from the processing proceeding direction BD. The second orientation is an orientation of a direction inclined by 10° to 35° toward the first crystal orientation K1 from the processing proceeding direction BD.

The first orientation is an orientation of the beam shape 71 with a beam angle β being +10° to +35°. The second orientation is an orientation of the beam shape 71 with the beam angle β being −35° to −10°. The beam angle β is an angle between the processing proceeding direction BD and the longitudinal direction NH. The beam angle β includes a positive (+) angle in a counterclockwise direction, and includes a negative (−) angle in a clockwise direction as viewed from the back surface 100b, which is the laser light incident surface. The beam angle β can be obtained based on the orientation of the beam shape 71 and the processing proceeding direction BD.

The processing controller 9c controls starting and stopping of the laser processing on the target 100. The processing controller 9c performs a first process of relatively moving the first focusing point P1 along the first region M31 of the line M3 to form the modified region 4, and stopping the formation of the modified region 4 in a region of the line M3 other than the first region M31. The processing controller 9c performs a second process of relatively moving the first focusing point P1 along the second region M32 of the line M3 to form the modified region 4, and stopping the formation of the modified region 4 in a region of the line M3 other than the second region M32.

Switching between the formation of the modified region 4 and stopping of the formation can be implemented by the processing controller 9c as follows. For example, by switching between starting and stopping (ON/OFF) of the emission (output) of the first laser light L1 in the first laser processing head 10A, switching between the formation of the modified region 4 and the stopping of the formation can be implemented. Specifically, when a laser oscillator includes a solid-state laser, high speed switching between start and stop of the emission of the first laser light L1 can be implemented, through switching between ON and OFF of a Q switch provided in an oscillator (such as acousto-optic modulator (AOM) and electro-optic modulator (EOM)). When the laser oscillator includes a fiber laser, high speed switching between start and stop of the emission of the first laser light L1 can be implemented, through switching between ON and OFF of the output of a semiconductor laser forming a seed laser and an amplifier (excitation) laser. When the laser oscillator uses an external modulation element, high speed switching between ON and OFF of emission of the first laser light L1 is implemented, through switching between ON and OFF of the external modulation element (such as AOM or EOM) provided outside the oscillator.

Alternatively, switching between the formation of the modified region 4 and stopping of the formation may be implemented by the processing controller 9c as follows. For example, switching between the formation of the modified region 4 and stopping of the formation may be implemented by opening and closing the optical path of the first laser light L1, through control on a mechanical mechanism such as a shutter. The formation of the modified region 4 may be stopped by switching the first laser light L1 to continuous wave (CW) light. The formation of the modified region 4 may be stopped by displaying, on a liquid crystal layer of the reflective spatial light modulator 34, a pattern (a laser scattering stain finished pattern for example) with which the focusing state of the first laser light L1 enters a state where the modification cannot be performed. The formation of the modified region 4 may be stopped by controlling an output adjustment portion such as an attenuator to lower the output of the first laser light L1 to disable the formation of the modified region 4. The formation of the modified region 4 may be stopped by switching a polarization direction. The formation of the modified region 4 may be stopped by scattering (deflecting) the first laser light L1 to a direction other than the optical axis to cut the light.

The adjustment portion 9d controls the reflective spatial light modulator 34 to adjust the orientation of the beam shape 71. The adjustment portion 9d adjusts the orientation of the beam shape 71 to be the first orientation, when the first process is performed by the processing controller 9c. The adjustment portion 9d adjusts the orientation of the beam shape 71 to be the second orientation, when the second process is performed by the processing controller 9c. The adjustment portion 9d adjusts the longitudinal direction NH of the beam shape 71 to change within a range of ±35° with respect to the processing proceeding direction BD.

The laser processing apparatus 101 described above performs the following trimming processing (laser processing method).

First of all, in the trimming processing, the stage 107 is rotated and the first laser processing head 10A on which the alignment camera 110 is attached is moved along the X-axis rail 108 and the first Z-axis rail 106A, to make the alignment camera 110 positioned immediately above the alignment target 100n of the target 100, and make the alignment camera 110 focused on the alignment target 100n.

The alignment camera 110 captured an image. The 0° direction position of the target 100 is acquired based on the image captured by the alignment camera 110. The acquisition unit 9a acquires the target information and the line information based on the image captured by the alignment camera 110 and an input through a user operation, communications from the outside, or the like (information acquisition step). The target information includes alignment information on the 0° direction position and the diameter of the target 100. As described above, the alignment target 100n has a fixed relation in the θ direction relative to the 0° direction position, and thus the 0° direction position can be acquired by obtaining the position of the alignment target 100n from the captured image. The alignment camera 110 can acquire the diameter of the target 100 based on the image captured by the alignment camera 110. The diameter of the target 100 may be set by an input from the user.

Based on the target information and the line information acquired, the determination portion 9b determines, as the orientation of the longitudinal direction NH of the beam shape 71, the first orientation and the second orientation, when the first focusing point P1 relatively moves along the line M3 (determination step).

Next, the stage 107 is rotated to position the target 100 at the 0° direction position. In the X direction, the first laser processing head 10A moves along the X-axis rail 108 and the first Z-axis rail 106A, to position the first focusing point P1 at a predetermined trimming position. For example, the predetermined trimming position is a predetermined position of the target 100 on the line M3.

Then, the rotation of the stage 107 starts. The ranging sensor starts following the back surface 100b. Before the tracking by the ranging sensor, the position of the first focusing point P1 is confirmed to be within a measurable range of the ranging sensor in advance. The first laser processing head 10A starts emitting the first laser light L1 when a constant rotation speed (constant speed) of the stage 107 is achieved.

The emission of the first laser light L1 is switched between ON and OFF by the processing controller 9c while rotating the stage 107. Thus, the first focusing point P1 relatively moves along the first region M31 of the line M3 to form the modified region 4, and the formation of the modified region 4 is stopped in a region of the line M3 other than the first region M31 as illustrated in FIG. 15(a) (first processing step). As illustrated in FIG. 15(b), when the first processing step is performed, the adjustment portion 9d adjusts the orientation of the beam shape 71 to be the first orientation. Thus, the orientation of the beam shape 71 in the first processing step is fixed to the first orientation.

Then, the emission of the first laser light L1 is switched between ON and OFF by the processing controller 9c while rotating the stage 107. Thus, the first focusing point P1 relatively moves along the second region M32 of the line M3 to form the modified region 4, and the formation of the modified region 4 is stopped in a region of the line M3 other than the first region M31 as illustrated in FIG. 16(a) (second processing step). As illustrated in FIG. 16(b), when the second processing step is performed, the adjustment portion 9d adjusts the orientation of the beam shape 71 to be the second orientation. Thus, the orientation of the beam shape 71 in the second processing step is fixed to the second orientation.

The first processing step and the second processing step are repeatedly performed with the Z direction position of the predetermined trimming position changed. Through the above process, a plurality of rows of the modified regions 4 are formed in the Z direction along the line M3 at the circumferential edge of the effective region R in the target 100.

The laser processing apparatus 101 of the present embodiment described above performs the first process of relatively moving the first focusing point P1 along the first region M31 of the line M3 to form the modified region 4, and stopping the formation of the modified region 4 in a region of the line M3 other than the first region M31. In the first process, the orientation of the longitudinal direction NH of the beam shape 71 is adjusted to be the first orientation that is an orientation intersecting with the processing proceeding direction BD and is determined based on the target information and the line information. Furthermore the second process of relatively moving the first focusing point P1 along the second region M32 of the line M3 is performed to form the modified region 4, and stopping the formation of the modified region 4 in a region of the line M3 other than the second region M32 is performed. In the second process, the orientation of the longitudinal direction NH of the beam shape 71 is adjusted to be the second orientation that is an orientation intersecting with the processing proceeding direction BD and is determined based on the target information and the line information. Thus, when the quality of the trimmed surface of the first region M31 and the second region M32 deteriorates due to the physical property of the target 100 for example as a result of simply relatively moving the first focusing point P1 along the line M3 with the longitudinal direction NH matching the processing proceeding direction BD, such a deterioration of the quality of the trimmed surface can be suppressed. Thus, with the laser processing apparatus 101, local deterioration of the quality of the trimmed surface of the target 100 from which the removal region E as the outer edge portion has been removed can be suppressed.

With the laser processing method performed by the laser processing apparatus 101 of the present embodiment described above, the first processing step of relatively moving the first focusing point P1 along the first region M31 of the line M3 to form the modified region 4, and stopping the formation of the modified region 4 in a region of the line M3 other than the first region M31 is performed. In the first processing step, the orientation of the longitudinal direction NH is adjusted to be the first orientation that is an orientation intersecting with the processing proceeding direction BD and is determined based on the target information and the line information. Furthermore the second processing step of relatively moving the first focusing point P1 along the second region M32 of the line M3 is performed to form the modified region 4, and stopping the formation of the modified region 4 in a region of the line M3 other than the second region M32 is performed. In the second processing step, the orientation of the longitudinal direction NH is adjusted to be the second orientation that is an orientation intersecting with the processing proceeding direction BD and is determined based on the target information and the line information. Thus, when the quality of the trimmed surface of the first region M31 and the second region M32 deteriorates due to the physical property of the target 100 for example as a result of simply relatively moving the first focusing point P1 along the line M3 with the longitudinal direction NH of the beam shape 71 matching the processing proceeding direction BD, such a deterioration of the quality of the trimmed surface can be suppressed. Thus, with the laser processing method performed by the laser processing apparatus 101, local deterioration of the quality of the trimmed surface of the target 100 from which the removal region E as the outer edge portion has been removed can be suppressed.

In particular, in the present embodiment, in the first process (first processing step), the orientation of the beam shape 71 is fixed to the first orientation, and similarly, in the second process (second processing step), the orientation of the beam shape 71 is fixed to the second orientation. In each of the first process and the second process (the first processing step and the second processing step), the beam shape 71 is constant and thus does not vary, whereby stable laser processing can be performed.

Depending on the part where the modified region 4 is formed, cracks extending from the modified region 4 are difficult to advance in the processing proceeding direction BD due to an impact of the crystal orientation in which cleavage is likely to form. Thus, the quality of the trimmed surface might be compromised. In view of this, in the laser processing apparatus 101, the target information includes information on the crystal orientation (the first crystal orientation K1 and the second crystal orientation K2) of the target 100. The line information includes information on the processing proceeding direction BD. Thus, even when the target 100 includes the crystal orientation, local deterioration of the quality of the trimmed surface of the target 100 can be suppressed.

In the laser processing apparatus 101 of the present embodiment, the reflective spatial light modulator 34 is provided as the shaping portion. The adjustment portion 9d adjusts the orientation of the longitudinal direction NH by controlling the reflective spatial light modulator 34. Thus, the orientation of the longitudinal direction NH can be reliably adjusted.

The target 100 of the laser processing apparatus 101 of the present embodiment is a wafer having a (100) plane as the principal plane, and has the first crystal orientation K1 orthogonal to one (110) plane and the second crystal orientation K2 orthogonal to the other (110) plane. The line M3 annularly extends as viewed in a direction orthogonal to the principal plane of the target 100. The first region M31 includes a region where the processing angle α is 0° or more and less than 45° when the first focusing point P1 is relatively moved along the line M3. The second region M32 includes a region where the processing angle α is 45° or more and less than 90° when the first focusing point P1 is relatively moved along the line M3. Thus, even when the target 100 is a wafer having the (100) plane as the principal plane, local deterioration of the quality of the trimmed surface of the target 100 can be suppressed.

In the laser processing apparatus 101 of the present embodiment, the first orientation and the second orientation are orientations of directions inclined with respect to the processing proceeding direction BD, toward one of the first crystal orientation K1 and the second crystal orientation K2 forming a larger angle with the processing proceeding direction BD. Thus, even when the target 100 is a wafer having the (100) plane as the principal plane, deterioration of the quality of the trimmed surface of the target 100 can be more reliably suppressed in each of the first region M31 and the second region M32.

For example, when a crack can extend in the first crystal orientation K1, the orientation of the beam shape 71 is inclined toward the second crystal orientation K2 opposite to the first crystal orientation K1 side with respect to the processing proceeding direction BD, instead of adjusting the orientation of the beam shape 71 to be the orientation of the processing proceeding direction BD. Thus, as illustrated in FIG. 15(b), crack advancement force W2 as a result of making the beam shape 71 have an elongated shape cancels out crack advancement force W1 due to the crystal orientation (crystal axis), whereby the crack accurately extend in the processing proceeding direction BD.

For example, when a crack can extend in the second crystal orientation K2, the orientation of the beam shape 71 is inclined toward the first crystal orientation K1 opposite to the second crystal orientation K2 side with respect to the processing proceeding direction BD, instead of adjusting the orientation of the beam shape 71 to be the orientation of the processing proceeding direction BD. Thus, as illustrated in FIG. 16(b), the crack advancement force W2 as a result of making the beam shape 71 have an elongated shape cancels out the crack advancement force W1 due to the crystal orientation, whereby the crack accurately extend in the processing proceeding direction BD.

In the laser processing apparatus 101 of the present embodiment, the first orientation is an orientation of a direction inclined by 10° to 35° with respect to the processing proceeding direction BD, toward one of the first crystal orientation K1 and the second crystal orientation K2 forming a larger angle with the processing proceeding direction BD. The second orientation is an orientation of a direction inclined by 10° to 35° with respect to the processing proceeding direction BD, toward one of the first crystal orientation K1 and the second crystal orientation K2 forming a larger angle with the processing proceeding direction BD. Thus, even when the target 100 is a wafer having the (100) plane as the principal plane, deterioration of the quality of the trimmed surface of the target 100 can be more reliably suppressed in each of the first region M31 and the second region M32.

With the laser processing apparatus 101 and the laser processing method performed by the laser processing apparatus 101 of the present embodiment, the first focusing point P1 relatively moves along the line M3, with the longitudinal direction NH of the beam shape 71 intersecting with the processing proceeding direction BD, in the first portion (the first region M31 or the second region M32) of the line M3. Thus, when the quality of the trimmed surface in the first portion of the line M3 deteriorates due to the physical property of the target 100 for example as a result of simply relatively moving the first focusing point P1 along the line M3 with the longitudinal direction NH matching the processing proceeding direction BD, such a deterioration of the quality of the trimmed surface can be suppressed. Local deterioration of the quality of the trimmed surface can be suppressed.

FIG. 17 is a timetable illustrating a specific first operation example in a case where the laser processing apparatus 101 of FIG. 9 performs the laser processing. Trace processing in FIG. 17 is processing in which the ranging sensor 36 emits a distance measurement laser light to the laser light incident surface of the target 100, and detects the distance measurement light reflected by the laser light incident surface to detect displacement data on the laser light incident surface. Following control in FIG. 17 is the above-described control performed by the ranging sensor 36. Recording of the following control is control of acquiring the displacement data, reproduction of the following control is control of driving the driving unit 18 (see FIG. 5) to make the condensing unit 14 follow the laser light incident surface based on the displacement data. The "Z direction processing position" is the focusing position (focal point) of the condensing unit 14 (see FIG. 5). "Laser light emission" is emission of the first laser light L1.

With the laser processing in FIG. 17, seven rows of the modified regions 4 are formed in the Z direction in the target 100. The seven rows of the modified regions 4 are referred to as "SD1", "SD2", "SD3", "SD4", "SD5", "SD6", and "SD7" in this order from the farthest position from the laser light incident surface (the same applies in the following). SD1 to SD3 are formed with the orientation of the beam shape 71 adjusted to be the first orientation and the second orientation. SD4 to SD7 are formed with the longitudinal direction NH of the beam shape 71 matching the processing proceeding direction BD.

In FIG. 17, the time elapses in order of times T1 to T10. Various processes illustrated in FIG. 17 are performed after calibration, alignment, and height set. The calibration is a calibration process for various measured values. The alignment is an adjustment process for various parts. The height set is process of capturing an image of the laser light incident surface, relatively moving the stage 107 in the Z direction to achieve the maximum contrast of the reticle pattern projected, and the resultant Z direction position of the laser light incident surface is set to be the point of focus (0 µm displacement). Timings of the various processes are based on the θ information, the rotation speed, and the like of the stage 107 for example. The above points related to FIG. 17 similarly apply to FIGS. 18 to 20.

The laser processing apparatus 101 can perform various processes in a procedure exemplified in the timetable illustrated in FIG. 17. In the example illustrated in FIG. 17, the stage 107 does not continuously rotate in one direction in the θ direction (rotation direction around the rotation axis C), but rotates in one direction and in the other direction in the θ direction.

Specifically, the laser processing apparatus 101 performs the trace processing up to the time T1 as illustrated in FIG. 17. In the time T1 and before, the stage 107 is accelerated in the rotation direction which is one direction. The following control is stopped with the processing position in the Z direction being the laser light incident surface. The orientation of the beam shape 71 is switched to the first orientation. Emission of the first laser light L1 is stopped. In the time T2, the trace processing continues. In the time T2, the stage 107 rotates at a constant speed in one direction, and the displacement data on the laser light incident surface is acquired by the following control. Contents of the processes in the time T2 other than the above are the same as those in the time T1.

In the time T3, the trace processing continues. In the time T3, the rotation of the stage 107 in one direction is decelerated, and the Z direction processing position is moved to the processing position for forming SD1, and the following control is stopped. Contents of the processes in the time T3 other than the above are the same as those in the time T2. In the time T4, the laser processing (SD1 processing) for forming SD1 is performed. In the time T4, the stage 107 is accelerated in the rotation direction which is the other direction. Contents of the processes in the time T4 other than the above are the same as those in the time T3.

In the time T5, the SD1 processing continues. In the time T5, the stage 107 rotates in the other direction at a constant speed, and the driving unit 18 (see FIG. 5) is driven to make the condensing unit 14 follow the laser light incident surface by the following control. In the time T5, the Z direction processing position is the processing position for forming SD1, and the orientation of the beam shape 71 is the first orientation. The first laser light L1 is emitted along the first region M31 of the line M3 (ON), and the first focusing point P1 moves, whereby the modified region 4 is formed. On the other hand, the first laser light L1 is not emitted (OFF) along the second region M32 of the line M3, and thus the formation of the modified region 4 is stopped.

In the time T6, the SD1 processing continues. In the time T6, the rotation of the stage 107 in the other direction is decelerated, the following control stops, the orientation of the beam shape 71 is switched to the second orientation, and the emission of the first laser light L1 stops. In the time T6, the Z direction processing position is the processing position for forming SD1. In the time T7, the SD1 processing continues. In the time T7, the stage 107 is accelerated in the rotation direction which is one direction. Contents of the processes in the time T7 other than the above are the same as those in the time T6.

In the time T8, the SD1 processing continues. In the time T8, the stage 107 rotates in one direction at a constant speed, and the driving unit 18 (see FIG. 5) is driven to make the condensing unit 14 follow the laser light incident surface by the following control. In the time T8, the Z direction processing position is the processing position for forming SD1, and the orientation of the beam shape 71 is the second orientation. The first laser light L1 is emitted along the second region M32 of the line M3 (ON), and the first focusing point P1 moves, whereby the modified region 4 is formed. On the other hand, the first laser light L1 is not emitted (OFF) along the first region M31 of the line M3, and thus the formation of the modified region 4 is stopped.

In the time T9, the SD1 processing continues. In the time T9, the rotation of the stage 107 in one direction is decelerated, and the Z direction processing position is moved to the processing position for forming SD2, and the following control is stopped. In the time T9, the orientation of the beam shape 71 is switched to the first orientation, and the emission of the first laser light L1 stops.

In the time T10, the laser processing (SD2 processing) for forming SD2 is performed. In the time T10, the stage 107 is accelerated in the rotation direction which is the other direction. Contents of the processes in the time T10 other than the above are the same as those in the time T9. The process is repeated thereafter until the laser processing is completed.

The constant speed includes approximately constant speed. The constant speed rotation in the trace processing and the constant speed rotation in the formation of the modified region 4 may be different from each other in the rotation speed. The constant speed rotation in the formation of the modified region 4 is rotation with which constant processing speed (pulse pitch) is achieved. The laser processing with the constant speed rotation may start from a position (the θ direction position where a notch or the like is set for example) of coordinates designated after the constant speed rotation is achieved. The stage 107 may be temporarily stopped between deceleration and acceleration of rotation. While the rotation is thus stopped, the processing position in the Z direction and the orientation of the beam shape 71 may be changed. The same applies to the following description.

FIG. 18 is a timetable illustrating a specific second operation example in a case where the laser processing apparatus 101 of FIG. 9 performs the laser processing. The laser processing apparatus 101 can perform various processes in the procedure exemplified in the timetable illustrated in FIG. 18. In the example illustrated in FIG. 18, the stage 107 does not continuously rotate in one direction in the θ direction, but rotates in one direction and in the other direction in the θ direction.

As illustrated in FIG. 18, the SD1 processing is performed up to the time T1. In the time T1 and before, the stage 107 is accelerated in the rotation direction which is one direction. The following control is stopped with the processing position in the Z direction being the processing position for forming SD1. The orientation of the beam shape 71 is switched to the first orientation. Emission of the first laser light L1 is stopped.

In the time T2, the SD1 processing continues. In the time T2, the stage 107 rotates in one direction at a constant speed, and the driving unit 18 (see FIG. 5) is driven to make the condensing unit 14 follow the laser light incident surface by the following control. In the time T2, the Z direction processing position is the processing position for forming SD1, and the orientation of the beam shape 71 is the first orientation. The first laser light L1 is emitted along the first region M31 of the line M3 (ON), and the first focusing point P1 moves, whereby the modified region 4 is formed. On the other hand, the first laser light L1 is not emitted (OFF) along the second region M32 of the line M3, and thus the formation of the modified region 4 is stopped.

In the time T3, the SD1 processing continues. In the time T3, the rotation of the stage 107 in one direction is decelerated, and the Z direction processing position is moved to the processing position for forming SD1, and the following control is stopped. In the time T3, the orientation of the beam shape 71 is switched to the second orientation, and the emission of the first laser light L1 stops. In the time T4, the SD1 processing continues. In the time T4, the stage 107 is accelerated in the rotation direction which is the other direction. Contents of the processes in the time T4 other than the above are the same as those in the time T3.

In the time T5, the SD1 processing continues. In the time T5, the stage 107 rotates in the other direction at a constant speed, and the driving unit 18 (see FIG. 5) is driven to make the condensing unit 14 follow the laser light incident surface by the following control. In the time T5, the Z direction processing position is the processing position for forming SD1, and the orientation of the beam shape 71 is the second orientation. The first laser light L1 is emitted along the second region M32 of the line M3 (ON), and the first focusing point P1 moves, whereby the modified region 4 is formed. On the other hand, the first laser light L1 is not emitted (OFF) along the first region M31 of the line M3, and thus the formation of the modified region 4 is stopped.

In the time T6, the SD1 processing continues. In the time T6, the rotation of the stage 107 in the other direction is decelerated, the Z direction processing position is moved to the processing position for forming SD2, the following control stops, the orientation of the beam shape 71 is switched to the first orientation, and the emission of the first laser light L1 stops. In the time T7, the SD2 processing is performed. In the time T7, the stage 107 is accelerated in the rotation direction which is one direction. Contents of the processes in the time T7 other than the above are the same as those in the time T6. The process is repeated thereafter until the laser processing is completed. With the following control in the time T2 in FIG. 18, a following operation is performed with a length measurement range assumed to be wide. When the length measurement range is narrow, a recording or reproduction operation may be performed.

FIG. 19 is a timetable illustrating a specific third operation example in a case where the laser processing apparatus 101 of FIG. 9 performs the laser processing. The laser processing apparatus 101 can perform various processes in the procedure exemplified in the timetable illustrated in FIG. 19. In the example illustrated in FIG. 19, the stage 107 continuously rotates in one direction or the other direction in the θ direction.

As illustrated in FIG. 19, the trace processing is performed up to the time T1. In the time T1 and before, the stage 107 is accelerated. The following control is stopped with the processing position in the Z direction being the laser light incident surface. The orientation of the beam shape 71 is switched to the first orientation. Emission of the first laser light L1 is stopped. In the time T2, the trace processing continues. In the time T2, the stage 107 rotates at a constant speed, and the displacement data on the laser light incident surface is acquired by the following control. Contents of the processes in the time T2 other than the above are the same as those in the time T1.

In the time T3, the trace processing continues. In the time T3, the rotation of the stage 107 is maintained, and the Z direction processing position is moved to the processing position for forming SD1, and the following control is stopped. Contents of the processes in the time T3 other than the above are the same as those in the time T2. In the time T4, the SD1 processing is performed. In the time T4, the stage 107 rotates at a constant speed, and the driving unit 18 (see FIG. 5) is driven to make the condensing unit 14 follow the laser light incident surface by the following control. In the time T4, the Z direction processing position is the processing position for forming SD1, and the orientation of the beam shape 71 is the first orientation. The first laser light L1 is emitted along the first region M31 of the line M3 (ON), and the first focusing point P1 moves, whereby the modified region 4 is formed. On the other hand, the first laser light L1 is not emitted (OFF) along the second region M32 of the line M3, and thus the formation of the modified region 4 is stopped.

In the time T5, the SD1 processing continues. In the time T5, the rotation of the stage 107 is maintained, the Z direction processing position is maintained to be at the processing position for forming SD1, the following control stops, the orientation of the beam shape 71 is switched to the second orientation, and the emission of the first laser light L1 stops.

In the time T6, the SD1 processing continues. In the time T6, the stage 107 rotates at a constant speed, and the driving unit 18 (see FIG. 5) is driven to make the condensing unit 14 follow the laser light incident surface by the following control. In the time T6, the Z direction processing position is the processing position for forming SD1, and the orientation of the beam shape 71 is the second orientation. The first laser light L1 is emitted along the second region M32 of the line M3 (ON), and the first focusing point P1 moves, whereby the modified region 4 is formed. On the other hand, the first laser light L1 is not emitted (OFF) along the first region M31 of the line M3, and thus the formation of the modified region 4 is stopped.

In the time T7, the SD1 processing continues. In the time T7, the rotation of the stage 107 is maintained, and the Z direction processing position is moved to the processing position for forming SD2, and the following control is stopped. In the time T7, the orientation of the beam shape 71 is switched to the first orientation, and the emission of the first laser light L1 stops.

In the time T8, the SD2 processing is performed. In the time T8, the stage 107 rotates at a constant speed, and the driving unit 18 (see FIG. 5) is driven to make the condensing unit 14 follow the laser light incident surface by the following control. In the time T8, the Z direction processing position is the processing position for forming SD2, and the orientation of the beam shape 71 is the first orientation. The first laser light L1 is emitted along the first region M31 of the line M3 (ON), and the first focusing point P1 moves, whereby the modified region 4 is formed. On the other hand, the first laser light L1 is not emitted (OFF) along the second region M32 of the line M3, and thus the formation of the modified region 4 is stopped. The process is repeated thereafter until the laser processing is completed.

The rotation maintained in the times T3, T5, and T7 may not be of a constant rotation speed and may be of a variable rotation speed, and thus may be of any speed as long as the rotation does not stop. With the rotation maintained in the times T3, T5, and T7, if it takes time for switching the orientation of the beam shape 71, the stage 107 may be rotated twice or more. The same applies to the following description.

FIG. 20 is a timetable illustrating a specific fourth operation example in a case where the laser processing apparatus 101 of FIG. 9 performs the laser processing. The laser processing apparatus 101 can perform various processes in the procedure exemplified in the timetable illustrated in FIG. 20. In the example illustrated in FIG. 20, the stage 107 continuously rotates in one direction or the other direction in the θ direction.

As illustrated in FIG. 20, the SD1 processing is performed up to the time T1. In the time T1 and before, the stage 107 is accelerated. The following control is stopped with the processing position in the Z direction being the processing position for forming SD1. The orientation of the beam shape 71 is switched to the first orientation. Emission of the first laser light L1 is stopped.

In the time T2, the SD1 processing continues. In the time T2, the stage 107 rotates at a constant speed, and the driving unit 18 (see FIG. 5) is driven to make the condensing unit 14 follow the laser light incident surface by the following control. In the time T2, the Z direction processing position is the processing position for forming SD1, and the orientation of the beam shape 71 is the first orientation. The first laser light L1 is emitted along the first region M31 of the line M3 (ON), and the first focusing point P1 moves, whereby the modified region 4 is formed. On the other hand, the first laser light L1 is not emitted (OFF) along the second region M32 of the line M3, and thus the formation of the modified region 4 is stopped.

In the time T3, the SD1 processing continues. In the time T3, the rotation of the stage 107 is maintained, and the Z direction processing position is maintained to be at the processing position for forming SD1, and the following control is stopped. In the time T3, the orientation of the beam shape 71 is switched to the second orientation, and the emission of the first laser light L1 stops.

In the time T4, the SD1 processing continues. In the time T4, the stage 107 rotates in the other direction at a constant speed, and the driving unit 18 (see FIG. 5) is driven to make the condensing unit 14 follow the laser light incident surface by the following control. In the time T4, the Z direction processing position is the processing position for forming SD1, and the orientation of the beam shape 71 is the second orientation. The first laser light L1 is emitted along the second region M32 of the line M3 (ON), and the first focusing point P1 moves, whereby the modified region 4 is formed. On the other hand, the first laser light L1 is not emitted (OFF) along the first region M31 of the line M3, and thus the formation of the modified region 4 is stopped.

In the time T5, the SD1 processing continues. In the time T6, the rotation of the stage 107 is maintained, the Z direction processing position is moved to the processing position for forming SD2, the following control stops, the orientation of the beam shape 71 is switched to the first orientation, and the emission of the first laser light L1 stops.

In the time T6, the SD2 processing is performed. In the time T6, the stage 107 rotates at a constant speed, and the driving unit 18 (see FIG. 5) is driven to make the condensing unit 14 follow the laser light incident surface by the following control. In the time T6, the Z direction processing position is the processing position for forming SD2, and the orientation of the beam shape 71 is the first orientation. The first laser light L1 is emitted along the first region M31 of the line M3 (ON), and the first focusing point P1 moves, whereby the modified region 4 is formed. On the other hand, the first laser light L1 is not emitted (OFF) along the second region M32 of the line M3, and thus the formation of the modified region 4 is stopped. The process is repeated thereafter until the laser processing is completed.

Note that in the first to the fourth operation examples described above, the modified region 4 is formed along the second region M32 of the line M3 after the modified region 4 has been formed along the first region M31 of the line M3, but the modified region 4 may be formed along the first region M31 after the modified region 4 has been formed along the second region M32. Furthermore, after the modified region 4 related to SD1 has been formed along the second region M32, the modified region 4 related to SD2 may be formed along the second region M32, and the modified region 4 related to SD2 may be formed along the first region M31. Furthermore, after the modified region 4 related to SD1 has been formed along the first region M31 and the modified region 4 related to SD2 has been formed along the first region M31, the modified region 4 related to SD1 may be formed along the second region M32, and the modified region 4 related to SD2 may be formed along the second region M32.

FIG. 21(a) is a photographic view illustrating a part of the target 100 after the trimming processing performed with the longitudinal direction NH of the beam shape 71 and the processing proceeding direction BD matched. FIG. 21(b) is a photographic view illustrating a part of the target 100 after the trimming processing by the laser processing apparatus 101 in FIG. 9. The photographic views in FIGS. 21(a) and 21(b) illustrate trimmed surfaces that are cutting surfaces in a case where cutting is performed with the modified region 4, formed along the first region M31 of the line M3, serving as the boundary in the target 100. With the laser processing illustrated in FIGS. 21(a) and 21(b), seven rows of the modified regions 4 are formed in the target 100 in the Z direction.

In FIG. 21(a), SD1 to SD7 are formed with the longitudinal direction NH of the beam shape 71 matching the processing proceeding direction BD. In FIG. 21(b), SD1 to SD3 are formed with the orientation of the beam shape 71 adjusted to be the first orientation in the first processing step. SD4 to SD7 are formed with the longitudinal direction NH of the beam shape 71 matching the processing proceeding direction BD. The target 100 is a mirror wafer formed of silicon, and has a thickness of 775 μm. The target 100 has a (100) plane as the principal plane, and has resistivity of 1 Ω·cm. The back surface 100b is the laser light incident surface, and a distance from the front surface 100a to SD1 is 60 μm.

As can be seen from the comparison between FIGS. 21(a) and 21(b), twist hackle reaching from SD1 to the front surface 100a can be suppressed and the deterioration of quality can be suppressed, by adjusting the orientation of the beam shape 71, which has been in the processing proceeding direction BD, to be the first orientation when the modified region 4 is formed along the first region M31 of the line M3.

FIG. 22(a) is a photographic view illustrating a part of the target 100 after the trimming processing performed with the longitudinal direction NH of the beam shape 71 and the processing proceeding direction BD matched. FIG. 22(b) is a photographic view illustrating a part of the target 100 after the trimming processing by the laser processing apparatus 101 in FIG. 9. The photographic views in FIGS. 22(a) and 22(b) illustrate trimmed surfaces that are cutting surfaces in a case where cutting is performed with the modified region 4, formed along the second region M32 of the line M3, serving as the boundary in the target 100.

In FIG. 22(a), SD1 to SD7 are formed with the longitudinal direction NH of the beam shape 71 matching the processing proceeding direction BD. In FIG. 22(b), SD1 to SD3 are formed with the orientation of the beam shape 71 adjusted to be the second orientation in the second processing step. SD4 to SD7 are formed with the longitudinal direction NH of the beam shape 71 matching the processing proceeding direction BD. The target 100 is a mirror wafer formed of silicon, and has a thickness of 775 μm. The target 100 has a (100) plane as the principal plane, and has resistivity of 1 Ω·cm. The back surface 100b is the laser light incident surface, and a distance from the front surface 100a to SD1 is 60 μm.

As can be seen from the comparison between FIGS. 22(a) and 22(b), twist hackle reaching from SD1 to the front surface 100a can be suppressed and the deterioration of quality can be suppressed, by adjusting the orientation of the beam shape, which has been orientated in the processing proceeding direction BD, to be the second orientation when the modified region 4 is formed along the second region M32 of the line M3.

Figure 23:
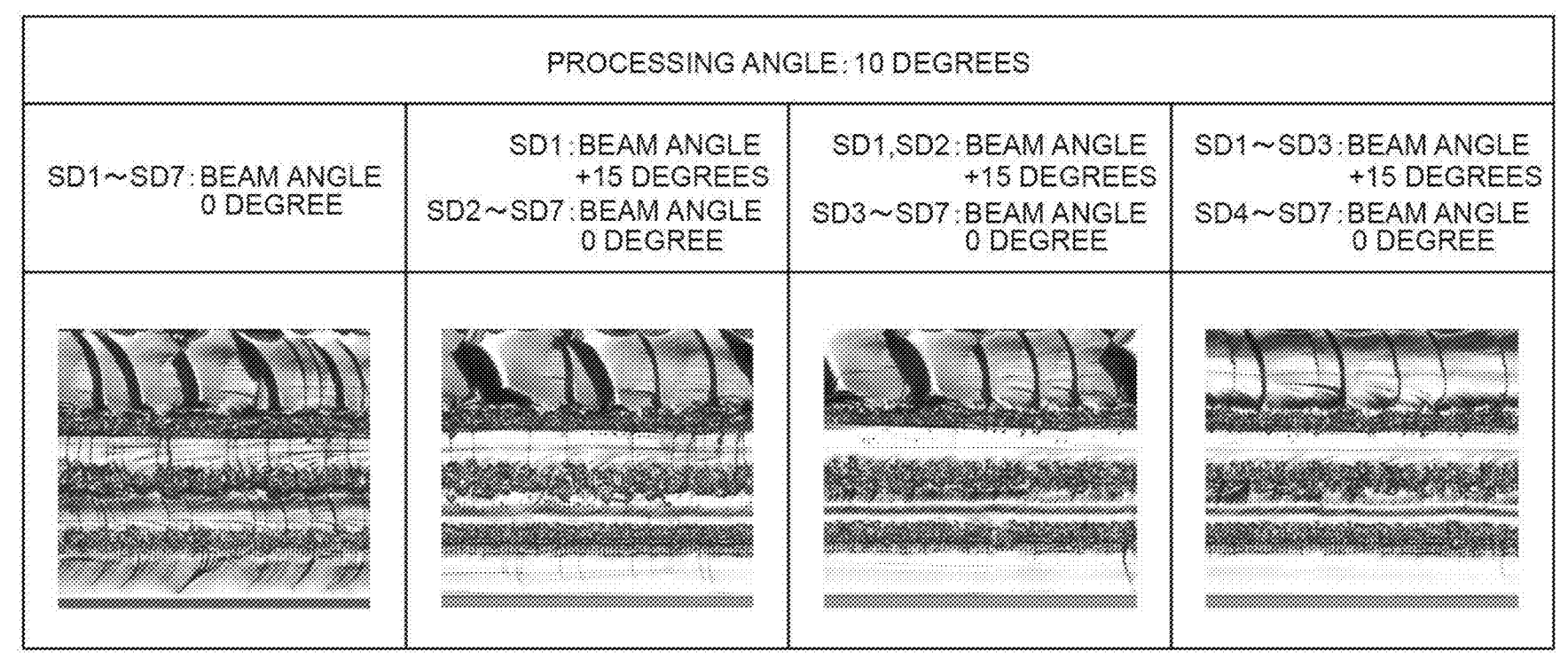

FIG. 23 is a diagram illustrating a part of the target 100 after the trimming processing. The photographic view in FIG. 23 illustrates a trimmed surface that is a cutting surface in a case where cutting is performed with the modified region 4, formed along the line M3, serving as the boundary in the target 100. photographic views in FIG. 23 illustrate a case where the modified regions 4 of all the rows (SD1 to SD7) are formed with the beam angle β being 0°, a case where the modified region 4 of SD1 is formed with the beam angle β being +15° and the other modified regions 4 formed with the beam angle β being 0°, a case where the modified regions 4 of SD1 and SD2 are formed with the beam angle β being +15° and with the other modified regions 4 formed with the beam angle β being 0°, and a case where the modified regions 4 of SD1 to SD3 are formed with the beam angle β being +15° and with the other modified regions 4 formed with the beam angle β being 0°.

It can be seen in FIG. 23 that when the modified regions 4 of all the rows are formed with the beam angle β being 0°, the processing quality is compromised, and that the processing quality improves as the number of rows of the modified regions 4 formed with the beam angle β adjusted increases. It can be seen that this effect can be obtained with a single row of modified region 4 formed with the beam angle β adjusted, and that even better laser processing can be implemented with three rows of modified regions 4 formed with the beam angle β adjusted.

Figure 24:
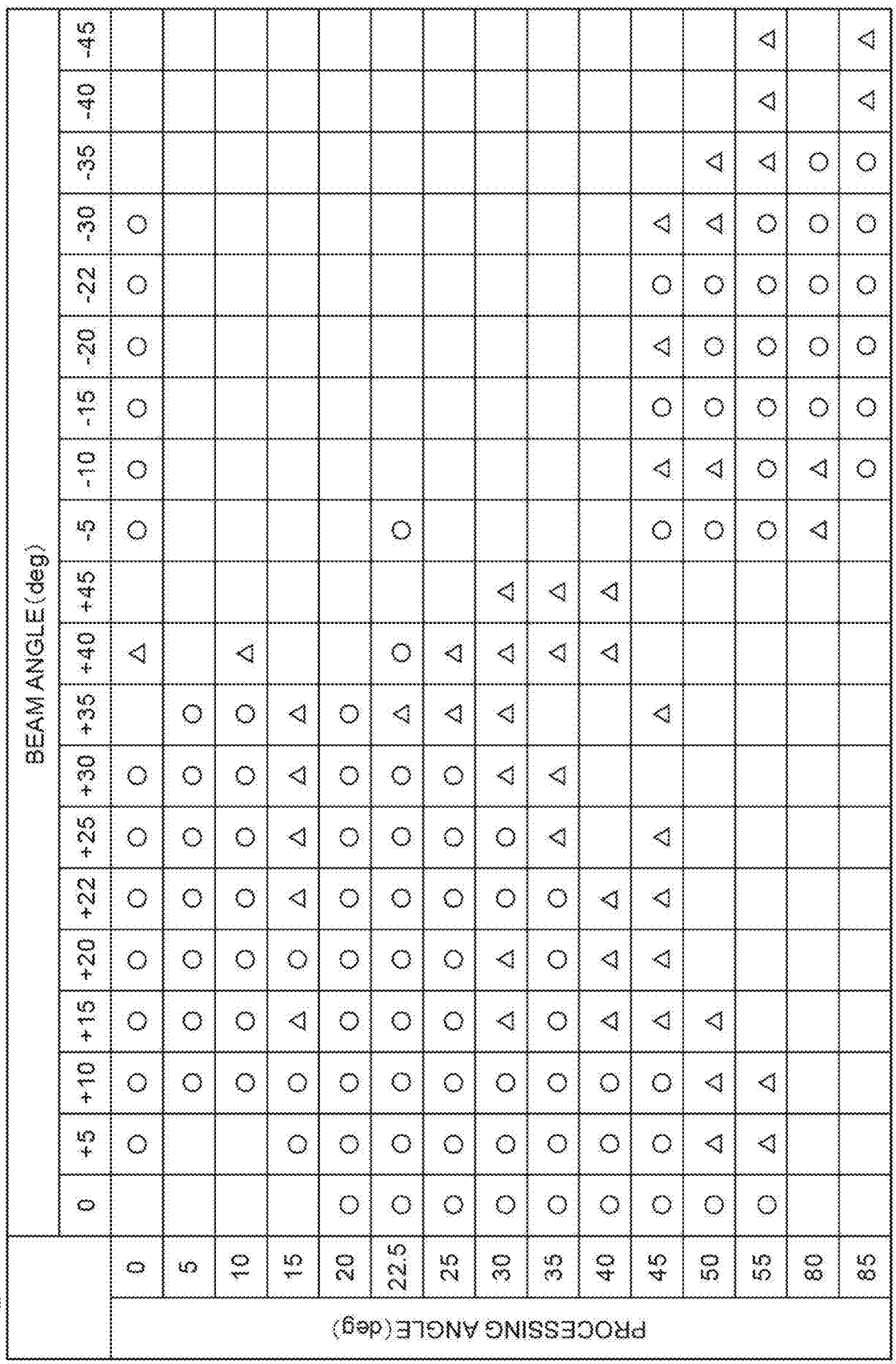
FIG. 24 is a table illustrating experimental results for evaluating processing quality obtained with a beam angle and a processing angle changed.

FIG. 24 is a table summarizing the experimental results for evaluating the processing quality obtained with the beam angle β and the processing angle α changed. FIGS. 25 to 54 are photographic views illustrating trimmed surfaces of the targets 100 according to the experimental results in FIG. 24. In the experimental results herein, a plurality of rows of the modified regions 4 are formed in the target 100. The target 100 is a mirror wafer formed of silicon, has the (100) plane serving as the principal plane, and has the resistivity of 1 Ω·cm. The back surface 100b is the laser light incident surface. In FIG. 24, "o" indicates a very good processing quality, "Δ" indicates a favorable (substantially favorable) processing quality, and "×" indicates a deteriorated processing quality. Even when twist hackle is occurring under the SD1 (the modified region 4 at the position farthest from the laser light incident surface), it is regarded that the processing quality is favorable ("Δ" in FIG. 24) as long as the twist hackle does not reach the front surface 100a that is the surface opposite to the laser light incident surface.

Figure 25:
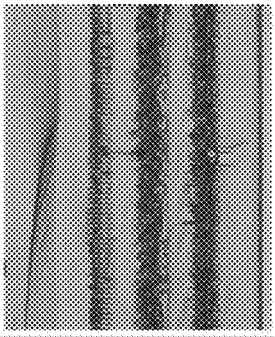
FIG. 25 is a photographic view illustrating trimmed surfaces of targets according to the experimental results in FIG. 24.
Figure 40:
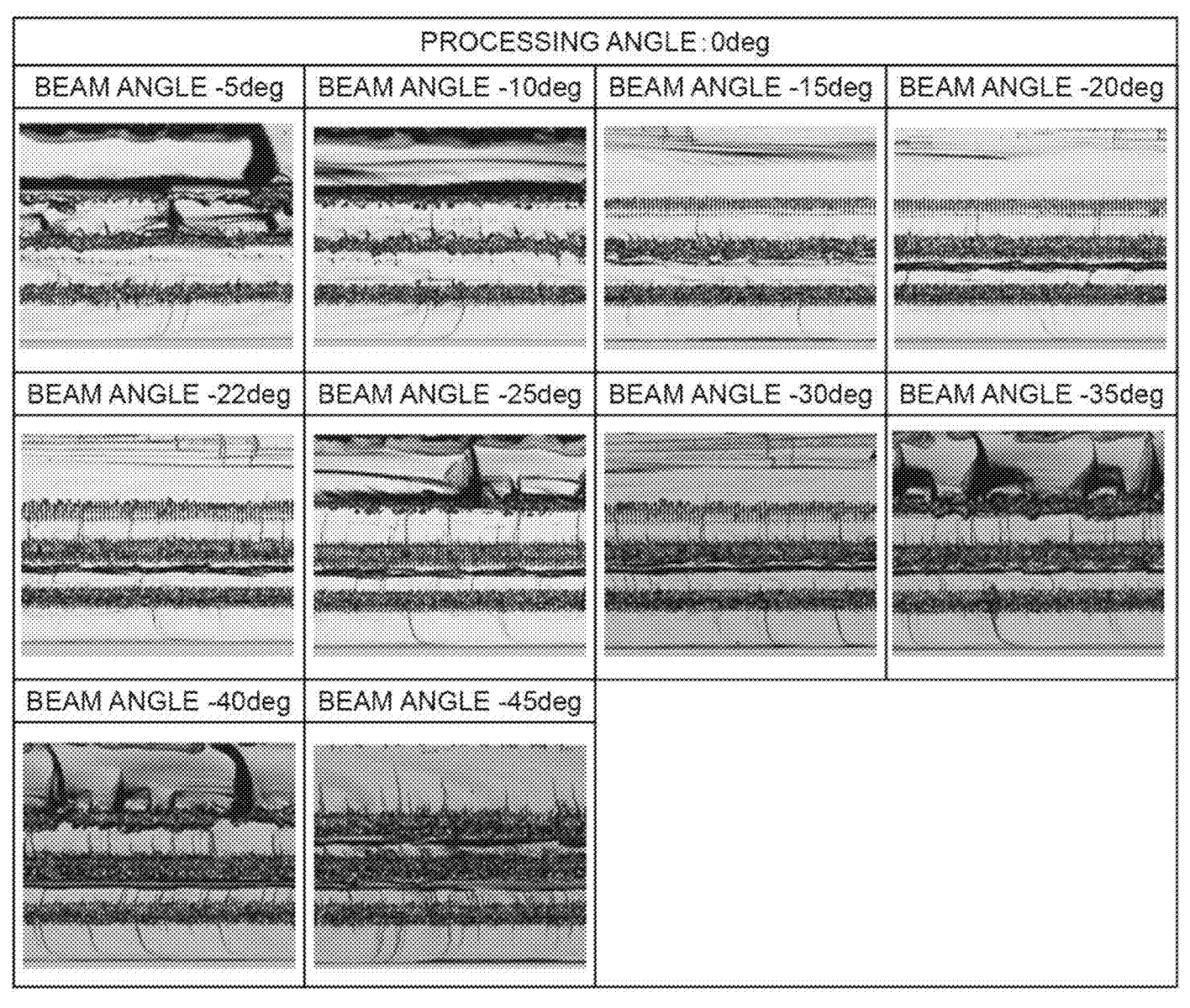

It can be seen in FIG. 24, FIG. 25, and FIG. 40 that when the processing angle α is 0°, very good processing quality is obtained when the beam angle β is 5° to 30° and −5° to −30°. It can be seen in FIG. 24, FIG. 26, and FIG. 41 that when the processing angle α is 5°, very good processing quality is obtained when the beam angle β is 10° to 35°.

Figure 27:
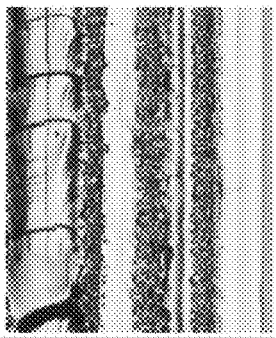
FIG. 27 is a photographic view illustrating trimmed surfaces of targets according to the experimental results in FIG. 24.
Figure 28:
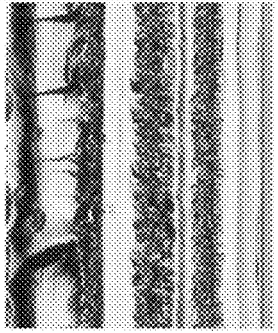
FIG. 28 is a photographic view illustrating trimmed surfaces of targets according to the experimental results in FIG. 24.
Figure 42:
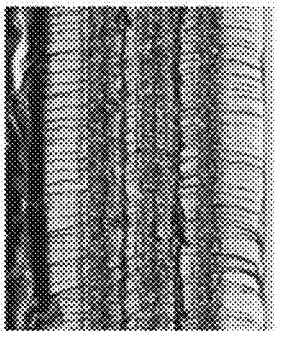
FIG. 42 is a photographic view illustrating trimmed surfaces of targets according to the experimental results in FIG. 24.
Figure 43:
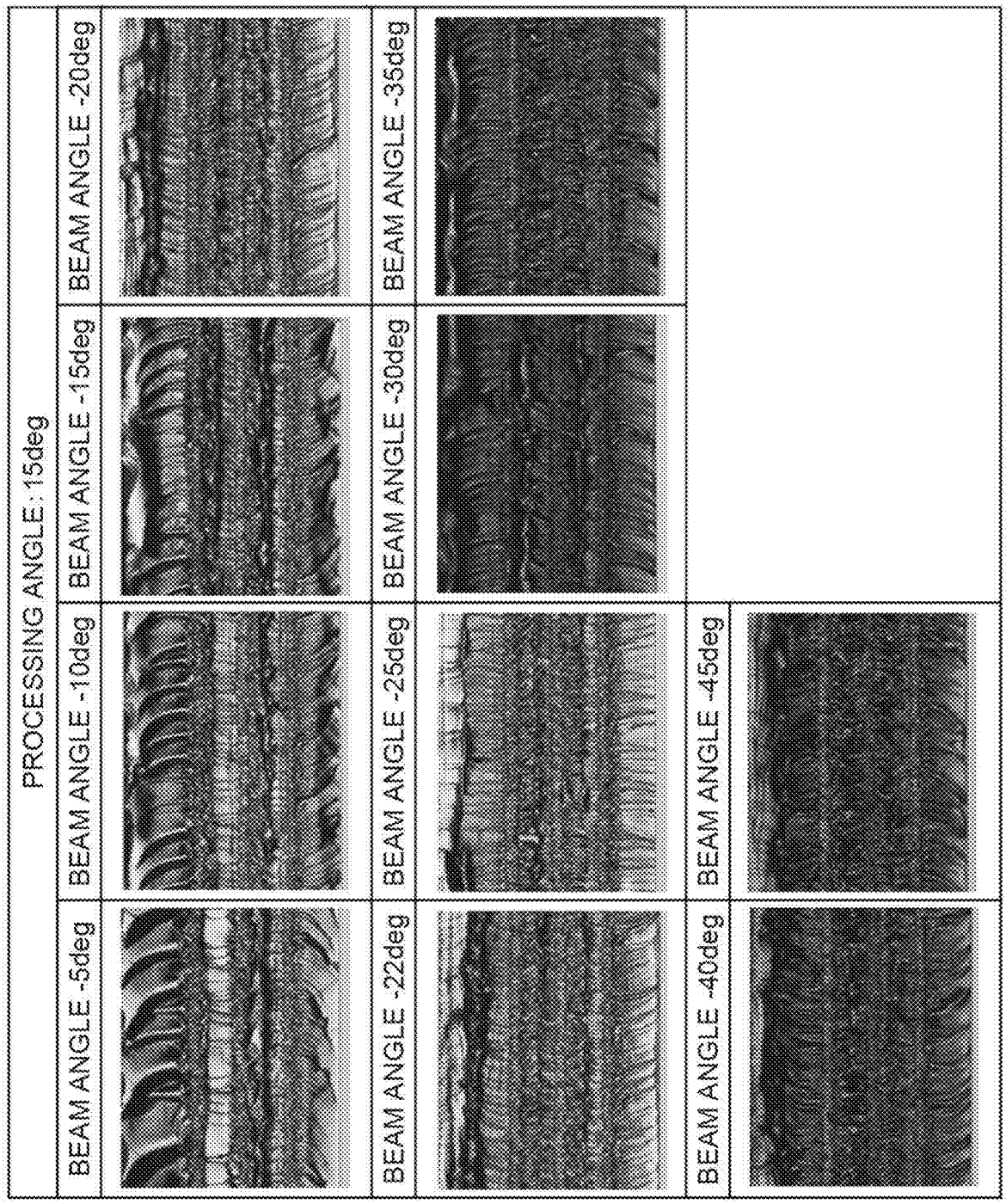
FIG. 43 is a photographic view illustrating trimmed surfaces of targets according to the experimental results in FIG. 24.

It can be seen in FIG. 24, FIG. 27, and FIG. 42 that when the processing angle α is 10°, very good processing quality is obtained when the beam angle β is 10° to 35°. It can be seen in FIG. 24, FIG. 28, and FIG. 43 that when the processing angle α is 15°, very good processing quality is obtained when the beam angle β is 5° to 10° and 20°.

Figure 29:
FIG. 29 is a photographic view illustrating trimmed surfaces of targets according to the experimental results in FIG. 24.
Figure 30:
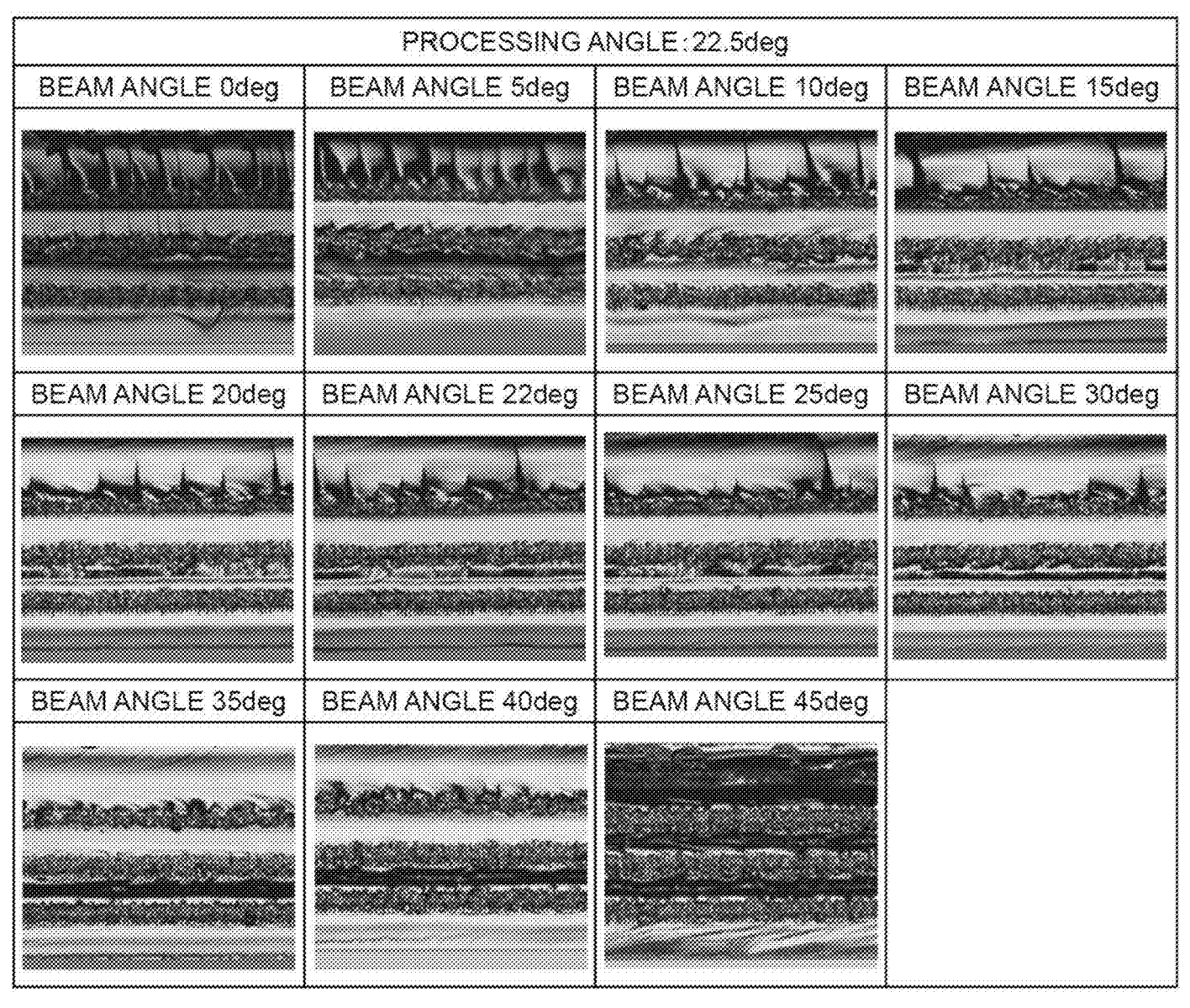
Figure 44:
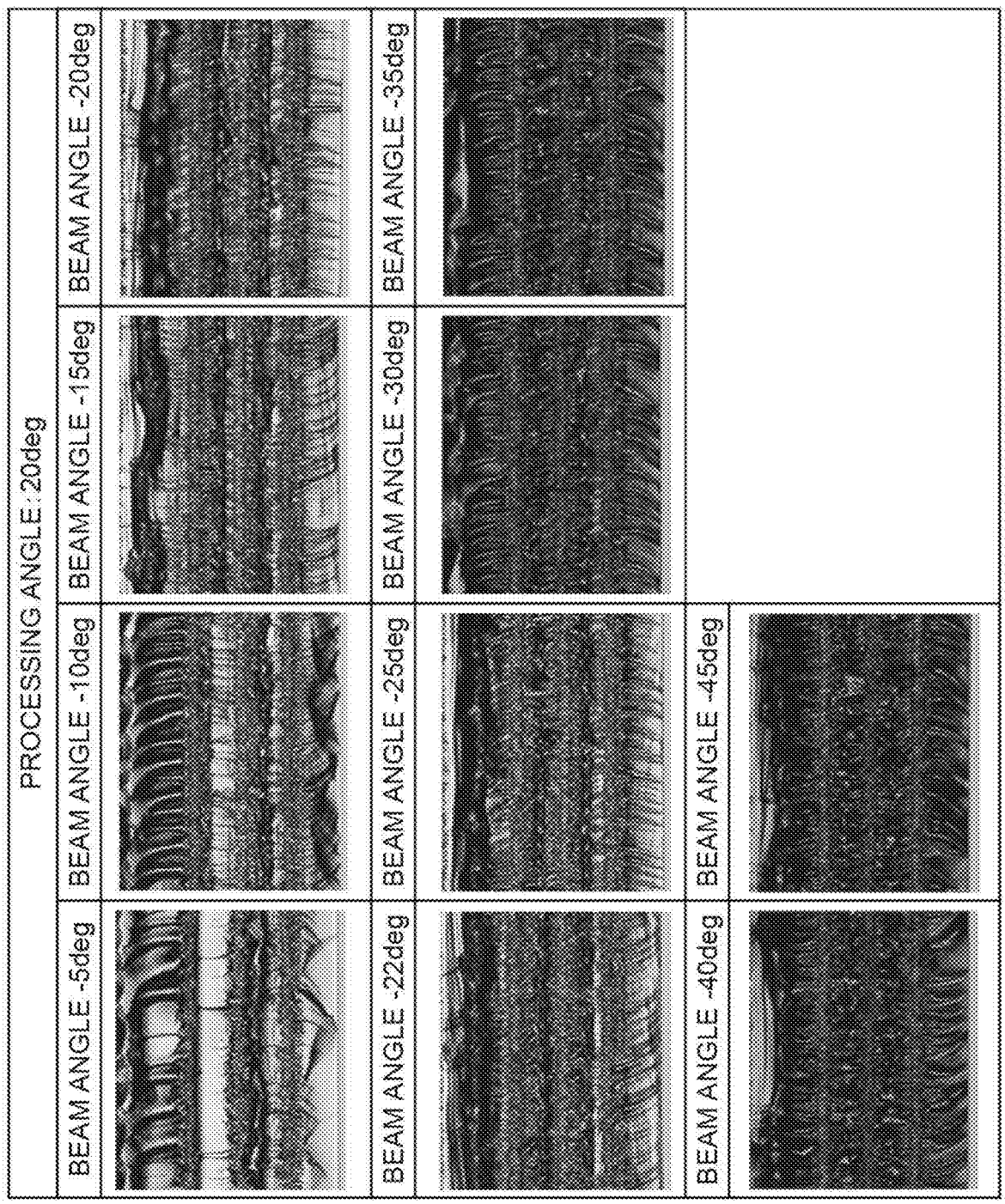
FIG. 44 is a photographic view illustrating trimmed surfaces of targets according to the experimental results in FIG. 24.
Figure 45:
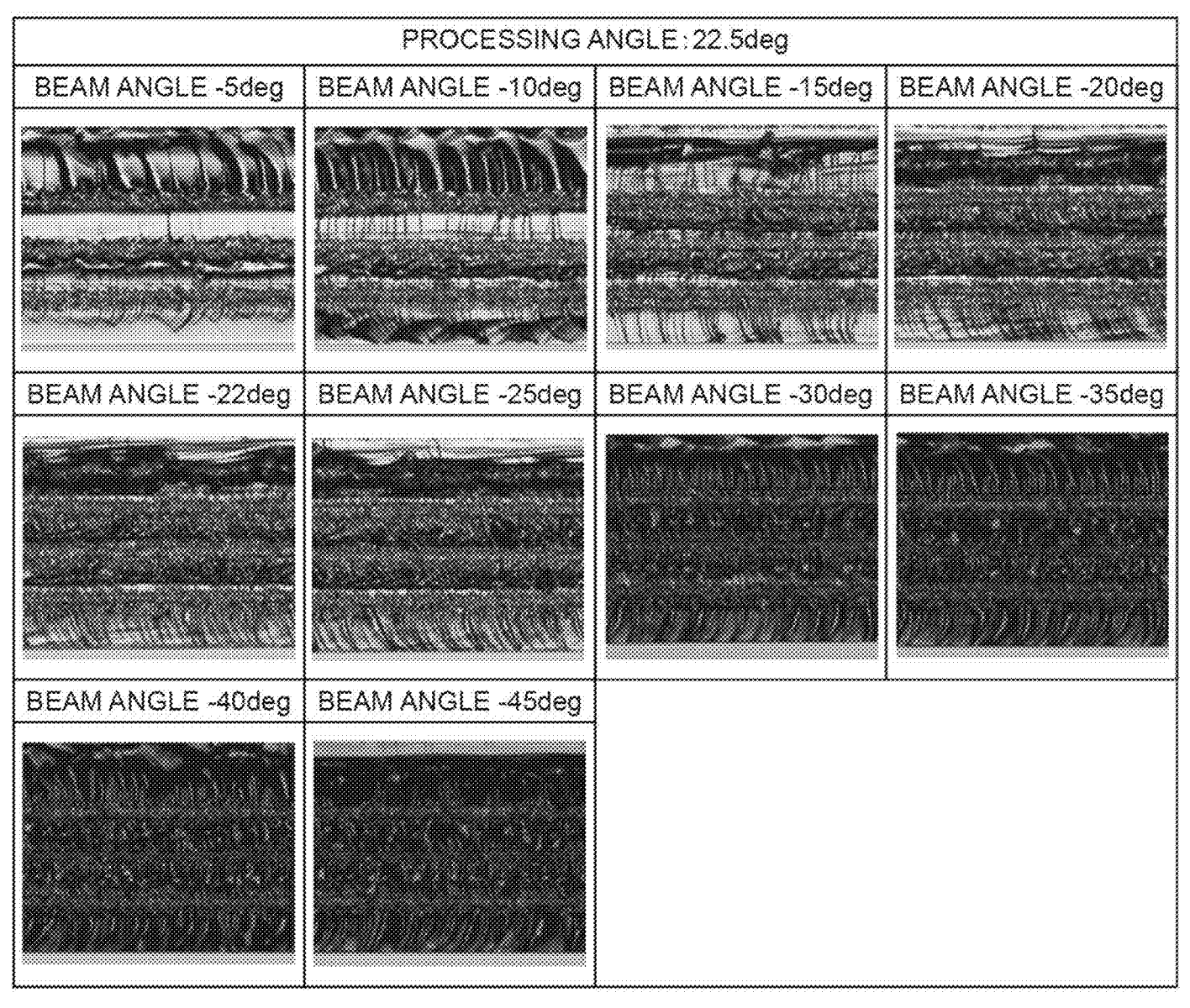
Figure 47:
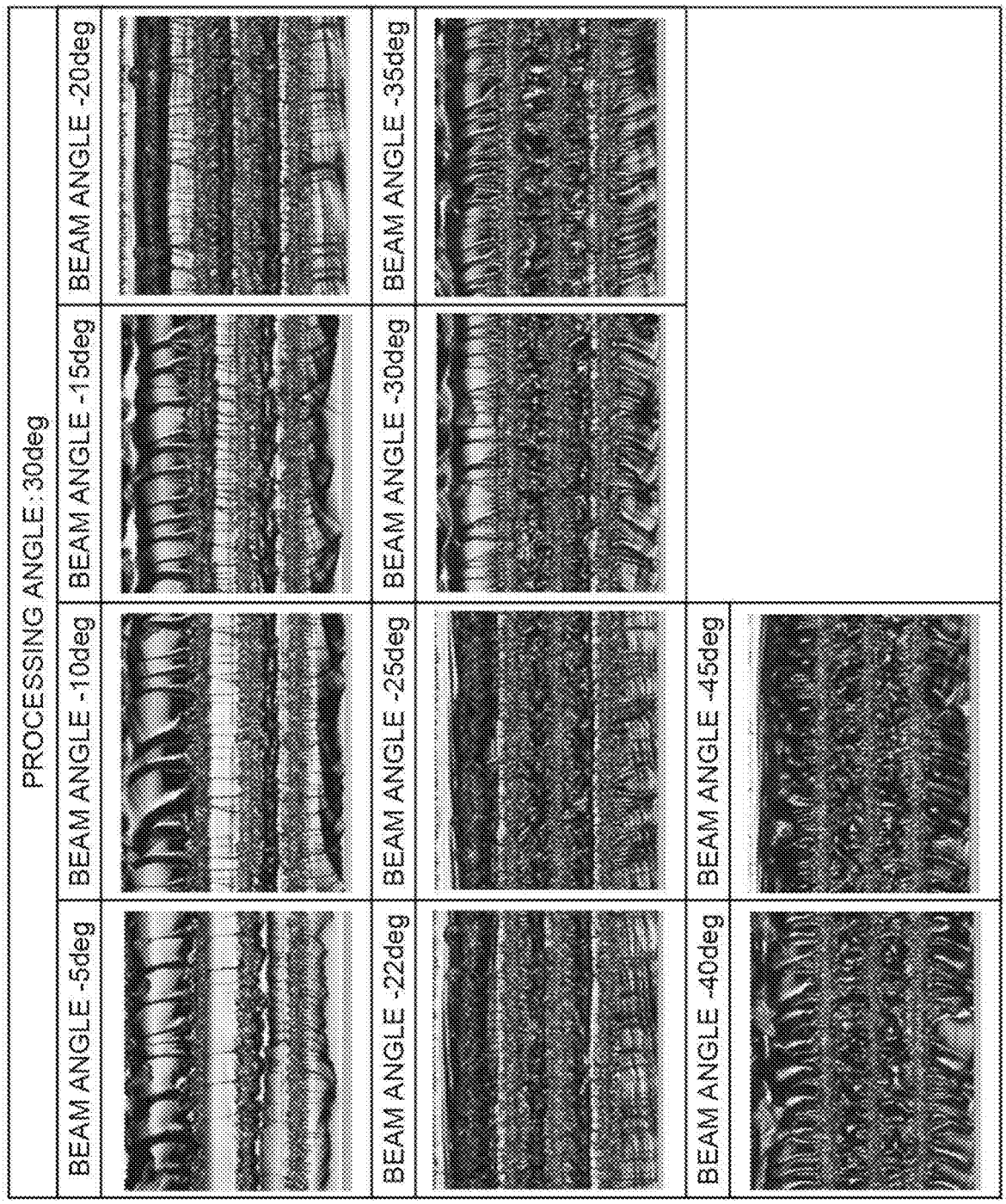
FIG. 47 is a photographic view illustrating trimmed surfaces of targets according to the experimental results in FIG. 24.
Figure 49:
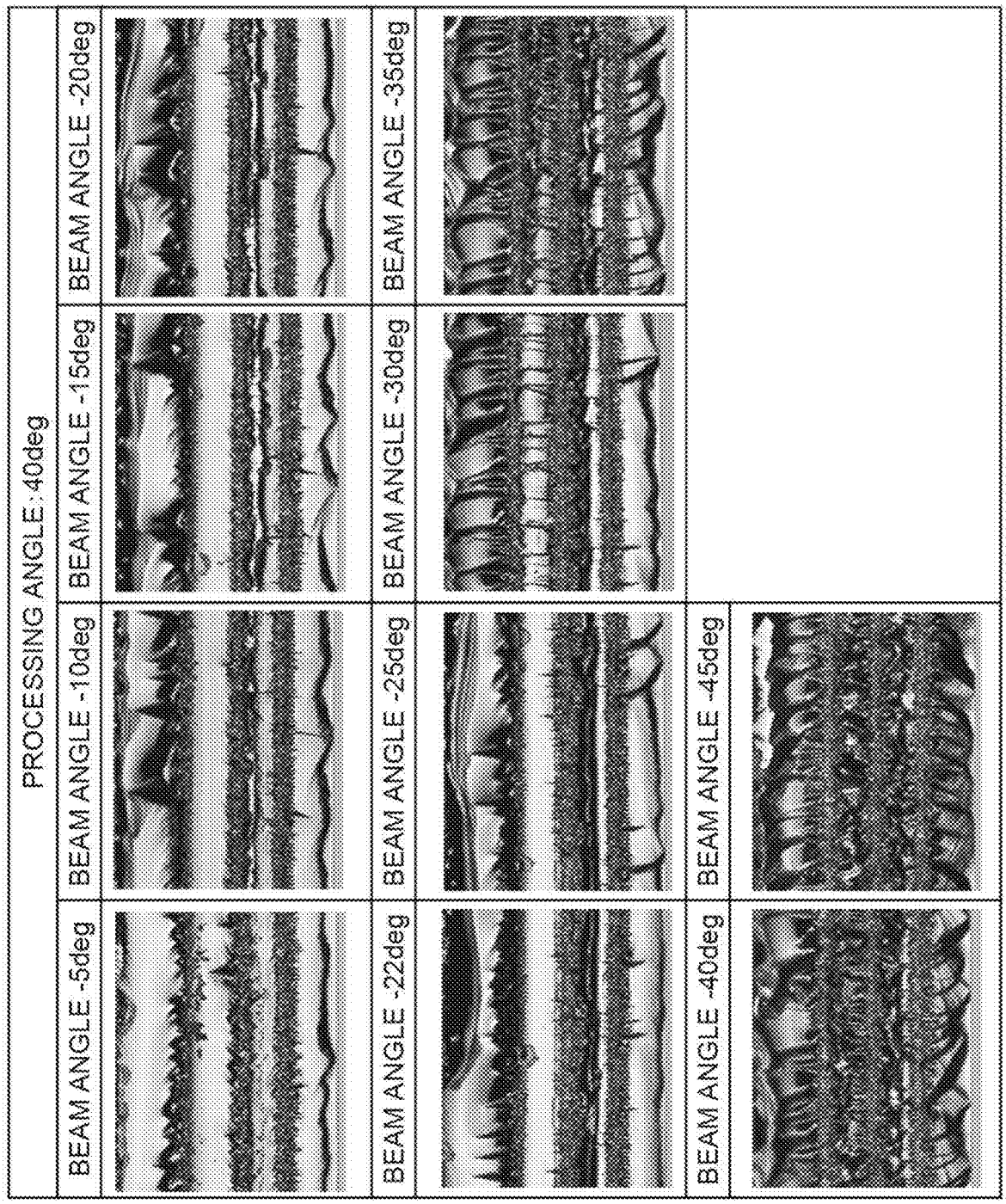
FIG. 49 is a photographic view illustrating trimmed surfaces of targets according to the experimental results in FIG. 24.

It can be seen in FIG. 24, FIG. 29, and FIG. 44 that when the processing angle α is 20°, very good processing quality is obtained when the beam angle β is 0° to 35°. It can be seen in FIG. 24, FIG. 30, and FIG. 45 that when the processing angle α is 22.5°, very good processing quality is obtained when the beam angle β is −5° to 30°.

Figure 31:
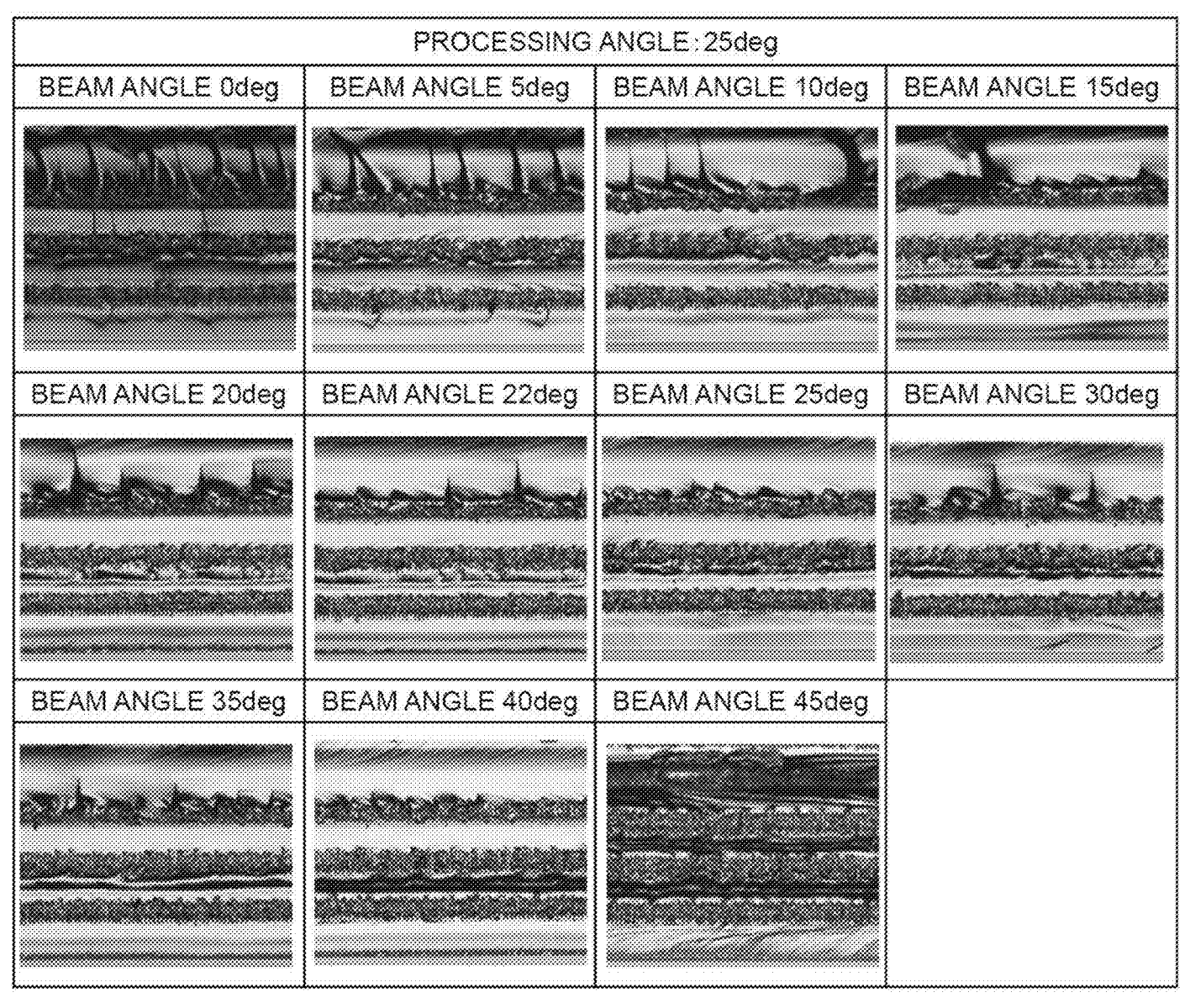
Figure 46:
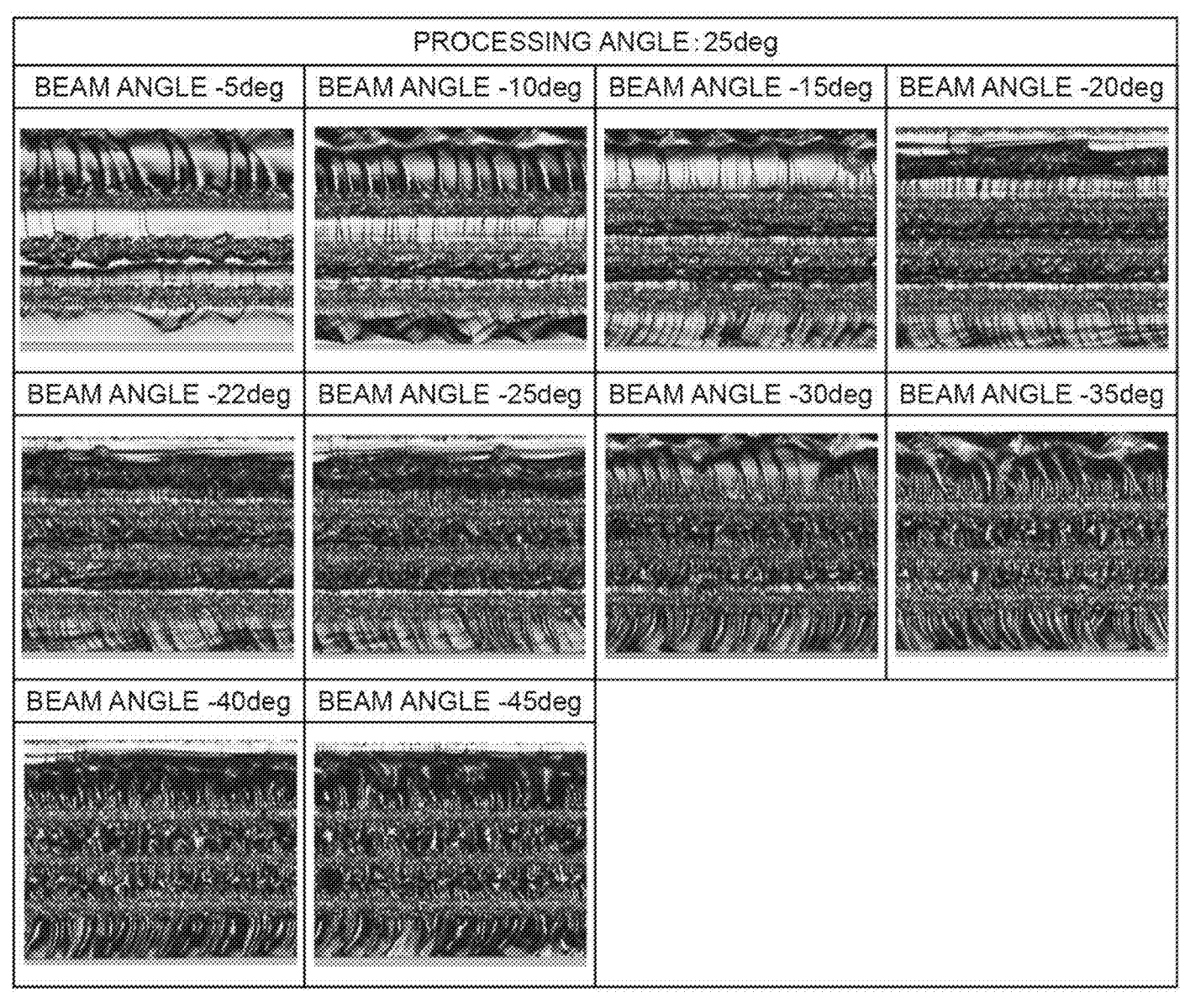

It can be seen in FIG. 24, FIG. 31, and FIG. 46 that when the processing angle α is 25°, very good processing quality is obtained when the beam angle β is 0° to 30°. It can be seen in FIG. 24, FIG. 32, and FIG. 47 that when the processing angle α is 30°, very good processing quality is obtained when the beam angle β is 0° to 10° and 22° to 25°.

Figure 33:
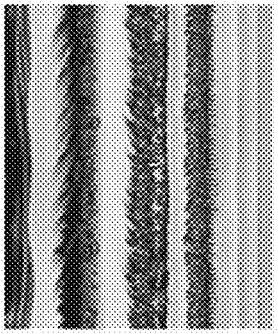
FIG. 33 is a photographic view illustrating trimmed surfaces of targets according to the experimental results in FIG. 24.

It can be seen in FIG. 24, FIG. 33, and FIG. 48 that when the processing angle α is 35°, very good processing quality is obtained when the beam angle β is 0° to 22°. It can be seen in FIG. 24, FIG. 34, and FIG. 49 that when the processing angle α is 40°, very good processing quality is obtained when the beam angle β is 0° to 10°.

Figure 35:
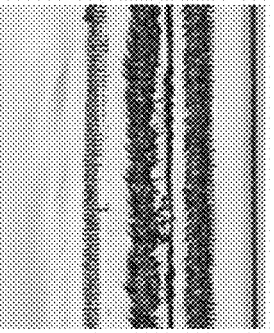
FIG. 35 is a photographic view illustrating trimmed surfaces of targets according to the experimental results in FIG. 24.
Figure 36:
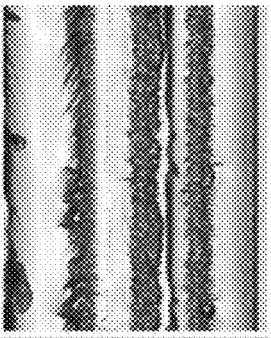
FIG. 36 is a photographic view illustrating trimmed surfaces of targets according to the experimental results in FIG. 24.
Figure 50:
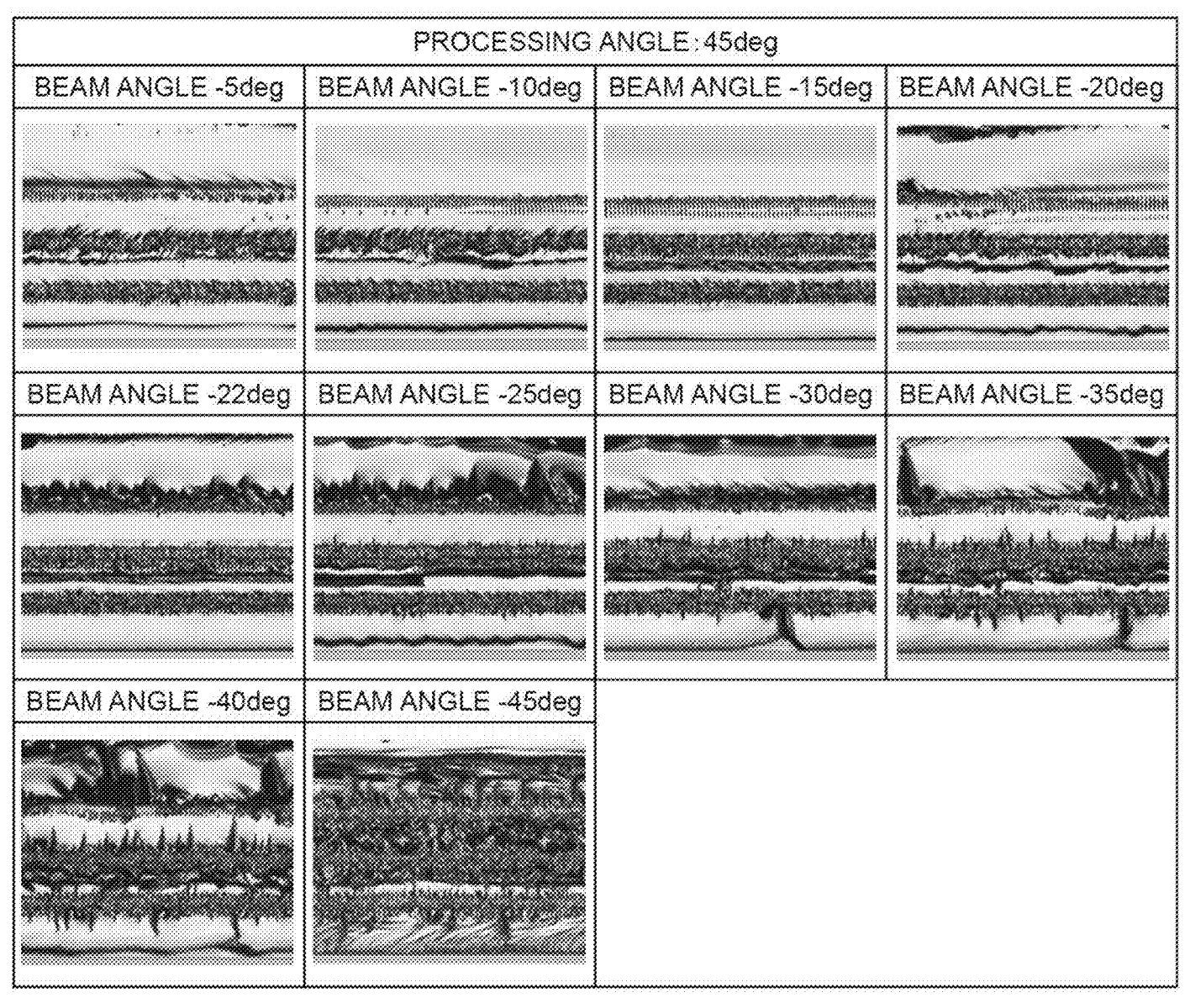

It can be seen in FIG. 24, FIG. 35, and FIG. 50 that when the processing angle α is 45°, very good processing quality is obtained when the beam angle β is −5° to 10° and −15° to −22°. It can be seen in FIG. 24, FIG. 36, and FIG. 51 that when the processing angle α is 50°, very good processing quality is obtained when the beam angle β is −5° to 0° and −15° to −22°.

Figure 37:
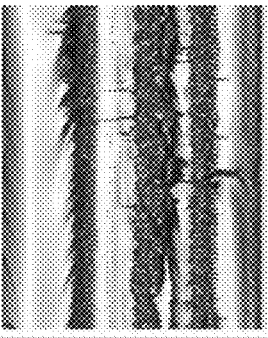
FIG. 37 is a photographic view illustrating trimmed surfaces of targets according to the experimental results in FIG. 24.
Figure 38:
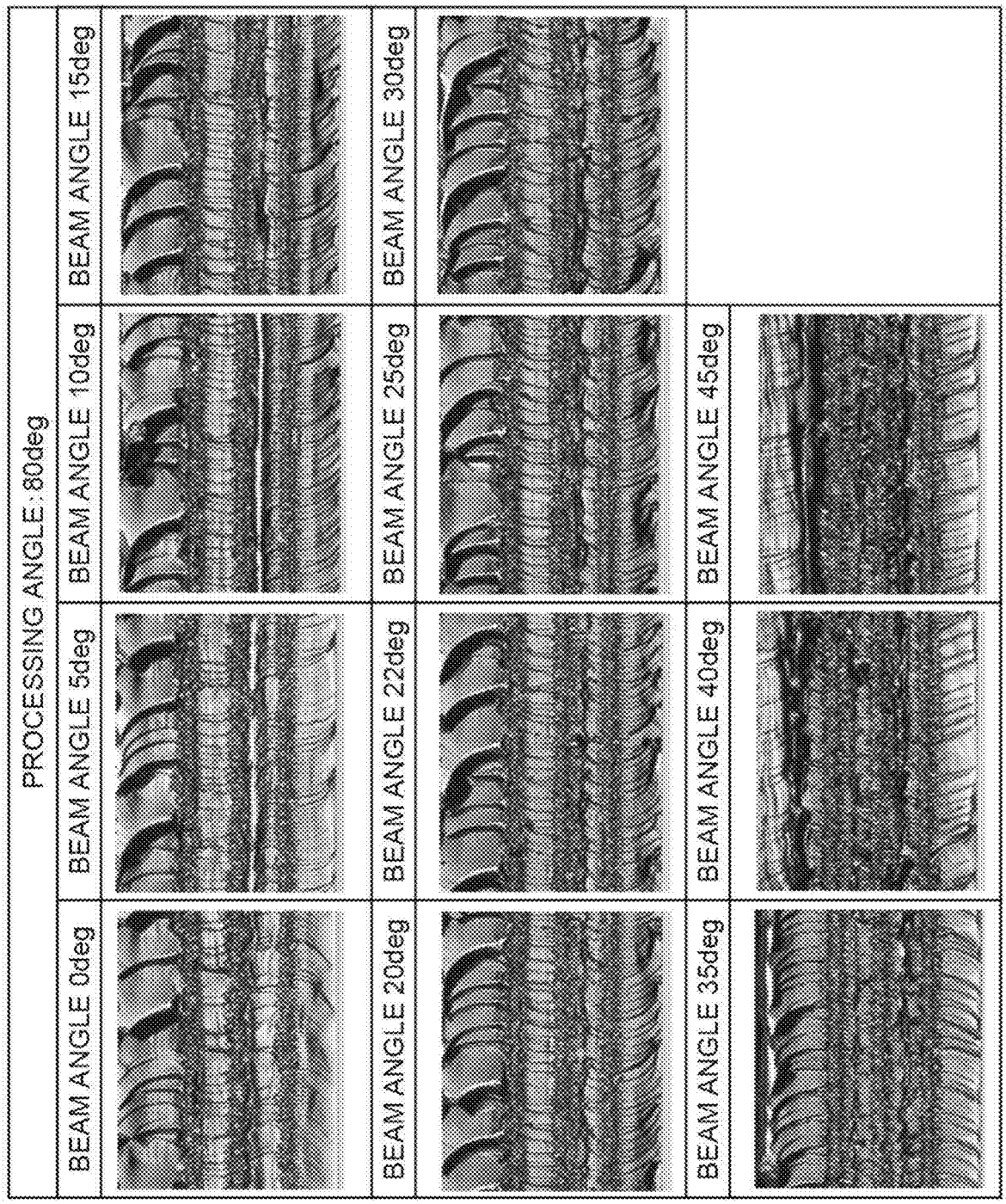
FIG. 38 is a photographic view illustrating trimmed surfaces of targets according to the experimental results in FIG. 24.
Figure 52:
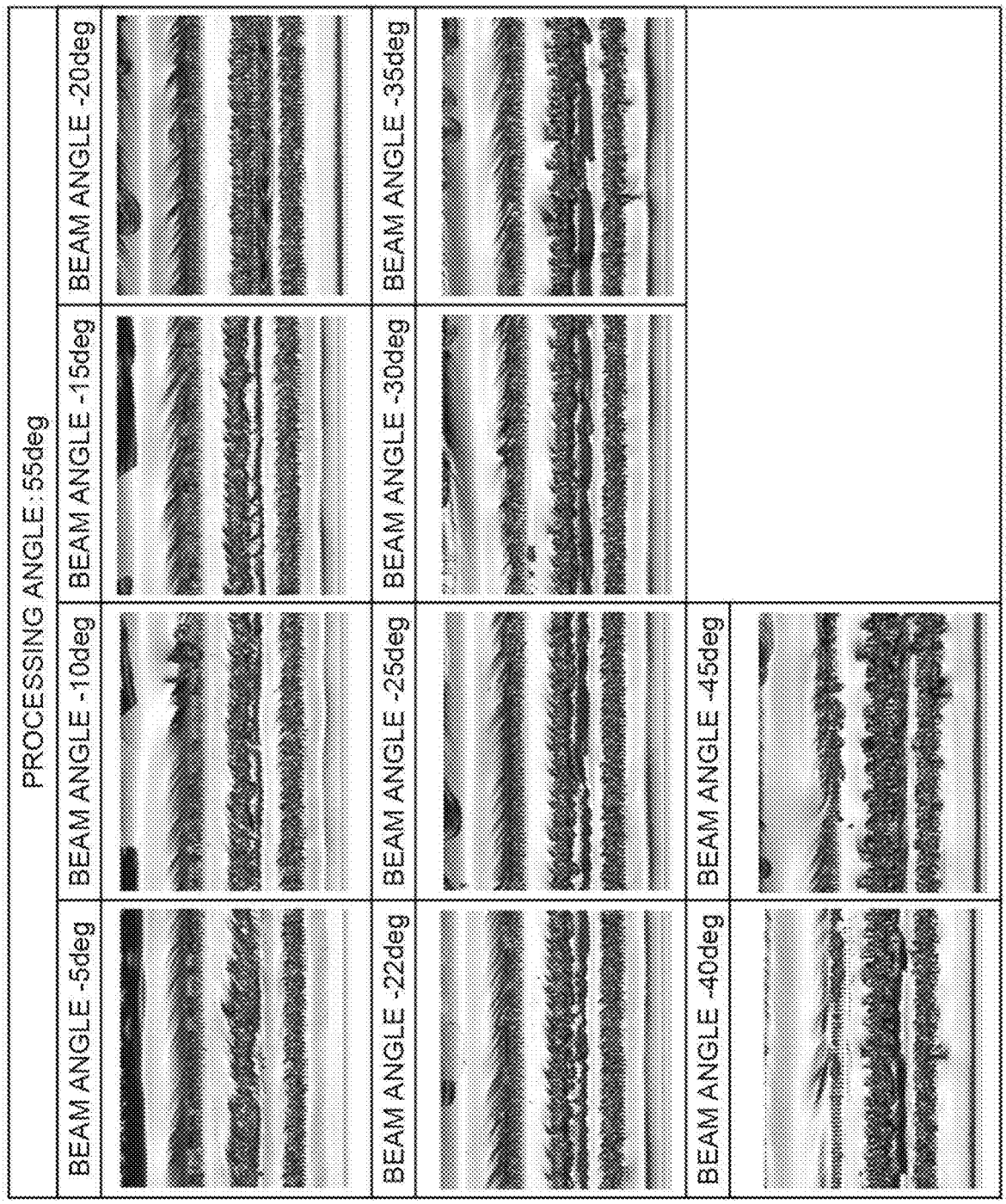
FIG. 52 is a photographic view illustrating trimmed surfaces of targets according to the experimental results in FIG. 24.
Figure 53:
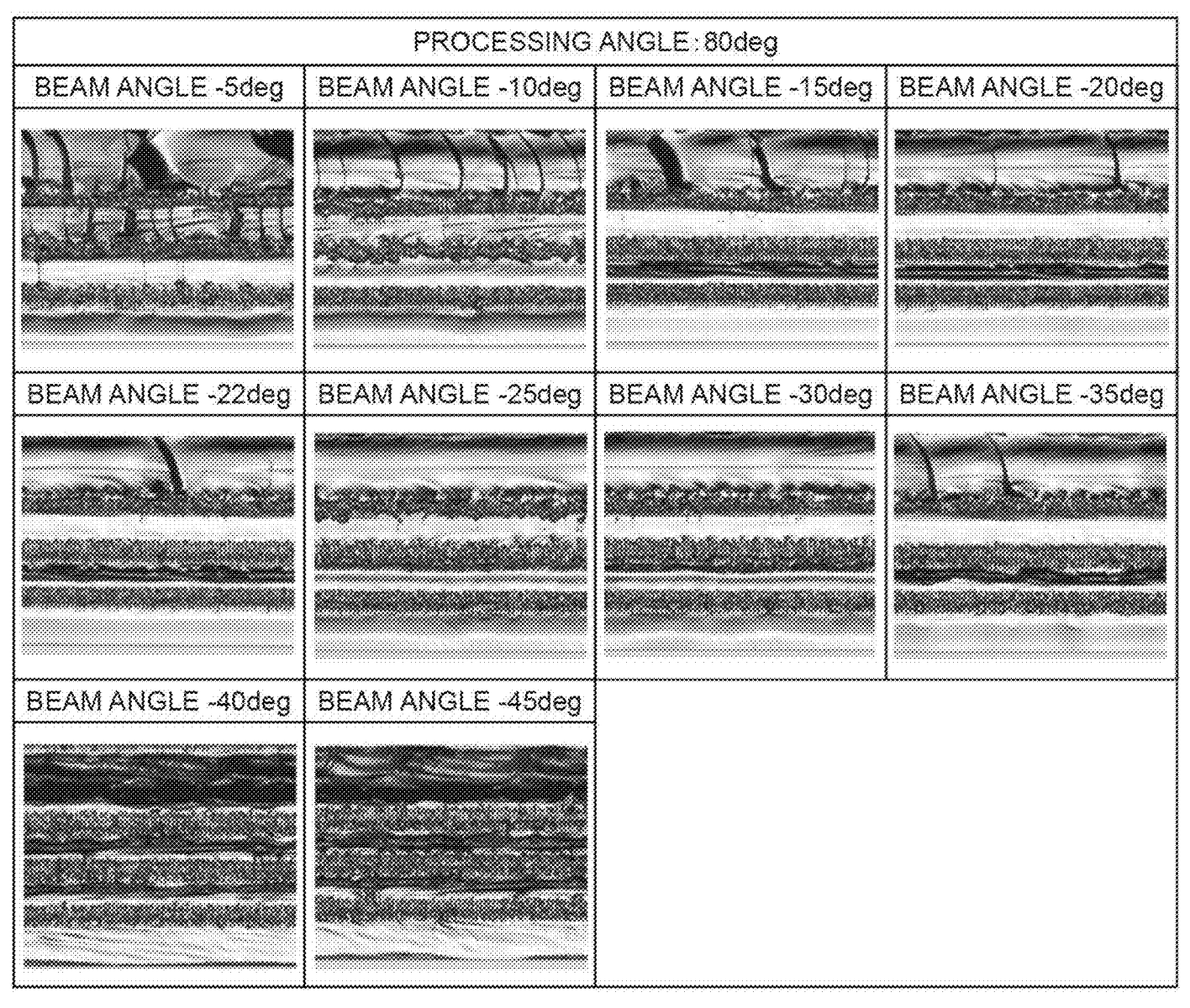

It can be seen in FIG. 24, FIG. 37, and FIG. 52 that when the processing angle α is 55°, very good processing quality is obtained when the beam angle β is −30° to 0° and −5. It can be seen in FIG. 24, FIG. 38, and FIG. 53 that when the processing angle α is 80°, very good processing quality is obtained when the beam angle β is −35° to 15°.

Figure 39:
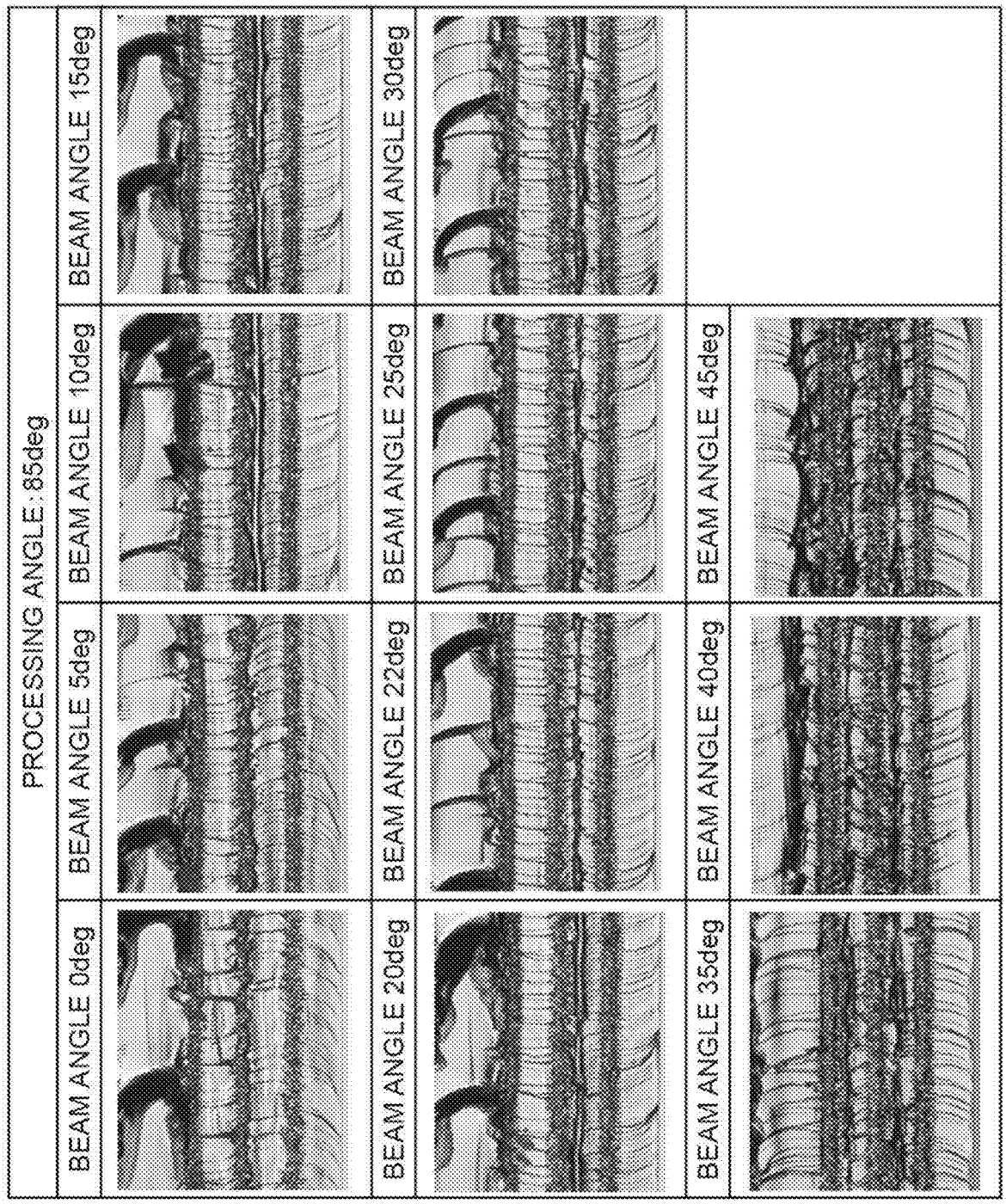
FIG. 39 is a photographic view illustrating trimmed surfaces of targets according to the experimental results in FIG. 24.
Figure 41:
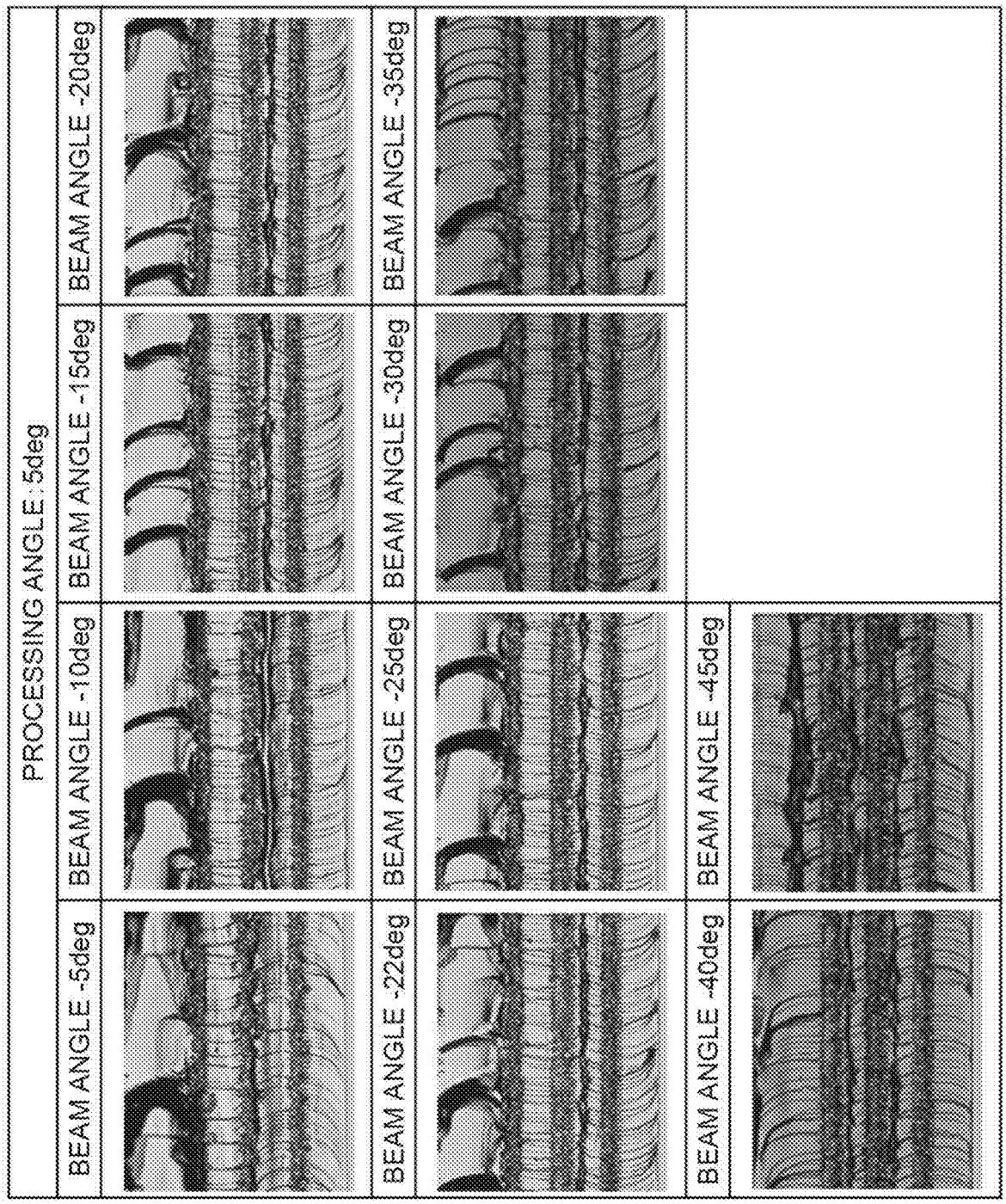
FIG. 41 is a photographic view illustrating trimmed surfaces of targets according to the experimental results in FIG. 24.
Figure 54:
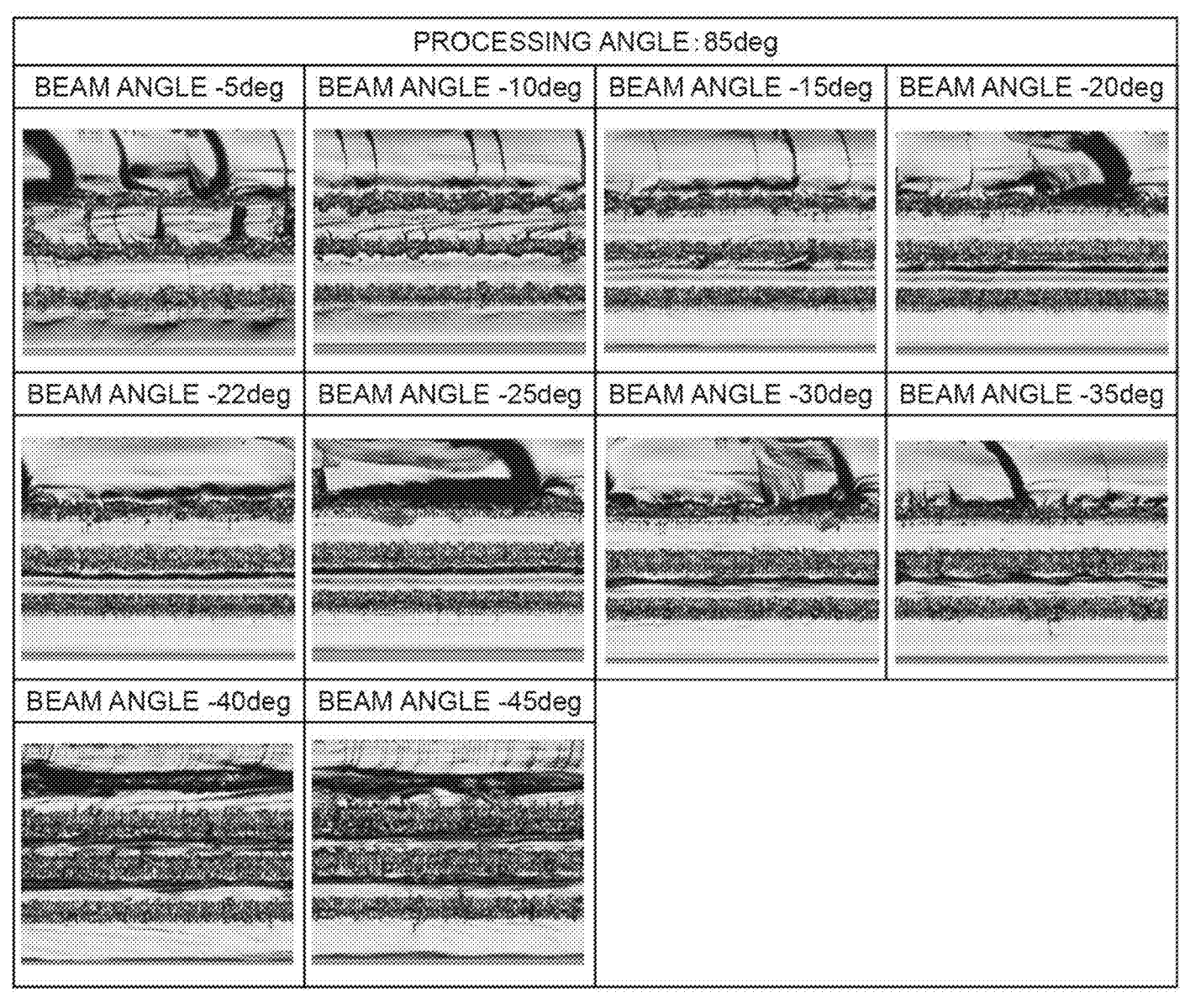

It can be seen in FIG. 24, FIG. 39, and FIG. 54 that when the processing angle α is 85°, very good processing quality is obtained when the beam angle β is −35° to 10°.

As can be seen in the results illustrated in FIGS. 24 to 54, when the processing angle α is 15° to 30° and 60° to 75°, the quality is slightly compromised if the longitudinal direction NH of the beam shape 71 matches the processing proceeding direction BD. It can be seen that in such cases, the beam angles β 0° to 35° are particularly effective for improving the processing quality in such processing angle ranges (15° to 30° and 60° to 75°). It can be seen that when the processing angle α is 5° to 15° and 75° to 85°, the quality is particularly compromised if the longitudinal direction NH of the beam shape 71 matches the processing proceeding direction BD. It can be seen that in such cases, the beam angles β 10° to 35° and −35° to −10° are particularly effective for improving the processing quality in such processing angle ranges (5° to 15° and 75° to 85°).

When the processing angle α is 0° or greater to 45°, the processing angle α of 5° to 15° results in a particularly deteriorated quality. In such a case, improvement in the processing quality is important, and thus the beam angle β may be 10° to 35° particularly providing improvement effect in such a case. When the processing angle α is 45° or greater and less than 90°, the processing angle α of 75° to 85° results in a particularly deteriorated quality. In such a case, improvement in the processing quality is important, and thus the beam angle β may be −35° to −10° particularly providing improvement effect in such a case.

Second Embodiment

Next, a laser processing apparatus according to a second embodiment will be described. In the description of the second embodiment, the points different from those in the first embodiment will be described, and the description that is given in the first embodiment will not be redundantly given.

The processing controller 9c of the present embodiment performs an orbit process of forming an annular modified region 4 along the line M3, by relatively moving the first focusing point P1 along the line M3 to form a single circle in the target 100. In the orbit process, the first laser light L1 is emitted with the first focusing point P1 positioned at a predetermined position of the target 100 in the Z direction while rotating the stage 107. When the stage 107 makes a single turn (360° turn) after the emission of the first laser light L1 has started, the emission stops, whereby the annular modified region 4 along the line M3 is formed.

The adjustment portion 9d of the present embodiment adjusts the orientation of the longitudinal direction NH to be an orientation determined by the determination portion 9b, while the first focusing point P1 is relatively moving along the line M3. Specifically, while the processing controller 9c performs the orbit process to relatively move the first focusing point P1 along the line M3 to draw a single circle, the adjustment portion 9d switches the orientation of the longitudinal direction NH in real time to be the first orientation (see FIGS. 55(b) and 57(b)) when the first focusing point P1 is positioned in the first region M31, and to be the second orientation (see FIGS. 56(b) and 58(b)) when the first focusing point P1 is positioned in the second region M32.

The laser processing apparatus 101 of the present embodiment performs the following trimming processing for example.

As illustrated in FIG. 55(a), the first laser light L1 is emitted while rotating the stage 107, to relatively move the first focusing point P1 along the first region M31 of the line M3. As a result, the modified region 4 is formed along the first region M31 at a predetermined position of the target 100 in the Z direction. In this case, the orientation of the beam shape 71 is adjusted by the adjustment portion 9d to be the first orientation as illustrated in FIG. 55(b).

When the first focusing point P1 moves from the first region M31 to the second region M32, the adjustment portion 9d adjusts the orientation of the beam shape 71 to be the second orientation as illustrated in FIG. 56(b) (adjustment process). As illustrated in FIG. 56(a), the first laser light L1 is emitted while the stage 107 continues to be rotated, to relatively move the first focusing point P1 along the second region M32 of the line M3. As a result, the modified region 4 is formed along the second region M32 at a predetermined position of the target 100 in the Z direction.

When the first focusing point P1 moves from the second region M32 to the first region M31, the adjustment portion 9d adjusts the orientation of the beam shape 71 to be the first orientation as illustrated in FIG. 57(b) (adjustment process). As illustrated in FIG. 57(a), the first laser light L1 is emitted while the stage 107 continues to be rotated, to relatively move the first focusing point P1 along the first region M31 of the line M3. As a result, the modified region 4 is formed along the first region M31 at a predetermined position of the target 100 in the Z direction.

Figure 58:
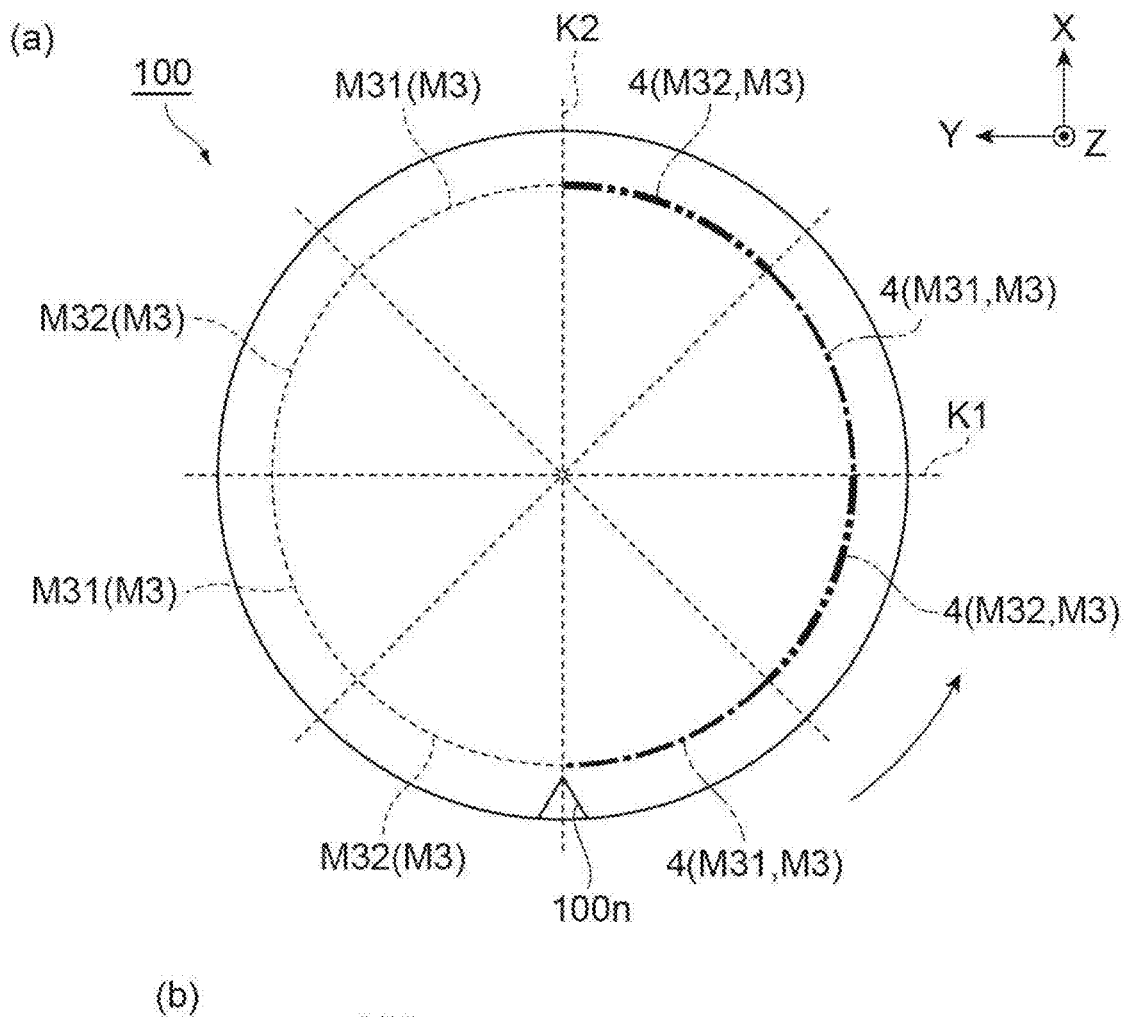
FIG. 58(a) is a plan view of the target continuing from FIG. 57(a).
FIG. 58(b) is a diagram illustrating a beam shape during laser processing in FIG. 58(a).

When the first focusing point P1 moves from the first region M31 to the second region M32, the adjustment portion 9d adjusts the orientation of the beam shape 71 to be the second orientation as illustrated in FIG. 58(b) (adjustment process). As illustrated in FIG. 58(a), the first laser light L1 is emitted while the stage 107 continues to be rotated, to relatively move the first focusing point P1 along the second region M32 of the line M3. As a result, the modified region 4 is formed along the second region M32 at a predetermined position of the target 100 in the Z direction. Such movement of the first focusing point P1 along the first region M31 and the second region M32 is repeated until the stage 107 makes a single turn (360° turn) after the emission of the first laser light L1 has started, and then the emission is stopped.

The laser processing is repeatedly performed with the Z direction position of the predetermined trimming position changed. Through the above process, a plurality of rows of the modified regions 4 are formed in the Z direction along the line M3 at the circumferential edge of the effective region R in the target 100.

In the laser processing apparatus 101 of the present embodiment described above, while the first focusing point P1 is relatively moved along the line M3, the orientation of the longitudinal direction NH of the beam shape 71 is adjusted to be an orientation intersecting with the processing proceeding direction BD and is determined based on the target information and the line information. Thus, when the quality of the trimmed surface locally deteriorates due to the physical property of the target 100 for example as a result of simply relatively moving the first focusing point P1 along the line M3 with the longitudinal direction NH matching the processing proceeding direction BD, such a deterioration of the quality of the trimmed surface can be suppressed. Thus, local deterioration of the quality of the trimmed surface of the target 100 from which the removal region E as the outer edge portion has been removed can be suppressed.

In particular, in the present embodiment, the orientation of the longitudinal direction NH can be changed in real time to an orientation determined based on the target information and the line information, while forming the modified region 4 along the line M3. The deterioration of the quality of the trimmed surface can be suppressed while achieving a better takt time.

In the laser processing apparatus 101 of the present embodiment, the determination portion 9b determines the first orientation which is an orientation of the longitudinal direction NH for relatively moving the first focusing point P1 along the first region M31 of the line M3, and the second orientation which is an orientation of the longitudinal direction NH for relatively moving the first focusing point P1 along the second region M32 of the line M3. The adjustment portion 9d adjusts the longitudinal direction NH to be the first orientation when the first focusing point P1 is positioned in the first region M31, while the first focusing point P1 relatively moves along the line M3. The adjustment portion 9d adjusts the orientation of the longitudinal direction NH to be the second orientation when the first focusing point P1 is positioned in the second region M32. Thus, deterioration of the quality of the trimmed surface of the target 100 can be more reliably suppressed in each of the first region M31 and the second region M32.

In the laser processing method performed by the laser processing apparatus 101, while the first focusing point P1 is relatively moved along the line M3, the orientation of the longitudinal direction NH of the beam shape 71 is adjusted to be an orientation intersecting with the processing proceeding direction BD and is determined based on the target information and the line information. Thus, when the quality of the trimmed surface locally deteriorates due to the physical property of the target 100 for example as a result of simply relatively moving the first focusing point P1 along the line M3 with the longitudinal direction NH matching the processing proceeding direction BD, such a deterioration of the quality of the trimmed surface can be suppressed. Thus, local deterioration of the quality of the trimmed surface of the target 100 from which the removal region E as the outer edge portion has been removed can be suppressed.

A timing at which the orientation of the beam shape 71 is switched in the present embodiment is a timing when the first focusing point P1 is positioned at or in the vicinity of each of the points on the line M3 corresponding to 0°, 45°, 90°, 135°, 180°, and 225°, where the 0° point is one point where the line M3 and the second crystal orientation K2 are orthogonal to each other. With this configuration, the orientation of the beam shape 71 can be switched at a timing when the beam angle β is less likely to affect the processing quality.

The orientation of the beam shape 71 is switched, with a change in the beam angle β not exceeding ±35°. When the orientation of the beam shape 71 is changed, the beam shape 71 may be rotated clockwise and counterclockwise. In the example illustrated in FIG. 59(a), the beam shape 71 is rotated clockwise, with a change in the beam angle β not exceeding ±35°. This is because as in the example illustrated in FIG. 59(b), switching of the orientation of the beam shape 71 with the beam angle β changed by ±35° results in a deteriorated processing quality. Switching of the orientation of the beam shape 71 using the reflective spatial light modulator 34 leads to immediate change in the beam angle β, and thus may be free of the above described limitation on the switching of the beam angle β.

Third Embodiment

Next, a laser processing apparatus according to a third embodiment will be described. In the description of the third embodiment, the points different from those in the second embodiment will be described, and the description that is given in the second embodiment will not be redundantly given.

Based on the target information and line information acquired by the acquisition unit 9a, the determination portion 9b of the present embodiment determines the orientation of the longitudinal direction NH for each processing angle α when relatively moving the first focusing point P1 along the line M3. As an example, the determination portion 9b determines the orientation of the longitudinal direction NH to be an orientation that corresponds to the processing angle α, and is inclined with respect to the processing proceeding direction BD, toward one of the first crystal orientation K1 and the second crystal orientation K2 forming a larger angle with the processing proceeding direction BD. When the processing angle α is 0° or more and less than 22.5°, the determination portion 9b determines the orientation of the longitudinal direction NH to increase the beam angle β on the positive side as the processing angle α increases. When the processing angle α is 22.5° or more and less than 45°, the orientation of the longitudinal direction NH is determined to reduce the beam angle β on the positive side as the processing angle α increases. When the processing angle α is 45° or more and less than 67.5°, the orientation of the longitudinal direction NH is determined to increase the beam angle β on the negative side as the processing angle α increases. When the processing angle α is 67.5° or more and less than 90°, the orientation of the longitudinal direction NH is determined to reduce the beam angle β on the negative side (toward 0) as the processing angle α increases.

The adjustment portion 9d of the present embodiment adjusts the orientation of the longitudinal direction NH in a continuously changing manner, while the first focusing point P1 is relatively moving along the line M3. The adjustment portion 9d implements continuous change until the orientation determined by the determination portion 9b is achieved in accordance with the processing angle α, while the first focusing point P1 relatively moves along the line M3.

The laser processing apparatus 101 of the present embodiment performs the following trimming processing for example.

The orientation of the longitudinal direction NH while the first focusing point P1 relatively moves along the line M3 is determined in accordance with the processing angle α by the determination portion 9b, for each processing angle α (determination step). The first laser light L1 is emitted while rotating the stage 107, to relatively move the first focusing point P1 along the line M3. As a result, the modified region 4 is formed along the line M3 at a predetermined position of the target 100 in the Z direction.

Here, the orientation of the longitudinal direction NH is continuously changed to be an orientation determined in accordance with the processing angle α (adjustment step). As illustrated in FIGS. 60(a) and 60(b), for example, when the processing angle α is 0° (when the first focusing point P1 is located at a point Q1 on the line M3 corresponding to 0°), the orientation of the beam shape 71 is adjusted to be an orientation with the beam angle β of 0°. As illustrated in FIGS. 61(a) and 61(b), for example, when the processing angle α is 5° to 15° (when the first focusing point P1 is located at a point Q2 on the line M3 corresponding to 5° to 15°), the orientation of the beam shape 71 is adjusted to be an orientation with the beam angle β of 10° to 35°.

As illustrated in FIGS. 62(a) and 62(b), for example, when the processing angle α is 45° (when the first focusing point P1 is located at a point Q3 on the line M3 corresponding to 0°), the orientation of the beam shape 71 is adjusted to be an orientation with the beam angle β of 0°. When the processing angle α is 45°, the crack advancement force due to the first crystal orientation K1 and the crack advancement force due to the second crystal orientation K2 are balanced (because they pull each other). Thus, the orientation of the beam shape 71 needs not to be inclined with respect to the processing proceeding direction BD.

As illustrated in FIGS. 63(a) and 63(b), for example, when the processing angle α is 75° to 85° (when the first focusing point P1 is located at a point Q4 on the line M3 corresponding to 75° to 85°), the orientation of the beam shape 71 is adjusted to be an orientation with the beam angle β of −35° to −10°.

Figure 64:
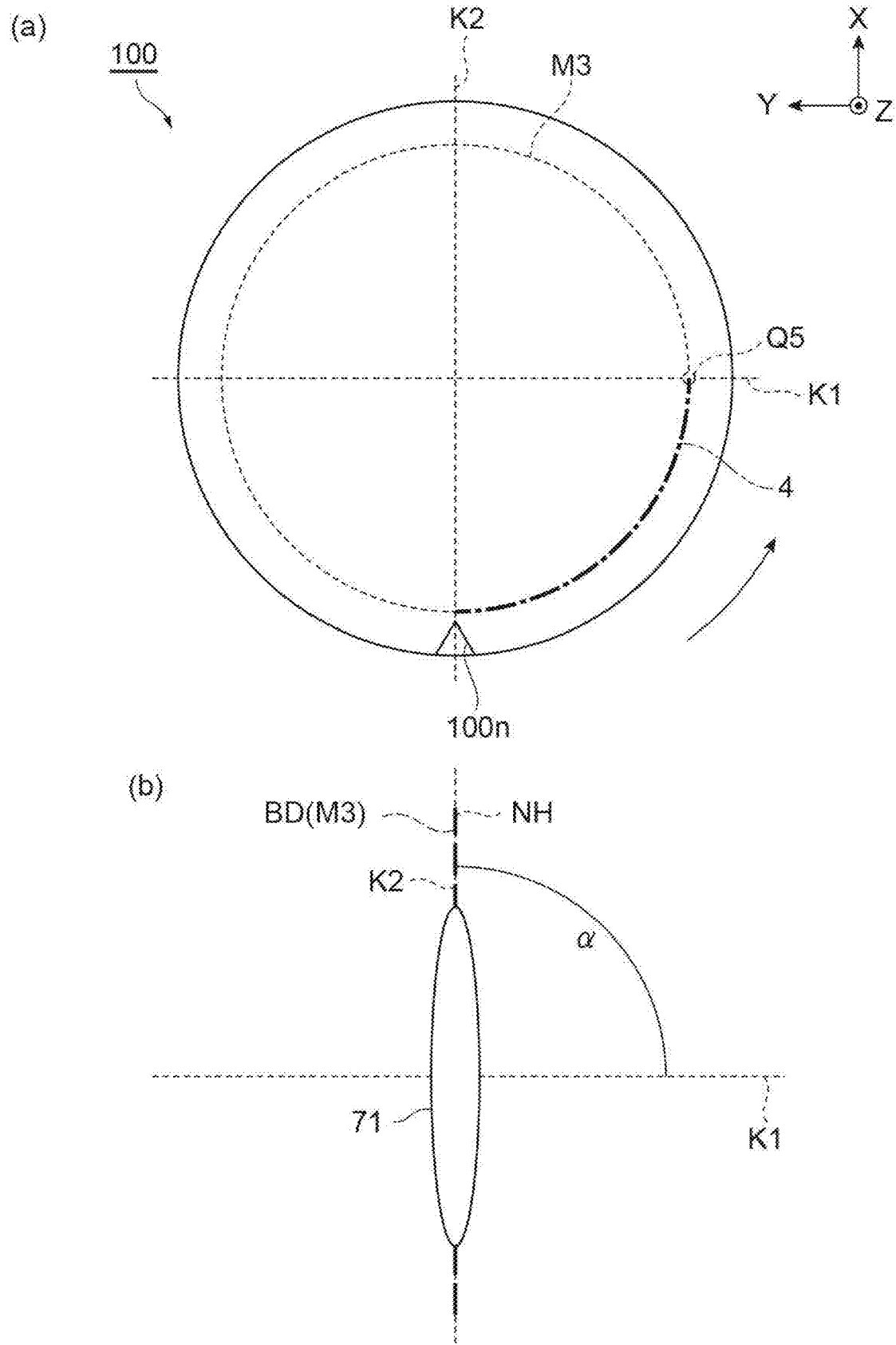
FIG. 64(a) is a plan view of the target continuing from FIG. 63(a).
FIG. 64(b) is a diagram illustrating a beam shape during laser processing in FIG. 64(a).

As illustrated in FIGS. 64(a) and 64(b), for example, when the processing angle α is 90° (when the first focusing point P1 is located at a point Q5 on the line M3 corresponding to 90°), the orientation of the beam shape 71 is adjusted to be an orientation with the beam angle β of 0°. Such movement of the first focusing point P1 along the line M3 is repeated until the stage 107 makes a single turn (360° turn) after the emission of the first laser light L1 has started, and then the emission is stopped.

The laser processing is repeatedly performed with the Z direction position of the predetermined trimming position changed. Through the above process, a plurality of rows of the modified regions 4 are formed in the Z direction along the line M3 at the circumferential edge of the effective region R in the target 100.

Also with the laser processing apparatus 101 of the present embodiment described above, local deterioration of the quality of the trimmed surface of the target 100 from which the removal region E as the outer edge portion has been removed can be suppressed.

The adjustment portion 9d of the laser processing apparatus 101 of the present embodiment adjusts the orientation of the longitudinal direction NH in a continuously changing manner, while the first focusing point P1 is relatively moving along the line M3. Thus, deterioration of the quality of the trimmed surface of the target 100 can be more reliably suppressed in each part on the line M3.

The target of the laser processing apparatus 101 of the present embodiment is a wafer having a (100) plane as the principal plane, and has the first crystal orientation K1 and the second crystal orientation K2. The orientation of the longitudinal direction NH when the first focusing point P1 relatively moves along the line M3 is determined by the determination portion 9b, for each processing angle α. The adjustment portion 9d implements continuous change until the orientation determined by the determination portion 9b is achieved in accordance with the processing angle α, while the first focusing point P1 relatively moves along the line M3. Thus, even when the target 100 is a wafer having the (100) plane as the principal plane, deterioration of the quality of the trimmed surface of the target 100 can be more reliably suppressed in each part on the line M3.

Fourth Embodiment

Next, a laser processing apparatus according to a fourth embodiment will be described. In the description of the fourth embodiment, the points different from those in the third embodiment will be described, and the description that is given in the third embodiment will not be redundantly given.

Figure 65:
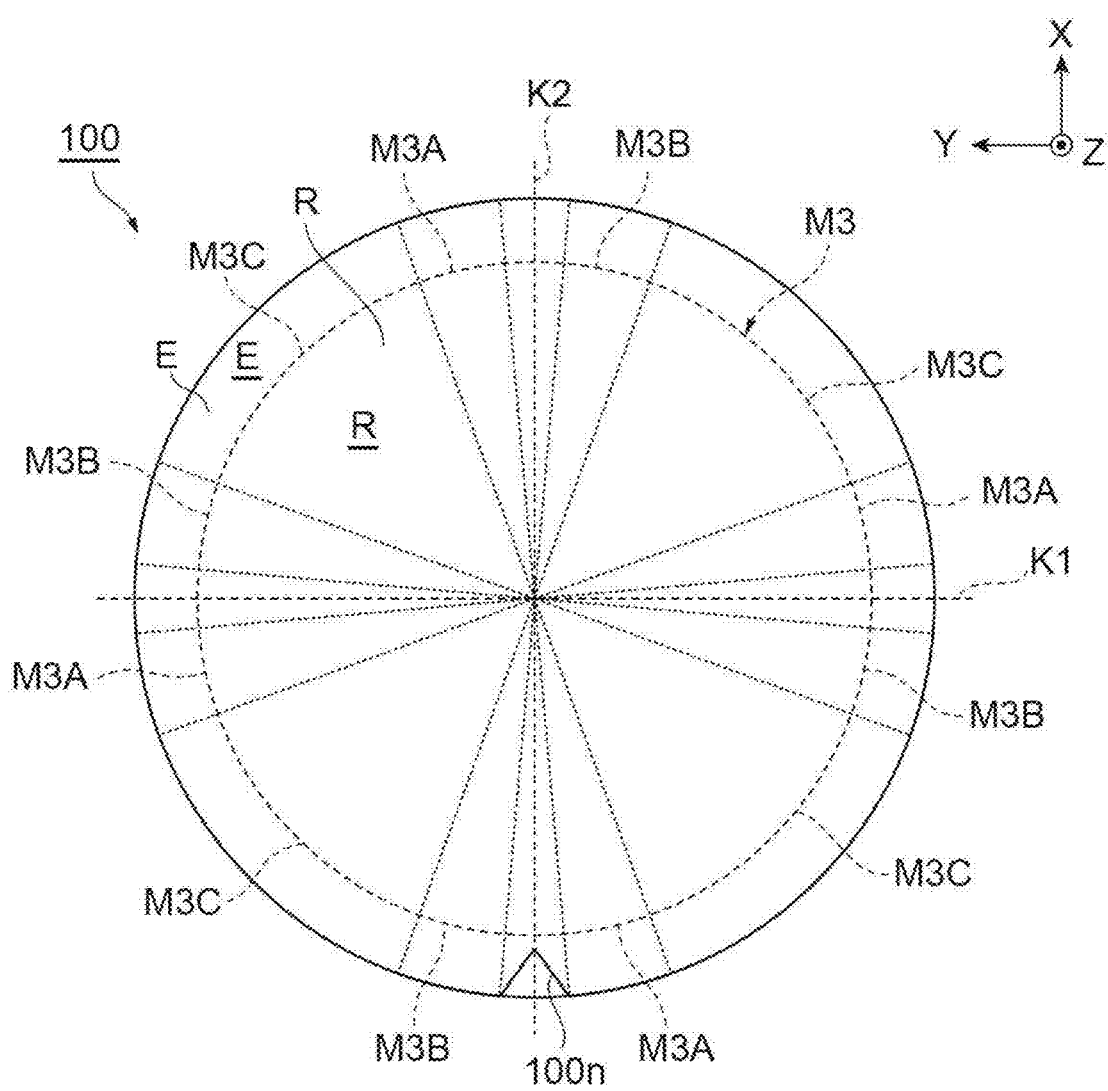
FIG. 65 is a plan view of a target which is a subject of trimming processing according to a fourth embodiment.

As illustrated in FIG. 65, the line M3 includes a first portion M3A, a second portion M3B, and a third portion M3C. The first portion M3A includes a part between the 5° point and the 15° point, a part between the 95° point and the 105° point, a part between the 185° point and the 195° point, and a part between the 275° point and before the 285° point, where the 0° point is one point where the line M3 orthogonally intersects with the second crystal orientation K2. The second portion M3B is a portion of the line M3 separated from the first portion M3A. The second portion M3B includes a part between the 75° point and the 85° point, a part between the 145° point and the 175° point, a part between the 55° point and the 85° point, and a part between the 55° point and before the 85° point, where the 0° point is one point where the line M3 orthogonally intersects with the second crystal orientation K2. The third portion M3C id s portion positioned between the first portion M3A and the second portion M3B.

The determination portion 9b of the present embodiment determines the orientation of the longitudinal direction NH in the first portion M3A to be the first orientation to intersect with the processing proceeding direction BD, based on the target information and the line information acquired by the acquisition unit 9a. The determination portion 9b determines the orientation of the longitudinal direction NH in the second portion M3B to be the second orientation to intersect with the processing proceeding direction BD, based on the target information and the line information.

The adjustment portion 9d of the present embodiment adjusts the orientation of the longitudinal direction NH in the first portion M3A to be the first orientation determined. The adjustment portion 9d adjusts the orientation of the longitudinal direction NH in the second portion M3B to be the second orientation determined. The adjustment portion 9d changes the orientation of the longitudinal direction NH from the first orientation to the second orientation in the third portion M3C of the line M3, when relatively moving the first focusing point P1 along the second portion M3B after the first focusing point P1 has been relatively moved along the first portion M3A.

The laser processing apparatus 101 of the present embodiment performs the following trimming processing for example.

Based on the target information and the line information, the determination portion 9b determines the orientation of the longitudinal direction NH in the first portion M3A of the line M3 to be the first orientation, and determines the orientation of the longitudinal direction NH in the second portion M3B of the line M3 to be the second orientation.

The adjustment portion 9d adjusts the orientation of the longitudinal direction NH to be the first orientation (see FIG. 66(b)). As illustrated in FIG. 66(a), the first laser light L1 is emitted while rotating the stage 107, to relatively move the first focusing point P1 of the beam shape 71 with the orientation of the longitudinal direction NH being in the first orientation, along the first portion M3A of the line M3. As a result, the modified region 4 is formed along the first portion M3A at a predetermined position of the target 100 in the Z direction.

Next, as illustrated in FIG. 67(a), the first laser light L1 is emitted while the stage 107 continues to be rotated, to relatively move the first focusing point P1 along the third portion M3C of the line M3. As a result, the modified region 4 is formed along the third portion M3C of the line M3 at a predetermined position of the target 100 in the Z direction. While the modified region 4 is formed along the third portion M3C, the adjustment portion 9d changes the orientation of the longitudinal direction NH from the first orientation to the second orientation as illustrated in FIG. 67(b).

Next, as illustrated in FIG. 68(a), the first laser light L1 is emitted while the stage 107 is continuously rotated, to relatively move the first focusing point P1 of the beam shape 71 with the orientation of the longitudinal direction NH being in the second orientation, along the second portion M3B of the line M3. As a result, the modified region 4 is formed along the second portion M3B at a predetermined position of the target 100 in the Z direction.

Next, the first laser light L1 is emitted while the stage 107 continues to be rotated, to relatively move the first focusing point P1 along the third portion M3C of the line M3. As a result, the modified region 4 is formed along the third portion M3C of the line M3 at a predetermined position of the target 100 in the Z direction. While the modified region 4 is formed along the third portion M3C, the adjustment portion 9d changes the orientation of the longitudinal direction NH from the second orientation to the first orientation.

Such movement of the first focusing point P1 along the line M3 is repeated until the stage 107 makes a single turn (360° turn) after the emission of the first laser light L1 has started, and then the emission is stopped. The laser processing is repeatedly performed with the Z direction position of the predetermined trimming position changed. Through the above process, a plurality of rows of the modified regions 4 are formed in the Z direction along the line M3 at the circumferential edge of the effective region R in the target 100.

With the laser processing apparatus 101 of the present embodiment, the first focusing point P1 relatively moves along the line M3, with the longitudinal direction NH of the beam shape 71 intersecting with the processing proceeding direction BD, in the first portion M3A of the line M3. Thus, when the quality of the trimmed surface in the first portion M3A of the line M3 deteriorates due to the physical property of the target 100 for example as a result of simply relatively moving the first focusing point P1 along the line M3 with the longitudinal direction NH of the beam shape 71 matching the processing proceeding direction BD, such a deterioration of the quality of the trimmed surface can be suppressed. Thus, also with the laser processing apparatus 101 of the present embodiment described above, local deterioration of the quality of the trimmed surface of the target 100 from which the removal region E as the outer edge portion has been removed can be suppressed.

The determination portion 9b of the laser processing apparatus 101 of the present embodiment determines the orientation of the longitudinal direction NH in the second portion M3B separated from the first portion M3A to be the second orientation to intersect with the processing proceeding direction BD, based on the target information and the line information acquired by the acquisition unit 9a. The adjustment portion 9d adjusts the orientation of the longitudinal direction NH in the second portion M3B to be the second orientation determined by the determination portion 9b. Thus, deterioration of the quality of the trimmed surface of the target 100 can be suppressed in each of the first portion M3A and the second portion M3B separated from each other.

The adjustment portion 9d of the laser processing apparatus 101 of the present embodiment changes the orientation of the longitudinal direction NH from the first orientation to the second orientation in the third portion M3C positioned between the first portion M3A and the second portion M3B, when relatively moving the first focusing point P1 along the second portion M3B after the first focusing point P1 has been relatively moved along the first portion M3A. Similarly, the adjustment portion 9d changes the orientation of the longitudinal direction NH from the second orientation to the first orientation in the third portion M3C positioned between the second portion M3B and the first portion M3A, when relatively moving the first focusing point P1 along the first portion M3A after the first focusing point P1 has been relatively moved along the second portion M3B.

Thus, deterioration of the quality of the trimmed surface of the target 100 can be more reliably suppressed in each of the first portion M3A and the second portion M3B separated from each other. Regarding the beam angle β, an optimum angle is set in the first portion M3A and the second portion M3B as important angle regions, and the switching can be implemented in the third portion M3C that is between the first portion M3A and the second portion M3B and is relatively less likely to be affected by the beam angle β. Better takt time and high processing quality can both be achieved.

The target 100 of the laser processing apparatus 101 of the present embodiment is a wafer having a (100) plane as the principal plane, and has the first crystal orientation K1 orthogonal to one (110) plane and the second crystal orientation K2 orthogonal to the other (110) plane. The line M3 extends annularly as viewed in a direction orthogonal to the principal plane. The first portion M3A includes a part from the 5° point to the 15° point, where the 0° point is defined as one point where the line M3 orthogonally intersects with the second crystal orientation K2. The second portion M3B includes a part from the 55° point to the 85° point. Thus, even when the target 100 is a wafer having the (100) plane as the principal plane, local deterioration of the quality of the trimmed surface of the target 100 can be suppressed.

In the laser processing apparatus 101 of the present embodiment, the first orientation and the second orientation are orientations of directions inclined with respect to the processing proceeding direction BD, toward one of the first crystal orientation K1 and the second crystal orientation K2 forming a larger angle with the processing proceeding direction BD (farther one). Thus, even when the target 100 is a wafer having the (100) plane as the principal plane, deterioration of the quality of the trimmed surface of the target 100 can be more reliably suppressed in the first portion M3A and the second portion M3B separated from each other.

In the laser processing apparatus 101 of the present embodiment, the first orientation and the second orientation are orientations of directions inclined with respect to the processing proceeding direction BD by 10° to 35°, toward one of the first crystal orientation K1 and the second crystal orientation K2 forming a larger angle with the processing proceeding direction BD. Thus, even when the target 100 is a wafer having the (100) plane as the principal plane, deterioration of the quality of the trimmed surface of the target 100 can be more reliably suppressed in the first portion M3A and the second portion M3B separated from each other.

With the laser processing method of the present embodiment, the first focusing point P1 relatively moves along the line M3, with the longitudinal direction NH of the beam shape 71 intersecting with the processing proceeding direction BD, in each of the first portion M3A and the second portion M3B separated from each other. Thus, when the quality of the trimmed surface in each of the first portion M3A and the second portion M3B deteriorates due to the physical property of the target 100 for example as a result of simply relatively moving the first focusing point P1 along the line M3 with the longitudinal direction NH of the beam shape 71 matching the processing proceeding direction BD, such a deterioration of the quality of the trimmed surface can be suppressed. Thus, local deterioration of the quality of the trimmed surface of the target 100 from which the removal region E has been removed can be suppressed.

Modification Examples

As described above, one aspect of the present invention is not limited to the above-described embodiment.

In the present embodiment described above, the target information includes information on the crystal orientation of the target 100, and may also include other various types of information, as long as the information relates to the target. The target information may further include another information on physical properties of the target 100, and may further include information on the shape and the size of the target 100. In the embodiment described above, the line information includes information on the processing proceeding direction BD (movement direction of the focusing point) along the line M3, and may also include other various types of information as long as the information relates to the line M3 for moving the focusing point along the line M3.

In the embodiment described above, information on the orientation (beam angle β) of the longitudinal direction NH of the beam shape 71 for relatively moving the first focusing point P1 along the line M3 may be input to the controller 9 by a user operation, communications from the outside, or the like. In this case, the acquisition unit 9a acquires input information on the orientation of the longitudinal direction NH. The determination portion 9b determines the orientation of the longitudinal direction NH based on the input information. The orientation of the longitudinal direction NH inputs depends on the extending direction of the line M3, the physical properties of the target 100, and the like, and is information on the line M3 and the target 100. Thus, the input information on the orientation of the longitudinal direction NH may correspond to the target information and the line information. The orientation of the longitudinal direction NH may be input for each region (each portion) of the line M3, each processing angle α, or each processing angle region, or may be input as a range or a formula.

In the embodiment described above, first to Nth orientations that are orientations of the longitudinal direction NH for relatively moving the first focusing point P1 along N respective regions (portions) of the line M3 (N is an integer that is equal to or greater than 3). When the modified region 4 is formed by relatively moving the first focusing point P1 along the first to the Nth regions, the orientation of the longitudinal direction NH may be adjusted to be each of the first to the Nth orientations.

In the embodiments described above, a plurality of laser processing heads may be provided as an irradiation portion.

Figure 69:
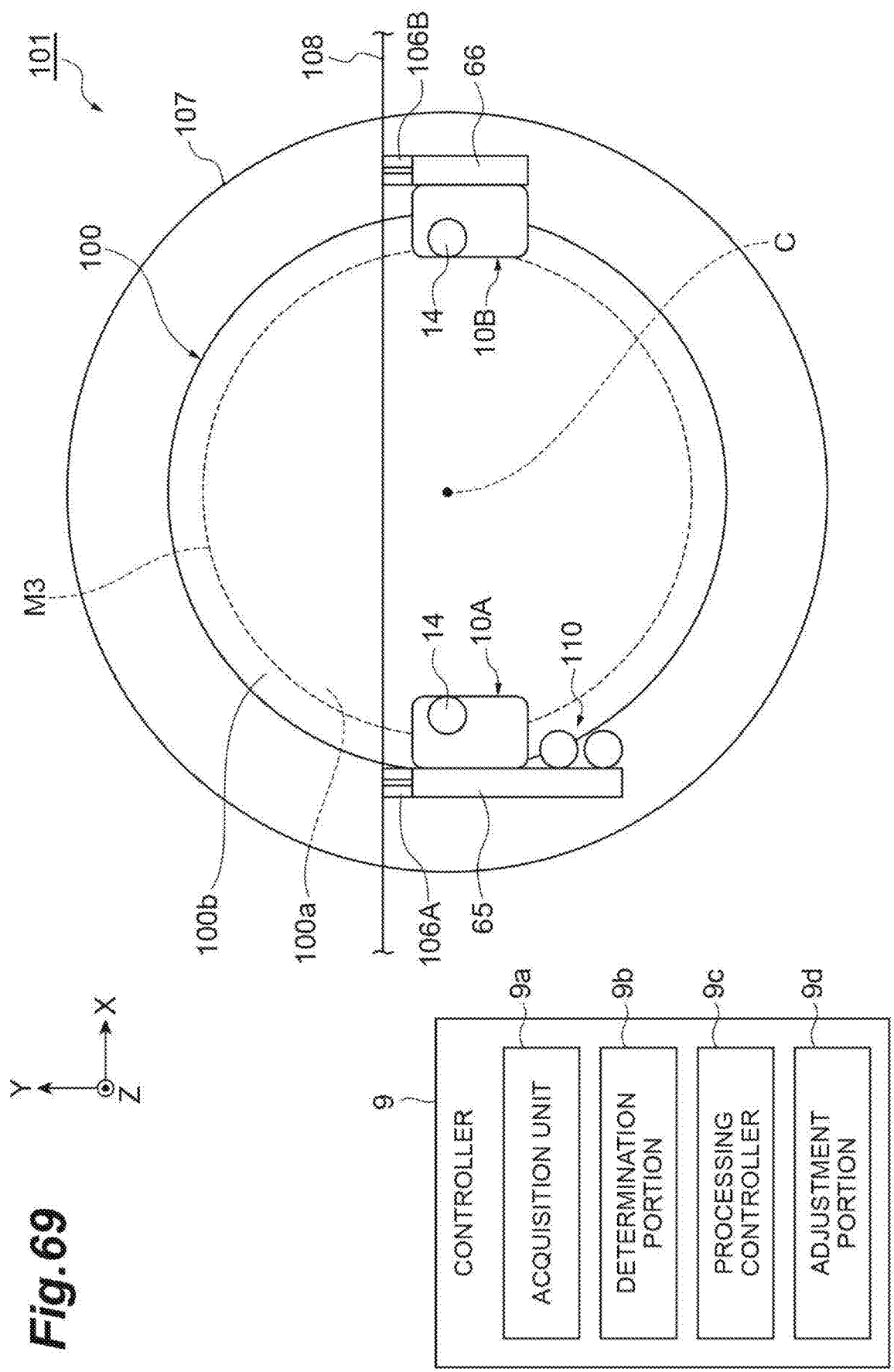
FIG. 69 is a plan view illustrating a schematic configuration of a laser processing apparatus according to a modification example.

For example, as illustrated in FIG. 69, a second laser processing head 10B that emits a second laser light may be provided instead of the first laser processing head 10A that emits a first laser light.

The second laser processing head 10B irradiates the target 100 placed on the stage 107 with the second laser light along the Z direction to form a modified region in the target 100. The second laser processing head 10B is attached to the second Z-axis rail 106B and the X-axis rail 108. The second laser processing head 10B can be moved linearly in the Z direction along the second Z-axis rail 106B, by driving force of a known driving device such as a motor. The second laser processing head 10B can be moved linearly in the X direction along the X-axis rail 108, by driving force of a known driving device such as a motor. The internal structures of the first laser processing head 10A and the second laser processing head 10B are mirror symmetrical with each other about the rotation axis C. Other configurations of the second laser processing head 10B are the same as those of the first laser processing head 10A.

The second Z-axis rail 106B is a rail extending along the Z direction. The second Z-axis rail 106B is attached to the second laser processing head 10B via the attachment portion 66. The second laser processing head 10B moves on the second Z-axis rail 106B along the Z direction so that a second focusing point of the second laser light moves along the Z direction. The second Z-axis rail 106B corresponds to the rail of the above movement mechanism 6 (see FIG. 1) or the above movement mechanism 300 (see FIG. 8). The second Z-axis rail 106B serves as a vertical movement mechanism.

When the first and the second laser processing heads 10A and 10B are provided as the irradiation portion, in the above-mentioned first process, the first focusing point P1 of the first laser light L1 relatively moves along the first region M31 of the line M3 to form the modified region, and the formation of the modified region in a region other than the first region M31 of the line M3 is stopped. In the second process described above, the second focusing point of the second laser light is relatively moved along the second region M32 of the line M3 to form the modified region, and the formation of the modified region in a region other than the second region M32 of the line M3 is stopped. The adjustment portion 9d adjusts the orientation of the longitudinal direction NH of the beam shape 71 of the first laser light L1 to be the first orientation when the first process is performed, and the adjustment portion 9d adjusts the orientation of the longitudinal direction of the beam shape of the second laser light to be the second orientation when the second process is performed.

When the first and the second laser processing heads 10A and 10B are provided as the irradiation portion, the first process and the second process may be performed in parallel (simultaneously). As a result, better takt time can be achieved. When the first and the second laser processing heads 10A and 10B are provided as the irradiation portion, the first process and the second process may be performed in different times (non-simultaneously). When the first and the second laser processing heads 10A and 10B are provided as the irradiation portion, the first and the second laser processing heads 10A and 10B may cooperate to form a single row of modified region 4 at a predetermined position in the Z direction. When the first and the second laser processing heads 10A and 10B are provided as the irradiation portion, the first laser processing head 10A may form one row of modified region 4 and the second laser processing head 10B may form one row of modified region 4 at a different Z direction position.

Figure 70:
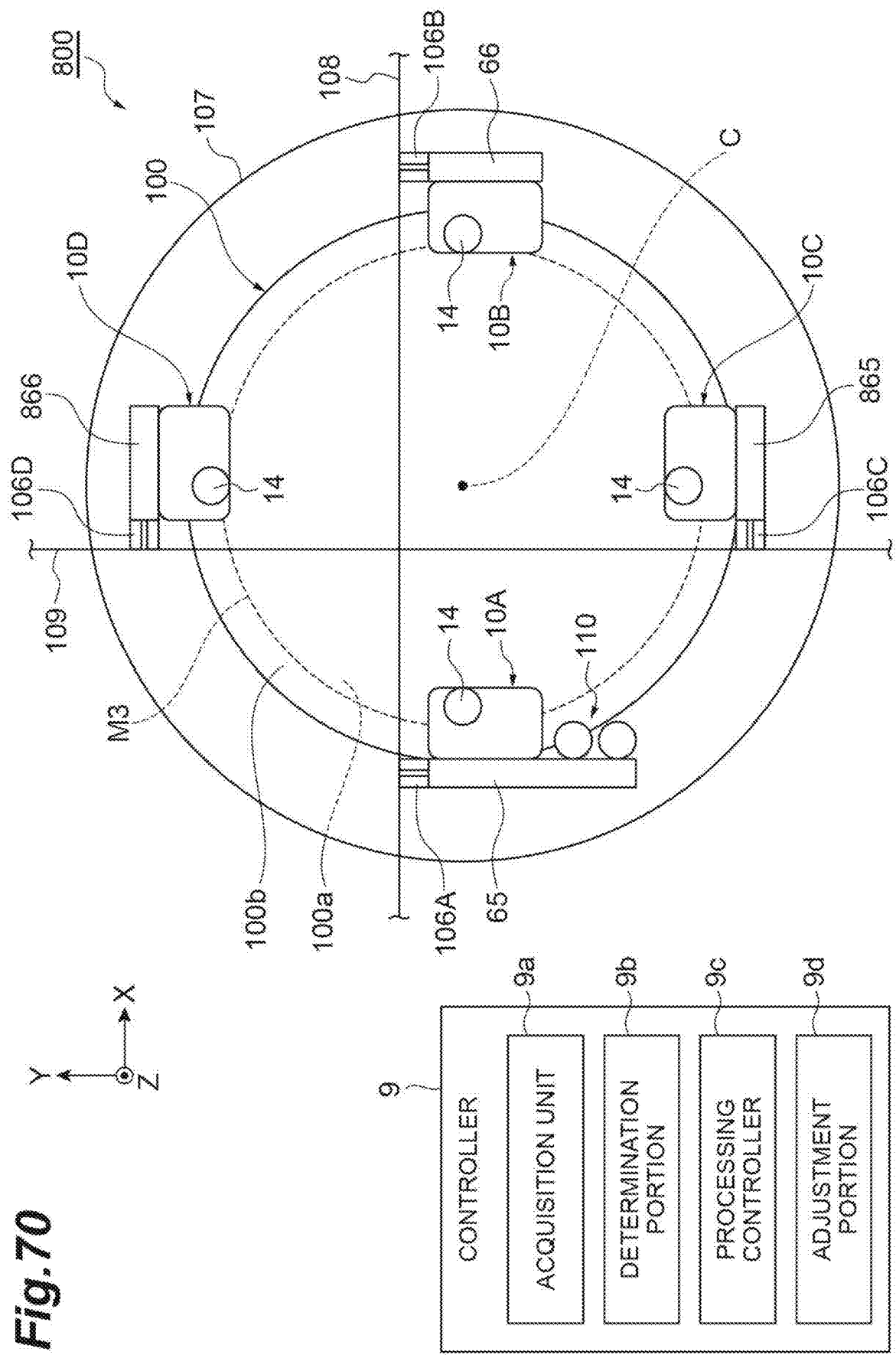
FIG. 70 is a plan view illustrating a schematic configuration of a laser processing apparatus according to another modification example.

Furthermore, four laser processing heads may be provided as in a laser processing apparatus 800 illustrated in FIG. 70 for example. The laser processing apparatus 800 has a configuration in which third and fourth laser processing heads 10C and 10D, third and fourth Z-axis rails 106C and 106D, and a Y-axis rail 109 are further provided to the laser processing apparatus 101 illustrated in FIG. 69.

The third laser processing head 10C irradiates the target 100 placed on the stage 107 with the third laser light along the Z direction to form the modified region 4 in the target 100. The third laser processing head 10C is attached to the third Z-axis rail 106C and the Y-axis rail 109. The third laser processing head 10C can be moved linearly in the Z direction along the third Z-axis rail 106C, by driving force of a known driving device such as a motor. The third laser processing head 10C can be moved linearly in the Y direction along the Y-axis rail 109, by driving force of a known driving device such as a motor. Other configurations of the third laser processing head 10C are the same as those of the first laser processing head 10A.

The fourth laser processing head 10D irradiates the target 100 placed on the stage 107 with the fourth laser light along the Z direction to form a modified region 4 in the target 100. The fourth laser processing head 10D is attached to the fourth Z-axis rail 106D and the Y-axis rail 109. The fourth laser processing head 10D can be moved linearly in the Z direction along the fourth Z-axis rail 106D, by driving force of a known driving device such as a motor. The fourth laser processing head 10D can be moved linearly in the Y direction along the Y-axis rail 109, by driving force of a known driving device such as a motor. Other configurations of the fourth laser processing head 10D are the same as those of the first laser processing head 10A. The internal structures of the third laser processing head 10C and the fourth laser processing head 10D are mirror symmetrical with each other about the rotation axis C.

The third Z-axis rail 106C is a rail extending along the Z direction. The third Z-axis rail 106C is attached to the third laser processing head 10C via an attachment portion 865 similar to the attachment portion 65. The third laser processing head 10C moves on the third Z-axis rail 106C along the Z direction so that a third focusing point of the third laser light moves along the Z direction. The third Z-axis rail 106C serves as a vertical movement mechanism.

The fourth Z-axis rail 106D is a rail extending along the Z direction. The fourth Z-axis rail 106D is attached to the fourth laser processing head 10D via an attachment portion 866 similar to the attachment portion 66. The fourth laser processing head 10D moves on the fourth Z-axis rail 106D along the Z direction so that a fourth focusing point of the fourth laser light moves along the Z direction. The fourth Z-axis rail 106D serves as a vertical movement mechanism.

The Y-axis rail 109 is a rail extending along the Y direction. The Y-axis rail 109 is attached to each of the third and the fourth Z-axis rails 106C and 106D. The third laser processing head 10C moves on the Y-axis rail 109 along the Y direction so that the third focusing point of the third laser light moves along the Y direction. The fourth laser processing head 10D moves on the Y-axis rail 109 along the Y direction so that the fourth focusing point of the fourth laser light moves along the Y direction. The third and the fourth laser processing heads 10C and 10D move on the Y-axis rail 109 to make the third and the fourth focusing points passes through or near the rotation axis C. The Y-axis rail 109 corresponds to a rail of the movement mechanism 400 (see FIG. 8). The Y-axis rail 109 serves as a horizontal movement mechanism. The X-axis rail 108 and the Y-axis rail 109 are installed at different height positions. For example, the X-axis rail 108 is installed on the lower side and the Y-axis rail 109 is installed on the upper side.

In the embodiments described above, the reflective spatial light modulator 34 is used as the shaping portion. However, the shaping portion is not limited to the spatial light modulator, and various devices or optical systems may be used. For example, an elliptical beam optical system, a slit optical system, or an astigmatism optical system may be used as the shaping portion. The beam shape 71 having the longitudinal direction NH may be generated, by using a modulation pattern such as a grating pattern to branch the focusing point and combining two or more focusing points. Furthermore, the beam shape 71 having the longitudinal direction NH may be generated by using polarized light. The polarization direction may be rotated by rotating a half wavelength plate for example. The spatial light modulator is not limited to the reflective type, and transmissive spatial light modulator may be used.

In the embodiment described above, the processing controller 9c controls the first laser light L1 or the optical system thereof to switch between forming the modified region 4 and stopping the formation, but this should not be construed in a limiting sense. Switching between forming the modified region 4 and stopping the formation may be implemented using various known techniques. For example, switching between forming of the modified region 4 and stopping the formation may be implemented with a mask directly formed on the target 100 to block the first laser light L1.

In the embodiments described above, the type of the target 100, the shape of the target 100, the size of the target 100, the number and direction of crystal orientations of the target 100, and the orientation of the principal plane of the target 100 are not particularly limited. In the embodiment described above, the shape of the line M3 is not particularly limited. In the embodiment described above, the determination portion 9b may determine only one of the first orientation and the second orientation, and the adjustment portion 9d may adjust the orientation of the longitudinal direction NH to be the one orientation.

In the embodiments described above, the back surface 100b of the target 100 is the laser light incident surface, but the laser light incident surface may be the front surface 100a of the target 100. In the embodiments described above, the modified region 4 may be a crystallization region, a recrystallization region, or a gettering region formed in the target 100 for example. The crystal region is a region that maintains the structure of the target 100 before being processed. The recrystallization region is a region that is once evaporated, converted into plasma, or melted, and then solidified as a single crystal or polycrystal when resolidified. The gettering region is a region that exerts a gettering effect of collecting and capturing impurities such as heavy metals, and may be formed continuously or intermittently. For example, the processing apparatus may be applied to a process such as ablation.

The laser processing apparatus according to the embodiment described above may not include the acquisition unit 9a. The laser processing method according to the embodiment described above may not include steps (information acquisition step) of acquiring the target information and the line information. In such case, the target 100 of the laser processing or the like is determined in advance for example, and the target information and the line information are stored in advance.

The configurations in the embodiments and the modification examples described above are not limited to the materials and shapes described above, and various materials and shapes may be applied. The configurations in the embodiments or the modification examples described above can be randomly applied to the configuration in another embodiment or modification examples.

REFERENCE SIGNS LIST 1, 101, 800 laser processing apparatus
4 modified region
9 controller
9a acquisition unit
9b determination portion
9c processing controller
9d adjustment portion
10A first laser processing head (irradiation portion)
10B second laser processing head (irradiation portion)
10C third laser processing head (irradiation portion)
10D fourth laser processing head (irradiation portion)
34 reflective spatial light modulator (shaping portion)
71 beam shape (shape of a part of focusing region)
100 target
100a front surface (principal plane)
100b back surface (principal plane, laser light incident surface)
107 stage (support portion)
K1 first crystal orientation (crystal orientation)
K2 second crystal orientation (crystal orientation)
L1 first laser light (laser light)
L2 second laser light (laser light)
M3 line
M31 first region (first portion)
M32 second region (first portion)
M3A first portion
M3B second portion
M3C third portion
NH longitudinal direction
P1 first focusing point (a part of focusing region)

The invention claimed is:

1. A laser processing apparatus that emits a laser light with at least a part of a focusing region being on a target to form a modified region in the target, the laser processing apparatus comprising:
a support portion configured to support the target;
an irradiation portion configured to irradiate the target supported by the support portion with the laser light; and
a controller configured to control the support portion and the irradiation portion, wherein
the irradiation portion includes a shaping portion configured to shape the laser light, to make a shape of a part of the focusing region within a plane orthogonal to an optical axis of the laser light have a longitudinal direction, and
the controller includes:
a determination portion configured to determine, based on target information on the target and line information on a line extending annularly on an inner side of an outer edge of the target for relatively moving the part of the focusing region along the line, a first orientation that is an orientation of the longitudinal direction for relatively moving the part of the focusing region along a first region of the line, and a second orientation that is an orientation of the longitudinal direction for relatively moving the part of the focusing region along a second region of the line, to make the longitudinal direction intersect with a movement direction of the part of the focusing region;
a processing controller configured to perform a first process of forming the modified region of relatively moving the part of the focusing region along the first region and stopping formation of the modified region in a region of the line other than the first region, and a second process of forming the modified region of relatively moving the part of the focusing region along the second region and stopping formation of the modified region in a region of the line other than the second region; and
an adjustment portion configured to adjust the orientation of the longitudinal direction to be the first orientation when the processing controller performs the first process, and to adjust the orientation of the longitudinal direction to be the second orientation when the processing controller performs the second process.

2. The laser processing apparatus according to claim 1, wherein
the target information includes information on a crystal orientation of the target, and
the line information includes information on the movement direction of the part of the focusing region.

3. The laser processing apparatus according to claim 1, wherein
the shaping portion includes a spatial light modulator, and
the adjustment portion controls the spatial light modulator to adjust the orientation of the longitudinal direction.

4. The laser processing apparatus according to claim 1, wherein
the target is a wafer that has a (100) plane as a principal plane, and includes a first crystal orientation orthogonal to one (110) plane and a second crystal orientation orthogonal to another (110) plane,
the line annularly extends in a view orthogonal to the principal plane,
the first region includes a region in which a processing angle is 0° or greater and less than 45°, the processing angle being an angle of the movement direction of the part of the focusing region with respect to the first crystal orientation, when the part of the focusing region is relatively moved along the line, and
the second region includes a region in which the processing angle is 45° or greater and less than 90°, when the part of the focusing region is relatively moved along the line.

5. The laser processing apparatus according to claim 4, wherein the first orientation and the second orientation are orientations of a direction inclined with respect to the movement direction toward one of the first crystal orientation and the second crystal orientation forming a larger angle with the movement direction.

6. The laser processing apparatus according to claim 5, wherein the first orientation and the second orientation are orientations of a direction inclined by 10° to 35° with respect to the movement direction toward one of the first crystal orientation and the second crystal orientation forming a larger angle with the movement direction.

7. The laser processing apparatus according to claim 1, wherein
the irradiation portion includes:
a first laser processing head configured to emit a first laser light as the laser light; and
a second laser processing head configured to emit a second laser light as the laser light, in the first process, relatively moves the part of the focusing region of the first laser light along the first region to form the modified region and stops formation of the modified region in a region of the line other than the first region, and in the second process, relatively moves the part of the focusing region of the second laser light along the second region to form the modified region and stops formation of the modified region in a region of the line other than the second region, and the adjustment portion adjusts, when the first process is performed, an orientation of a longitudinal direction of a shape of the part of the focusing region in a plane orthogonal to an optical axis of the first laser light to be the first orientation, and adjusts, when the second process is performed, an orientation of a longitudinal direction of a shape of the part of the focusing region in a plane orthogonal to an optical axis of the second laser light to be the second orientation.

8. A laser processing method that emits a laser light with at least a part of a focusing region being on a target to form a modified region in the target, the laser processing method comprising:

a determination step of determining, based on target information on the target and line information on a line extending annularly on an inner side of an outer edge of the target for relatively moving the part of the focusing region along the line, a first orientation that is an orientation of a longitudinal direction that a shape of a part of the focusing region within a plane orthogonal to an optical axis of the laser light has, for relatively moving the part of the focusing region along a first region of the line, and a second orientation that is an orientation of the longitudinal direction for relatively moving the part of the focusing region along a second region of the line, to make the longitudinal direction intersect with a movement direction of the part of the focusing region;

a first processing step of forming the modified region of relatively moving the part of the focusing region along the first region and stopping formation of the modified region in a region of the line other than the first region;

a second processing step of forming the modified region of relatively moving the part of the focusing region along the second region and stopping formation of the modified region in a region of the line other than the second region;

a first adjustment step of adjusting the orientation of the longitudinal direction to be the first orientation when the first processing step is performed, and a second adjustment step of adjusting the orientation of the longitudinal direction to be the second orientation when the second processing step is performed.

* * * * *